(12) United States Patent
Aiba et al.

(10) Patent No.: US 11,675,535 B2
(45) Date of Patent: Jun. 13, 2023

(54) MEMORY SYSTEM AND SHIFT REGISTER MEMORY

(71) Applicant: Kioxia Corporation, Tokyo (JP)

(72) Inventors: Yuta Aiba, Yokohama (JP); Naomi Takeda, Yokohama (JP); Masanobu Shirakawa, Chigasaki (JP)

(73) Assignee: Kioxia Corporation, Tokyo (JP)

( * ) Notice: Subject to any disclaimer, the term of this patent is extended or adjusted under 35 U.S.C. 154(b) by 342 days.

(21) Appl. No.: 17/015,893

(22) Filed: Sep. 9, 2020

(65) Prior Publication Data

US 2021/0294527 A1    Sep. 23, 2021

(30) Foreign Application Priority Data

Mar. 23, 2020 (JP) .............................. JP2020-050894

(51) Int. Cl.
*G06F 3/06* (2006.01)
*G11C 19/08* (2006.01)

(52) U.S. Cl.
CPC .......... *G06F 3/0659* (2013.01); *G06F 3/0608* (2013.01); *G06F 3/0679* (2013.01); *G11C 19/0841* (2013.01)

(58) Field of Classification Search
CPC .................................................. G06F 3/0659
See application file for complete search history.

(56) References Cited

U.S. PATENT DOCUMENTS

| | | |
|---|---|---|
| 4,088,876 A | 5/1978 | Rege |
| 8,009,453 B2 | 8/2011 | Gaidis et al. |
| 2001/0039636 A1* | 11/2001 | Hammons ......... H03M 13/2987 714/752 |
| 2008/0243972 A1 | 10/2008 | Gaidis et al. |
| 2011/0083060 A1 | 4/2011 | Sakurada et al. |
| 2012/0224420 A1 | 9/2012 | Sakurada et al. |
| 2013/0077400 A1 | 3/2013 | Sakurada |
| 2015/0256201 A1 | 9/2015 | Sakurada |

(Continued)

FOREIGN PATENT DOCUMENTS

| | | |
|---|---|---|
| JP | 2009-536420 A | 10/2009 |
| JP | 2011-81858 A | 4/2011 |

(Continued)

OTHER PUBLICATIONS

U.S. Appl. No. 16/562,482, filed Sep. 6, 2019, Takada et al.
U.S. Appl. No. 16/809,630, filed Mar. 5, 2020, Takada et al.

*Primary Examiner* — Douglas King
(74) *Attorney, Agent, or Firm* — Obion, McClelland, Maier & Neustadt, L.L.P.

(57) ABSTRACT

According to one embodiment, a memory system includes a shift register memory and a controller. The shift register memory includes data storing shift strings. The controller changes a shift pulse, which is to be applied to the data storing shift strings from which first data is read by applying a first shift pulse, to a second shift pulse to write second data to the data storing shift strings and to read the second data from the data storing shift strings. The controller creates likelihood information of data read from the data storing shift strings in accordance with a read result of the second data. The controller performs soft decision decoding for the first data using the likelihood information.

15 Claims, 55 Drawing Sheets

(56) References Cited

U.S. PATENT DOCUMENTS

| | | | |
|---|---|---|---|
| 2015/0286528 A1* | 10/2015 | Cai | H03M 13/1157 |
| | | | 714/763 |
| 2016/0011970 A1 | 1/2016 | Sakurada | |
| 2016/0259688 A1 | 9/2016 | Sukegawa et al. | |
| 2020/0294610 A1 | 9/2020 | Takada et al. | |
| 2021/0082483 A1 | 3/2021 | Takeda et al. | |

FOREIGN PATENT DOCUMENTS

| | | |
|---|---|---|
| JP | 2012-181761 A | 9/2012 |
| JP | 5063775 B2 | 10/2012 |
| JP | 2013-80450 A | 5/2013 |
| JP | 2020-149741 A | 9/2020 |
| JP | 2021-43912 A | 3/2021 |
| WO | WO2007/132174 A1 | 11/2007 |

* cited by examiner

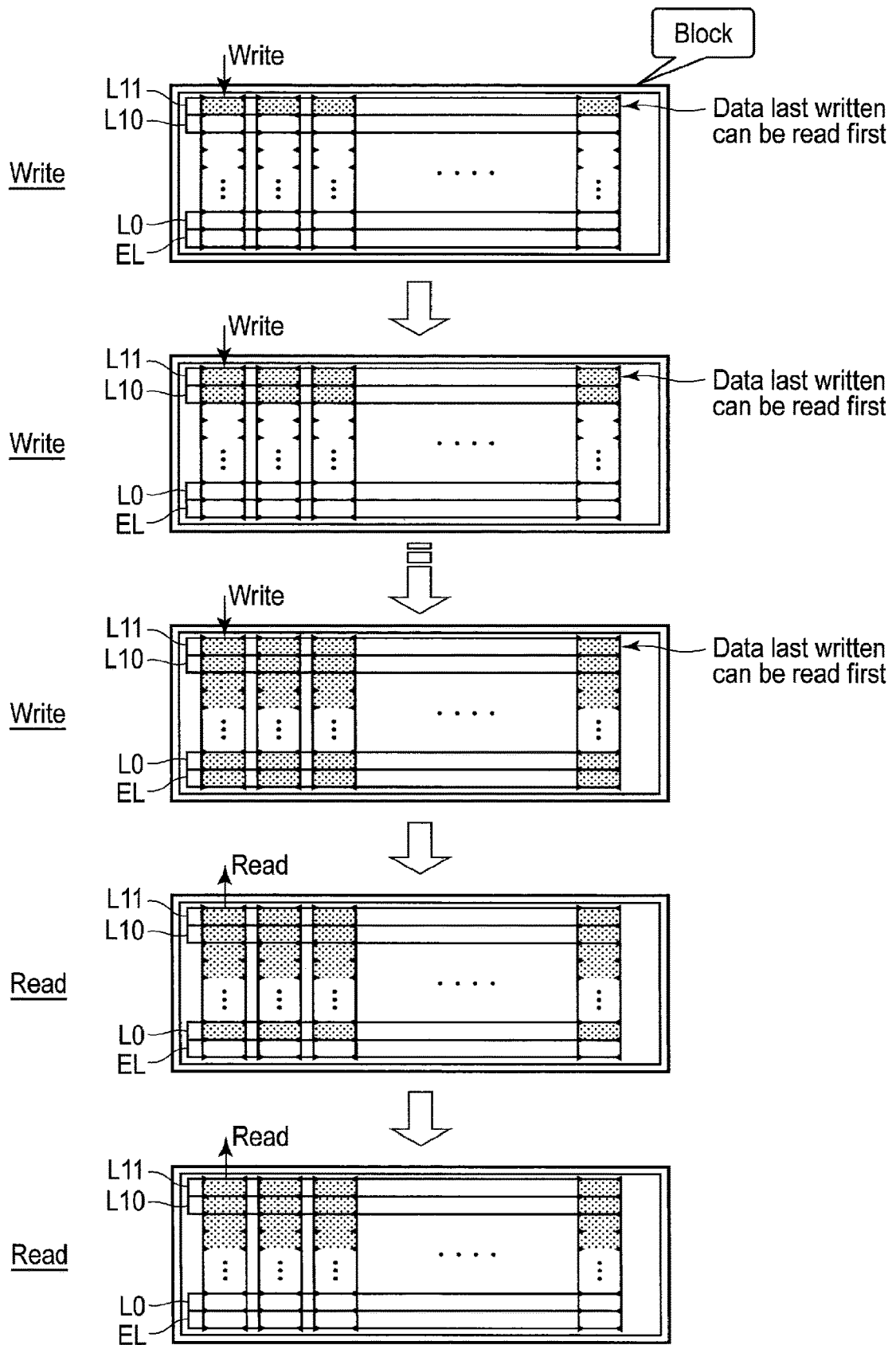
F I G. 3

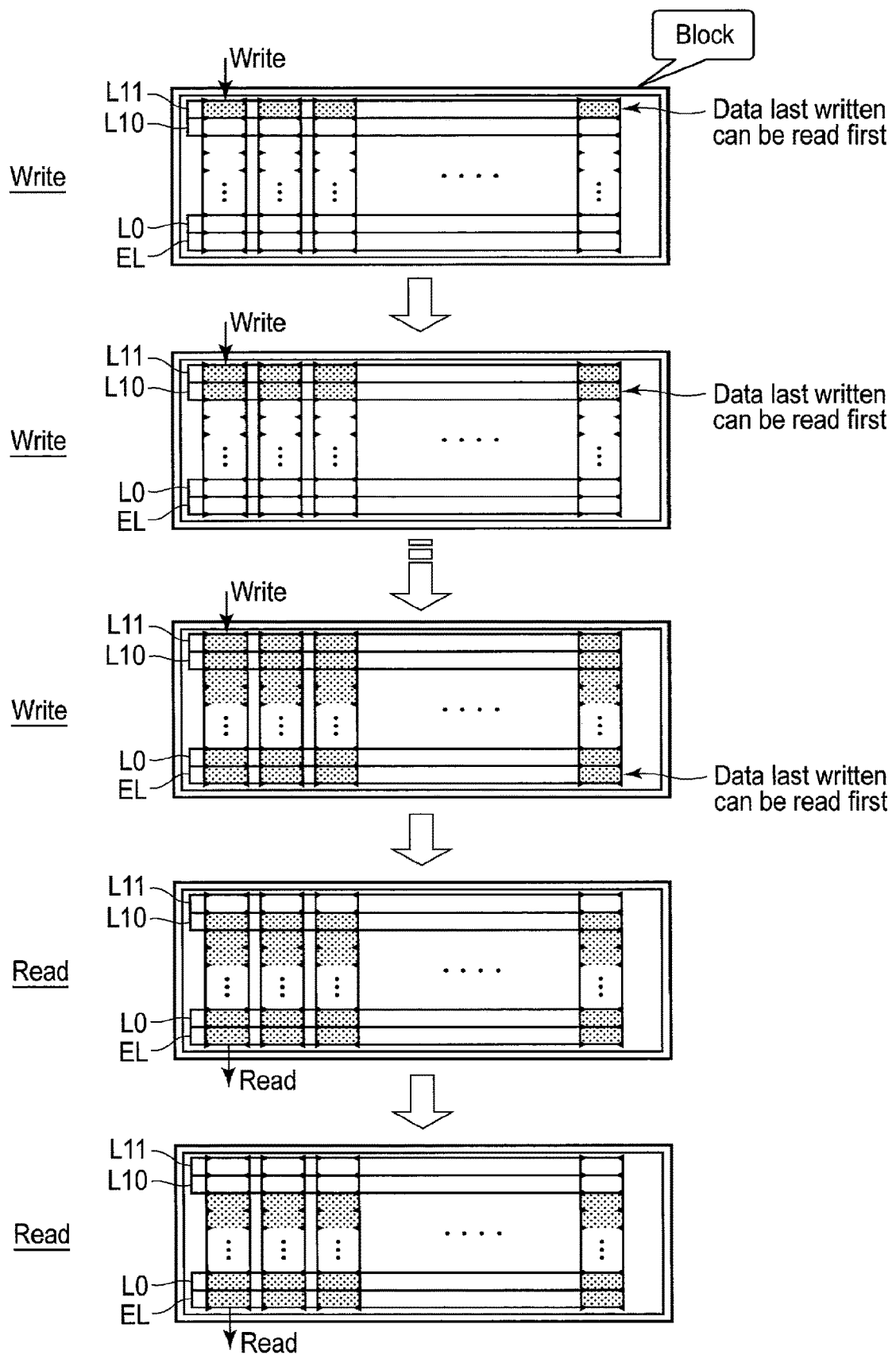
F I G. 5

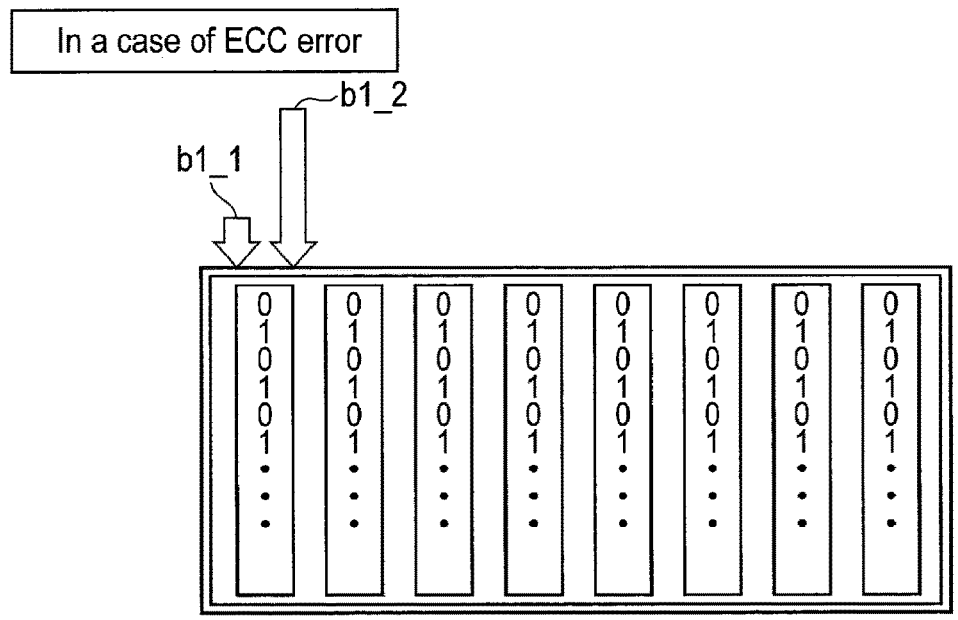
F I G. 9
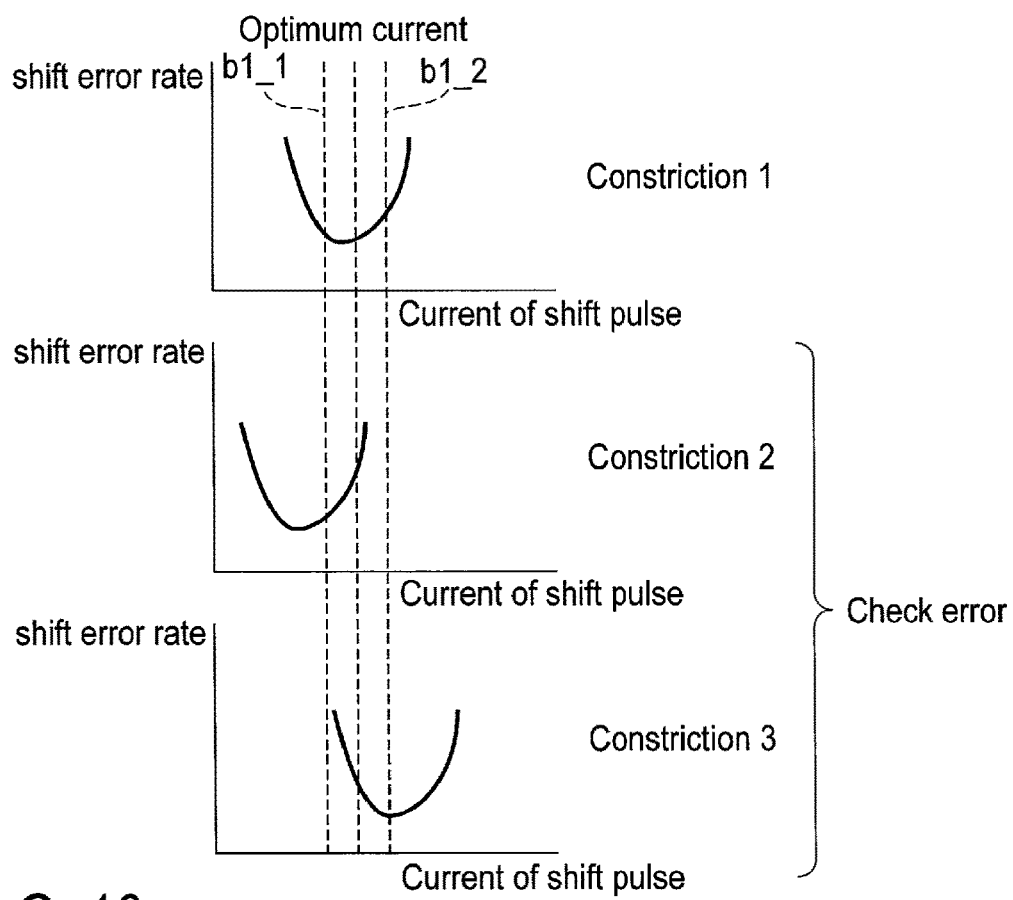
F I G. 10

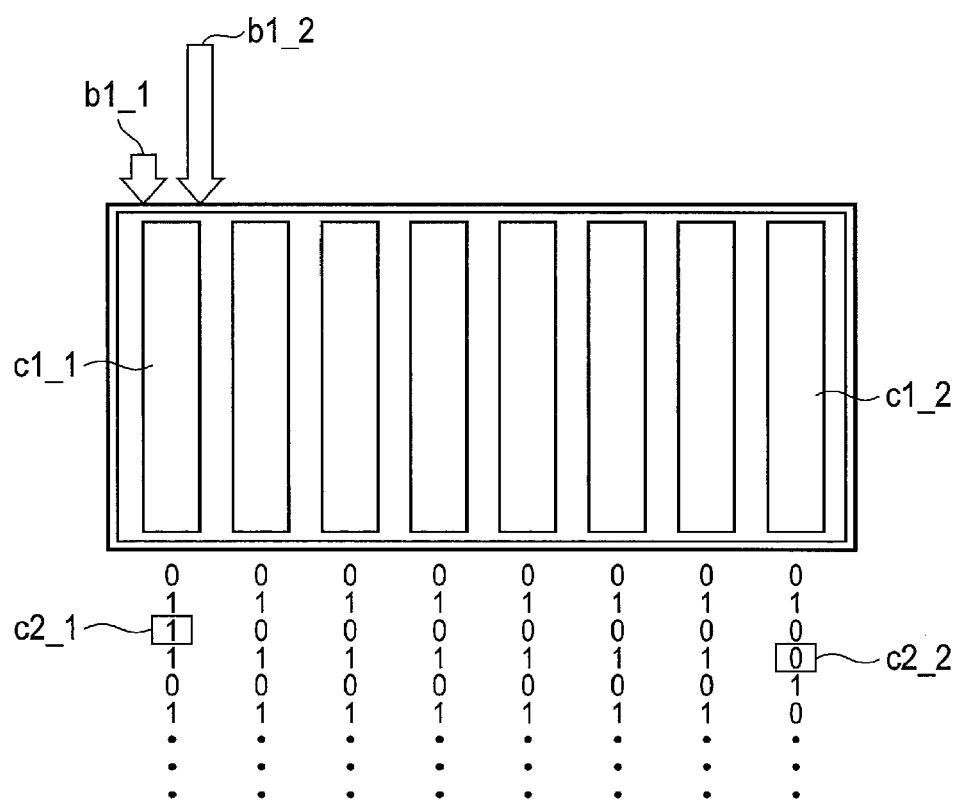
F I G. 11

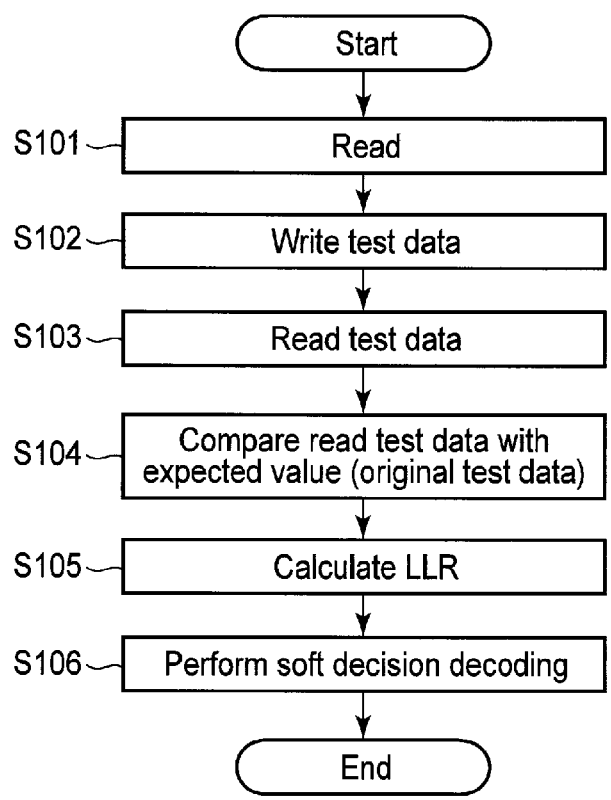
F I G. 12

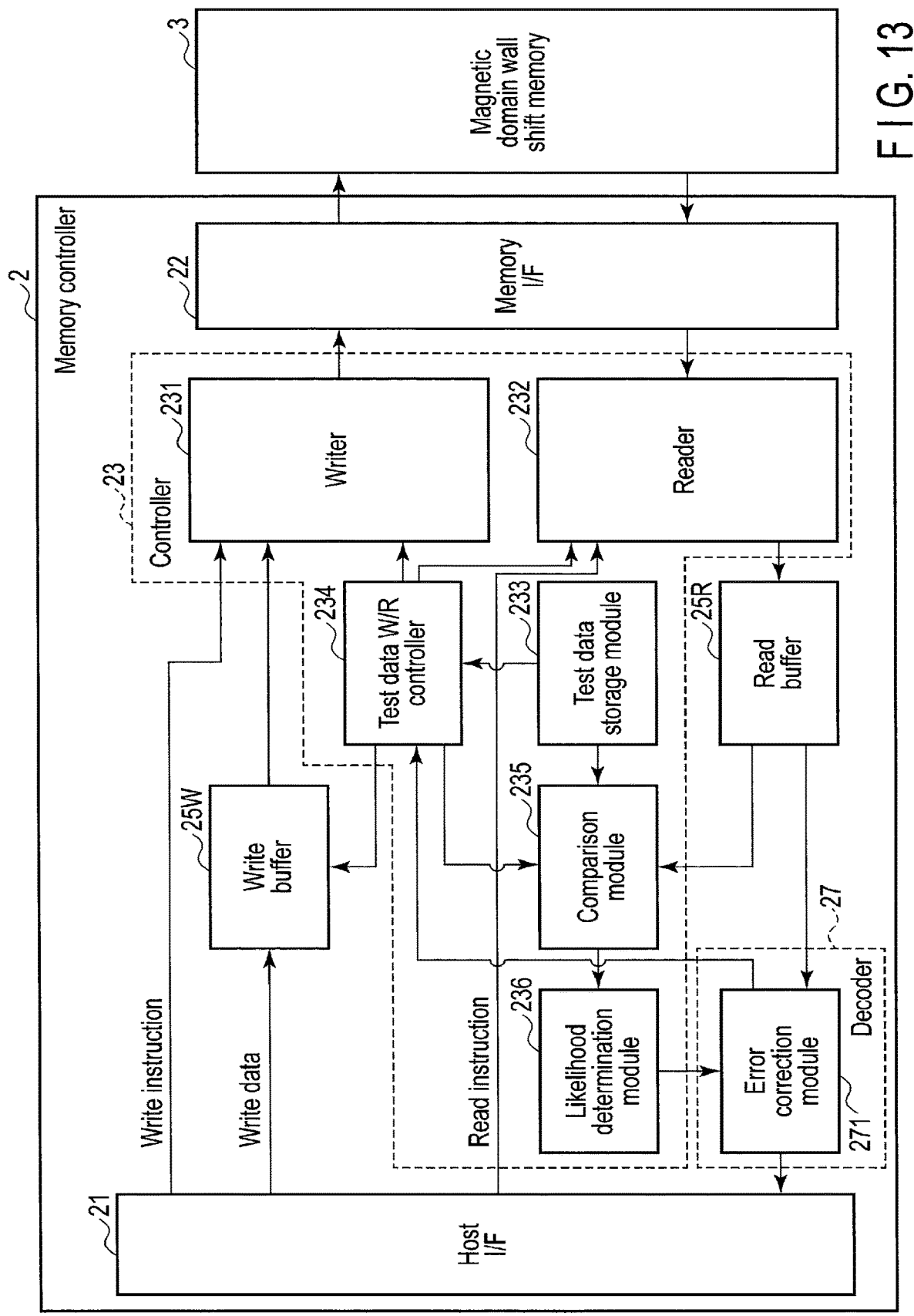
F I G. 13

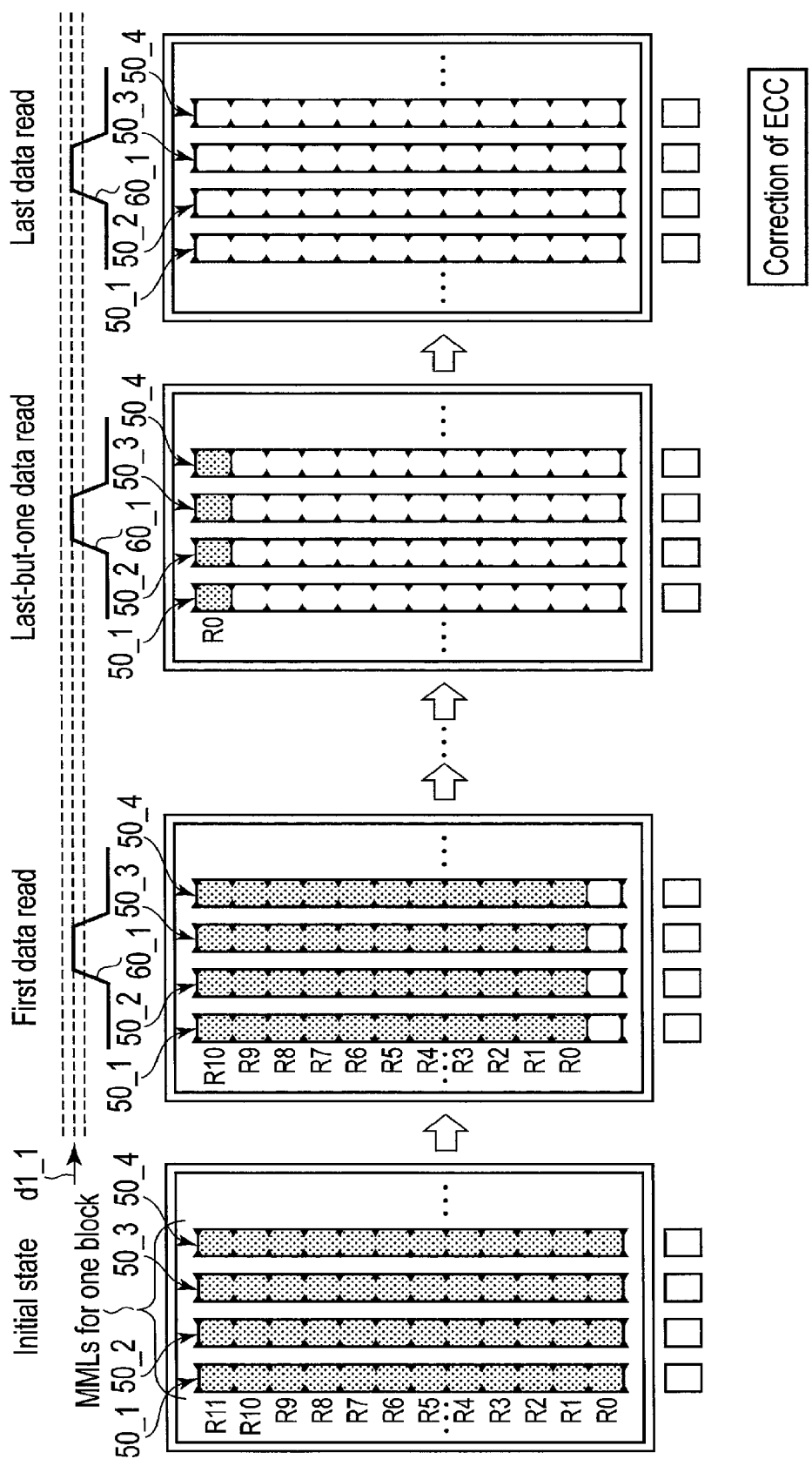
F I G. 14

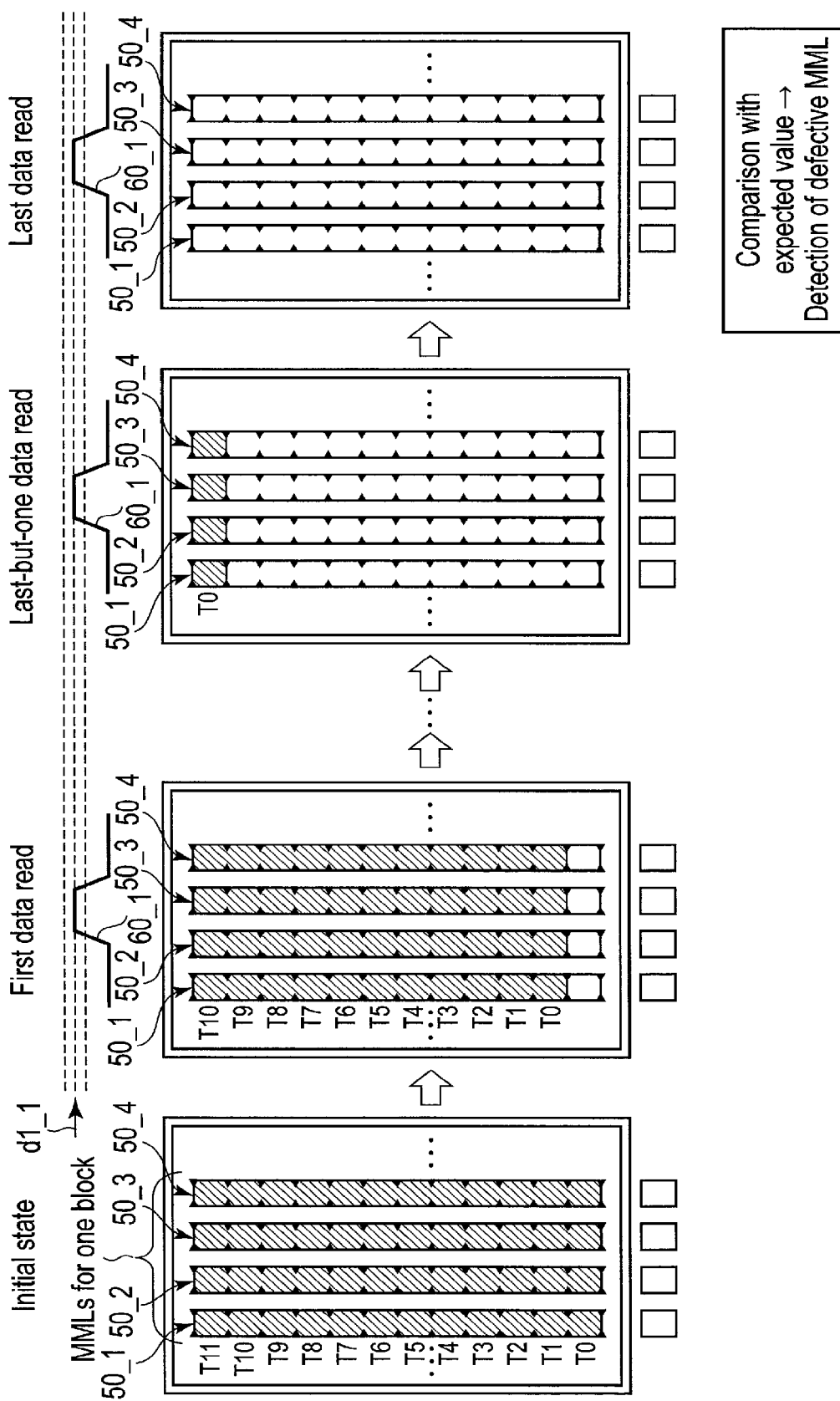
F I G. 16

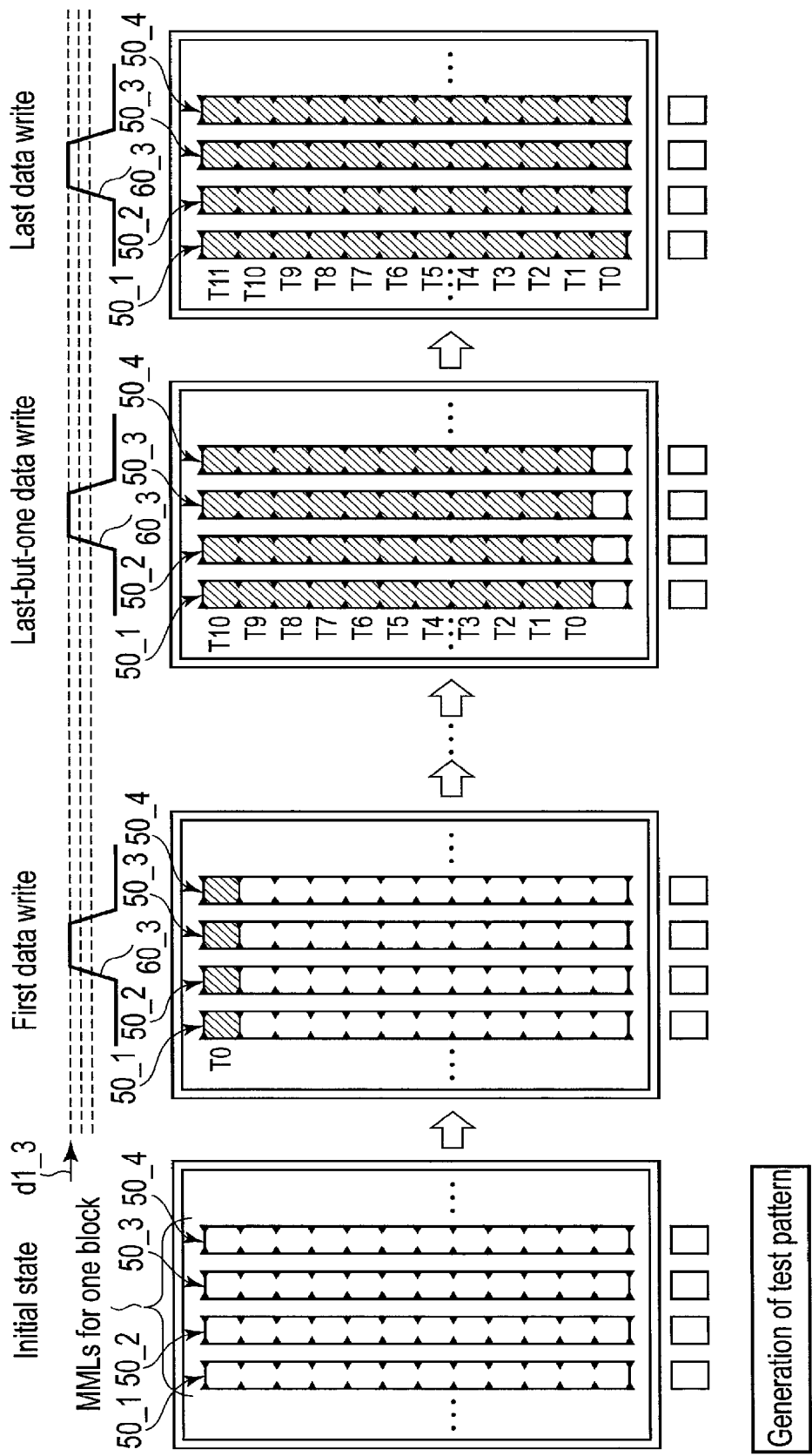
F I G. 19

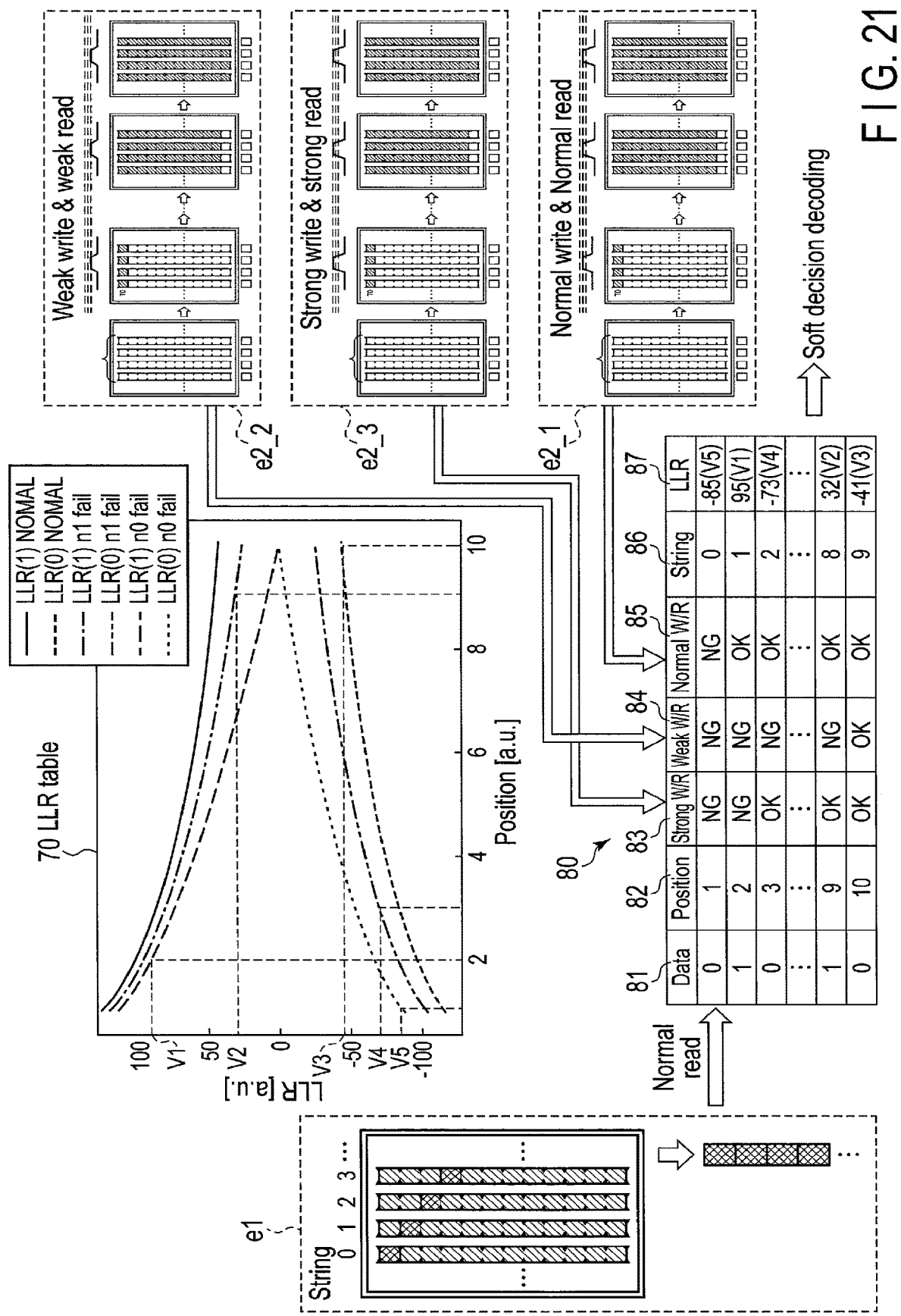
F I G. 21

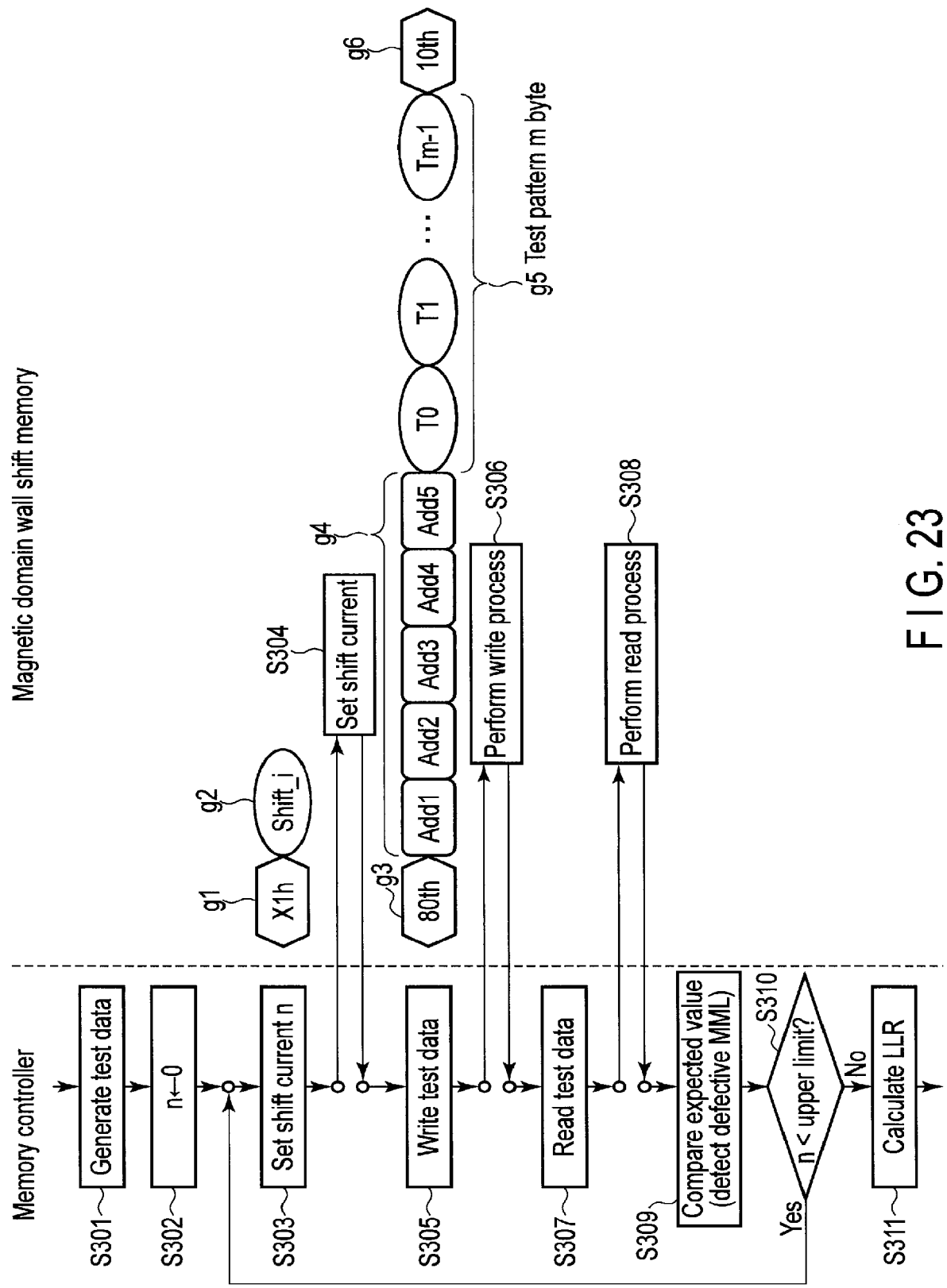
F I G. 23

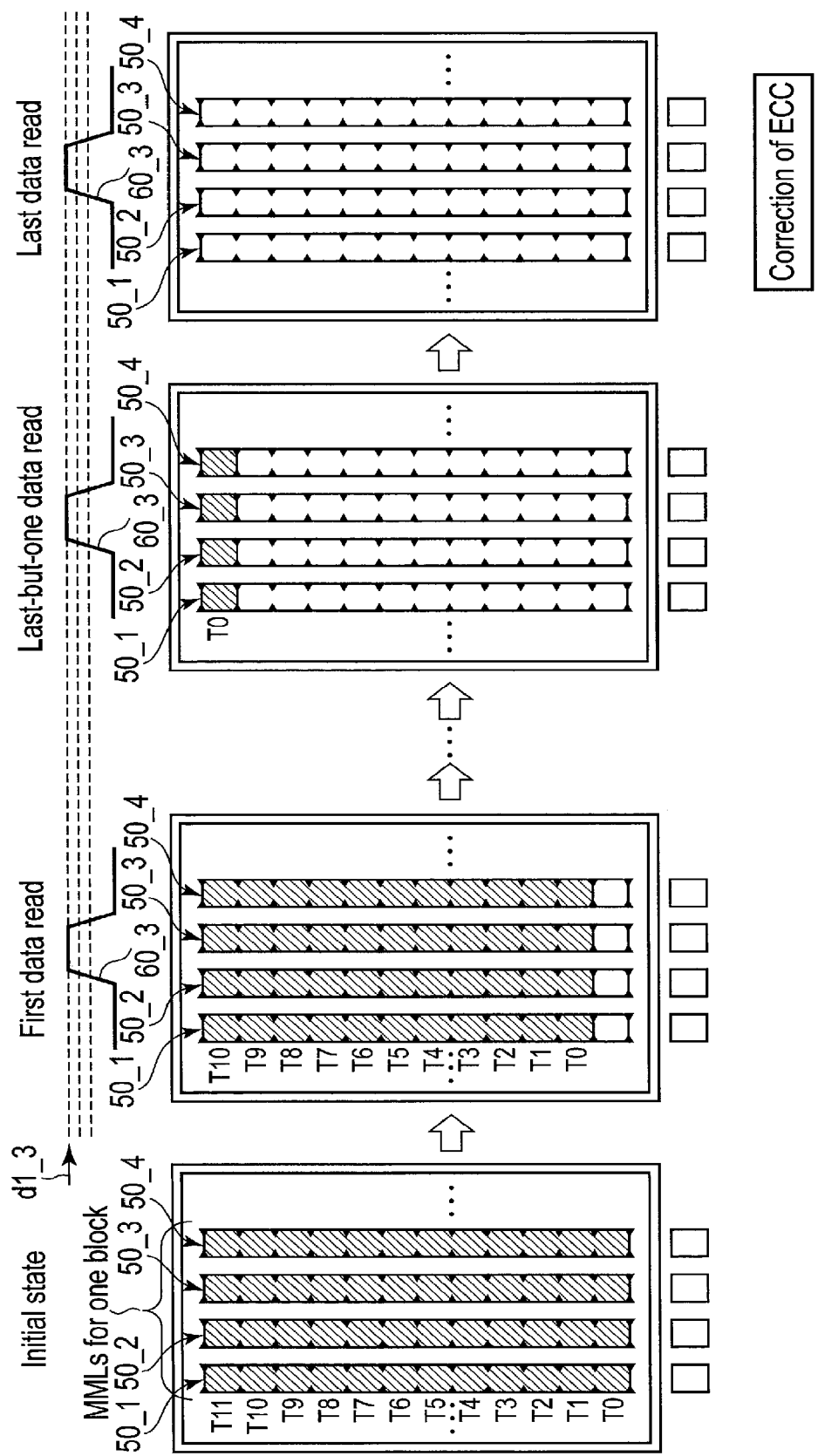
F I G. 28

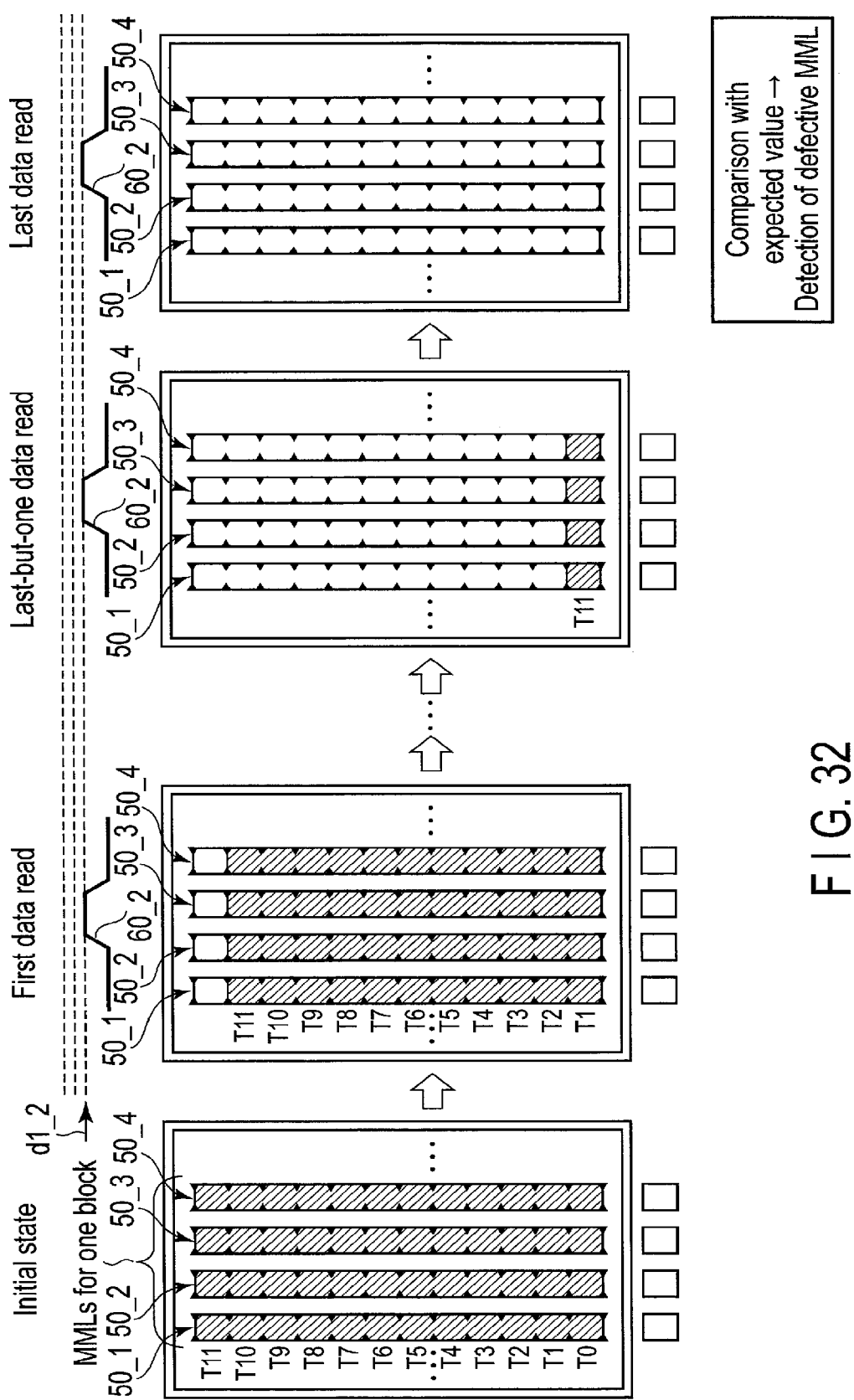
F I G. 32

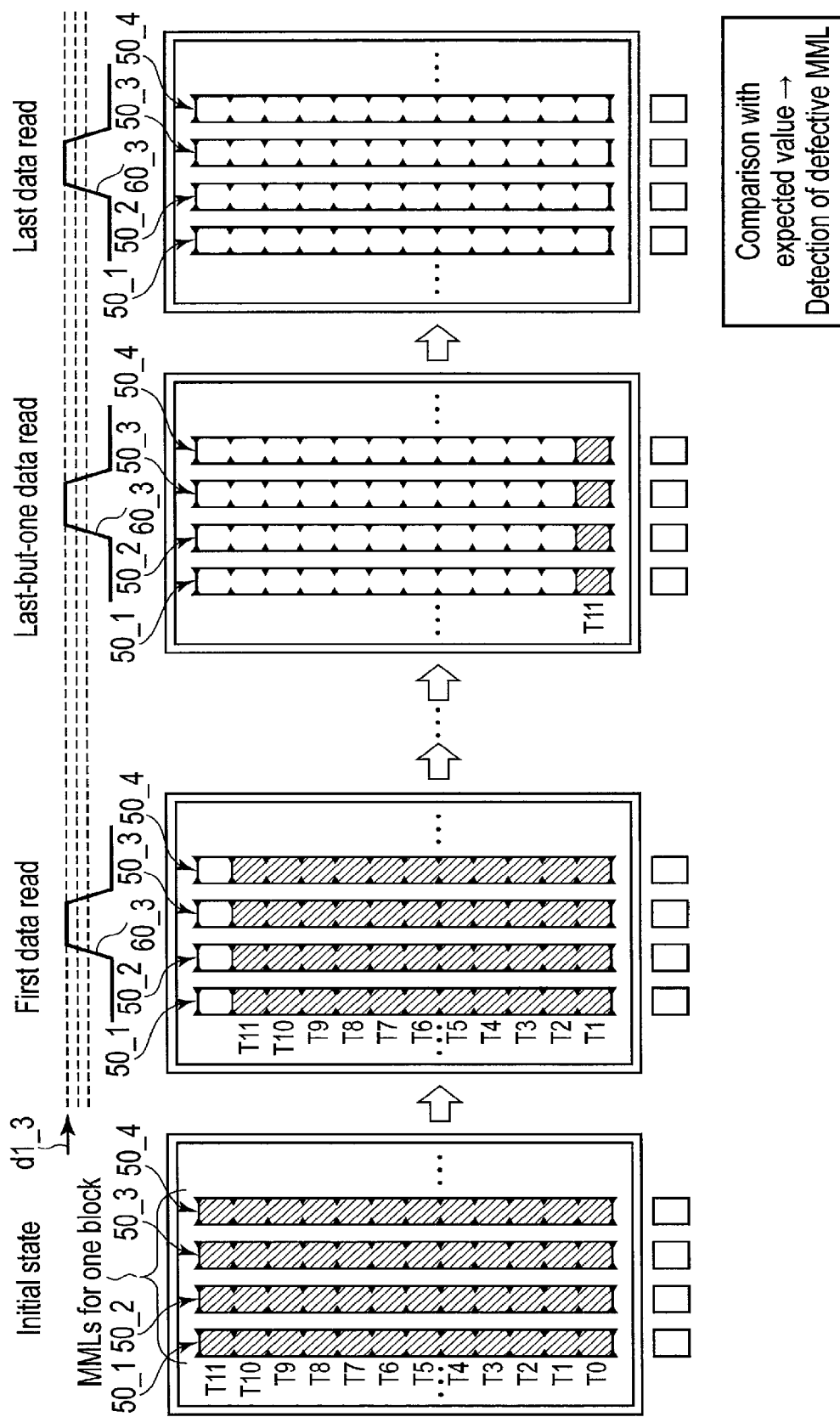
F I G. 34

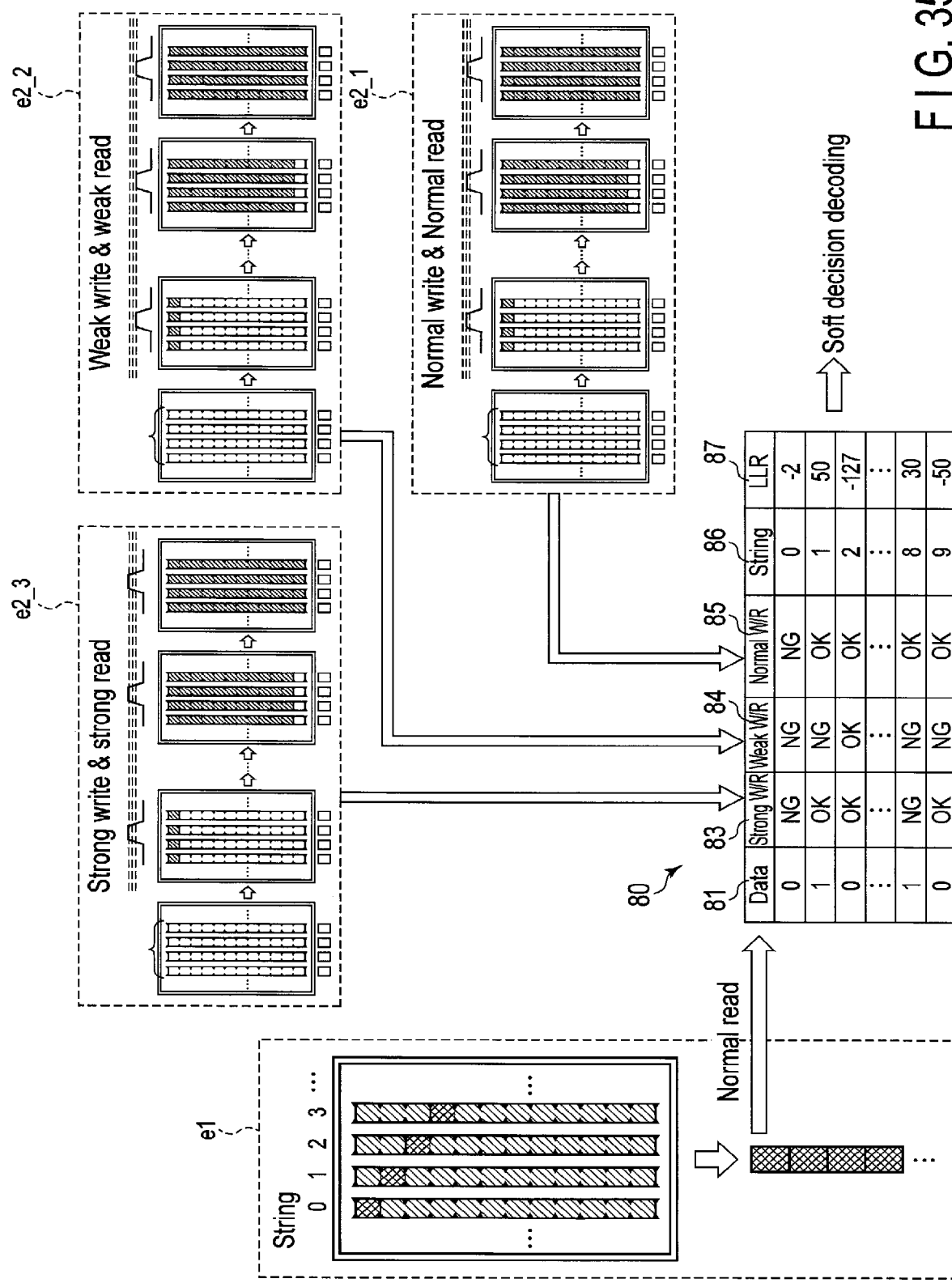
F I G. 35

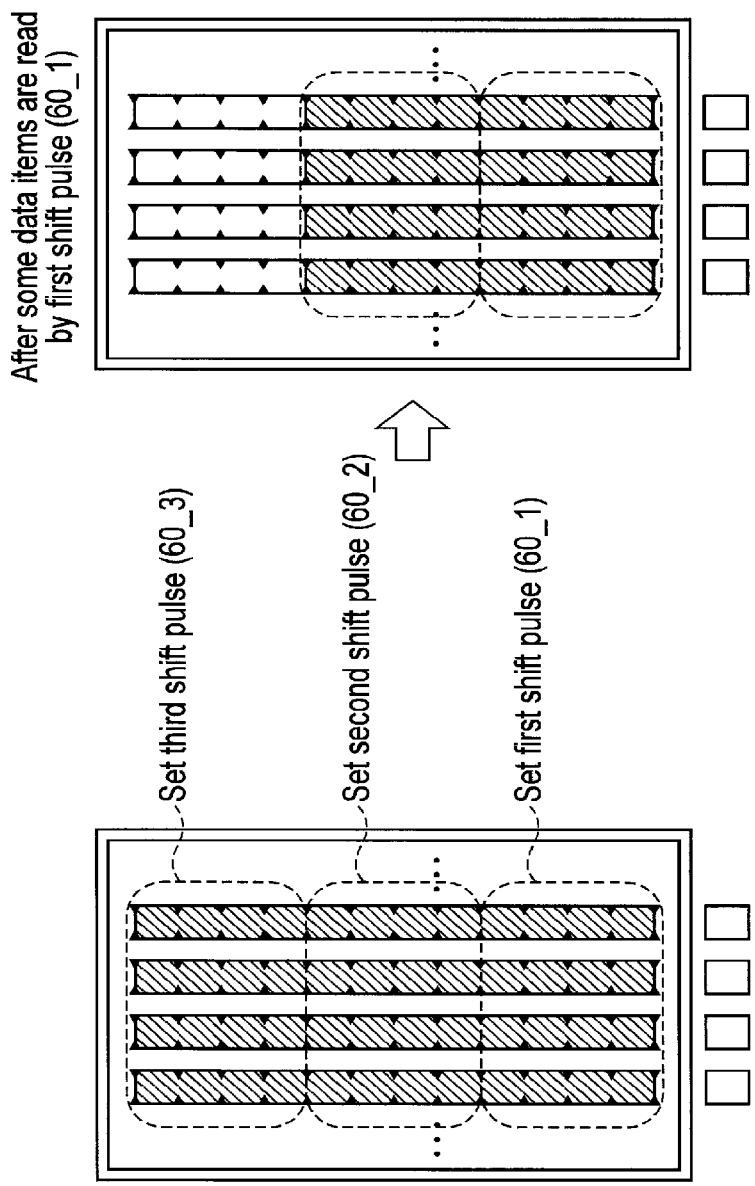
F I G. 36

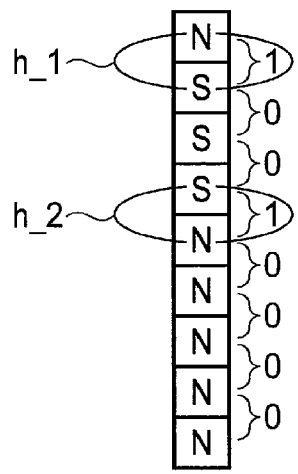
F I G. 37
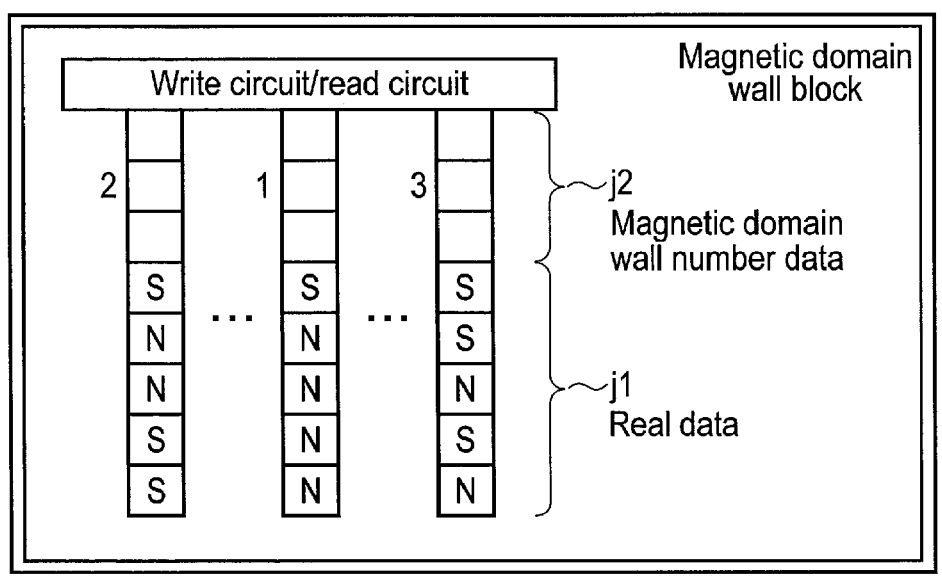
F I G. 38

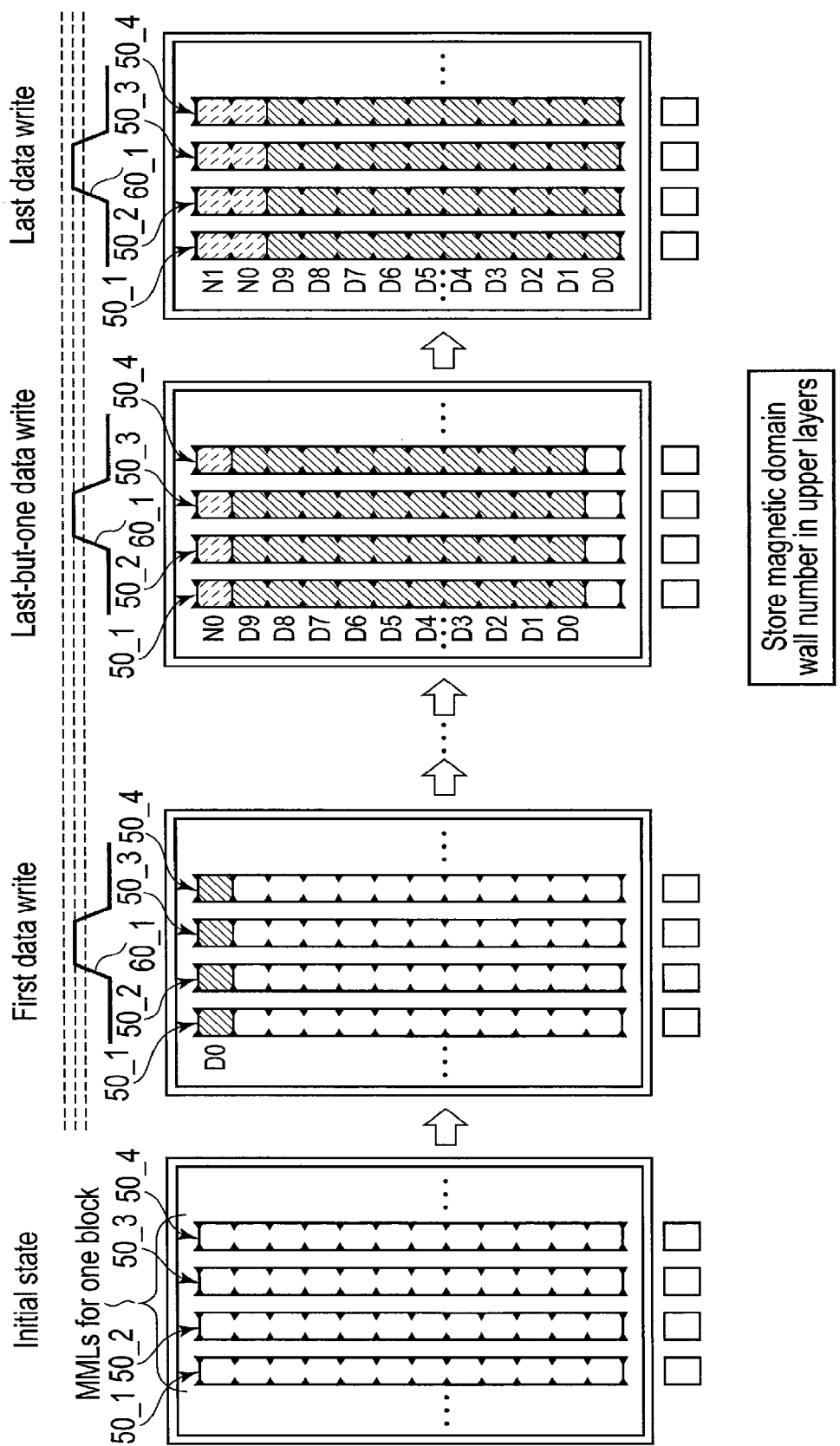
F I G. 40

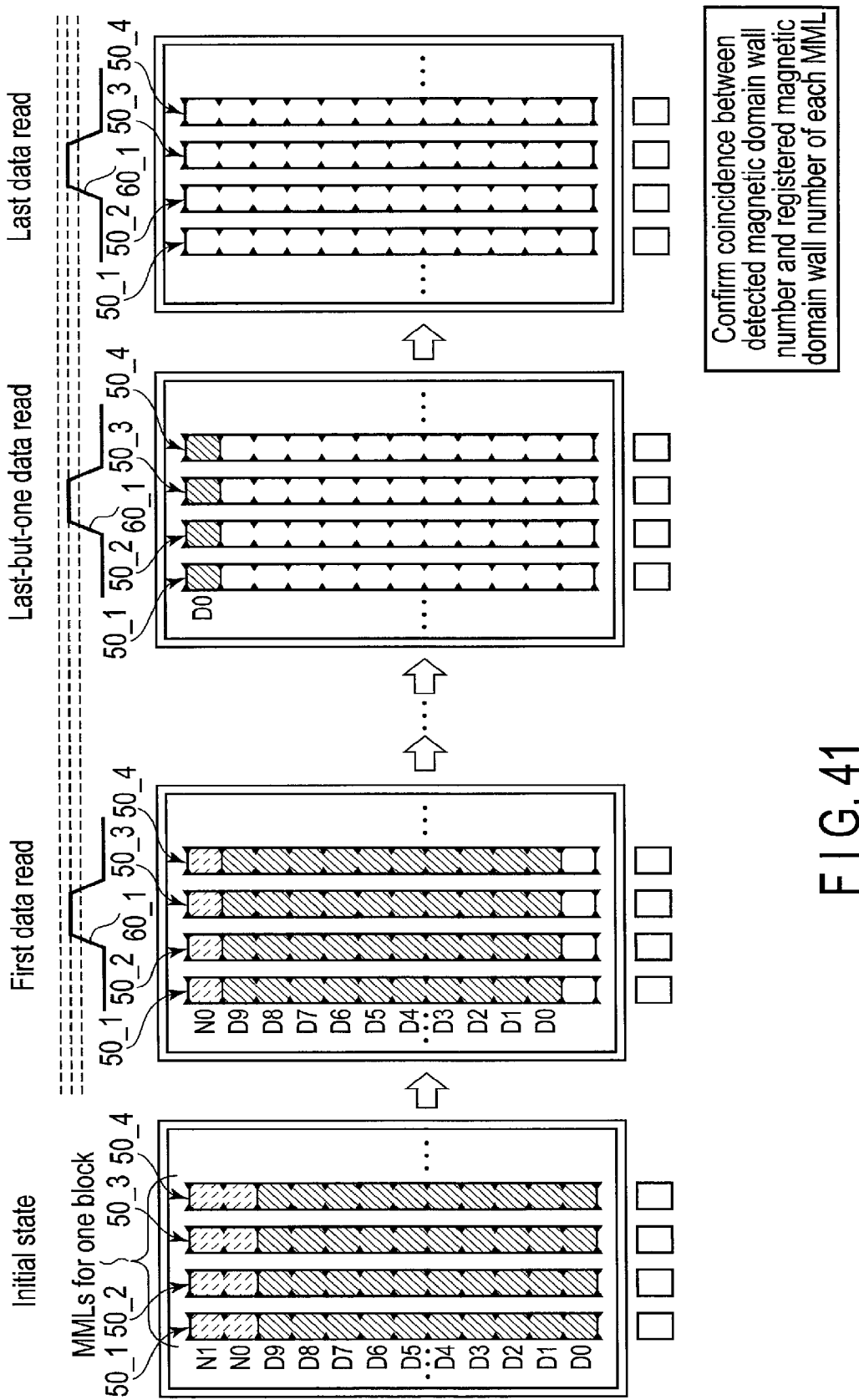
F I G. 41

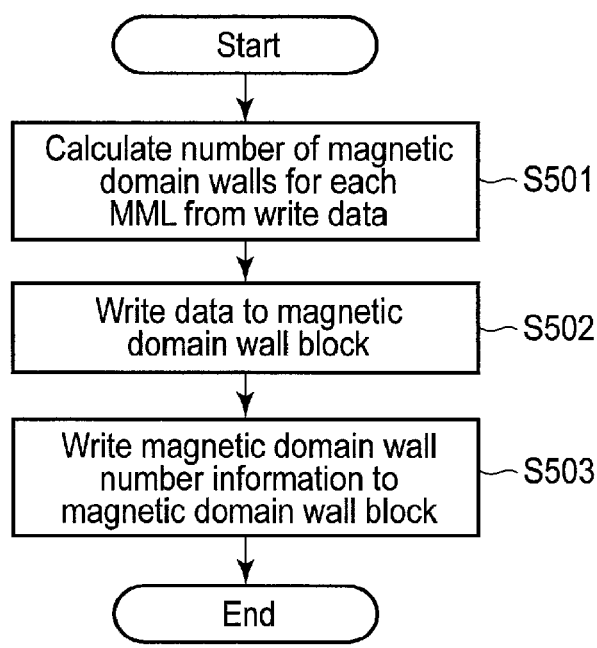
F I G. 43

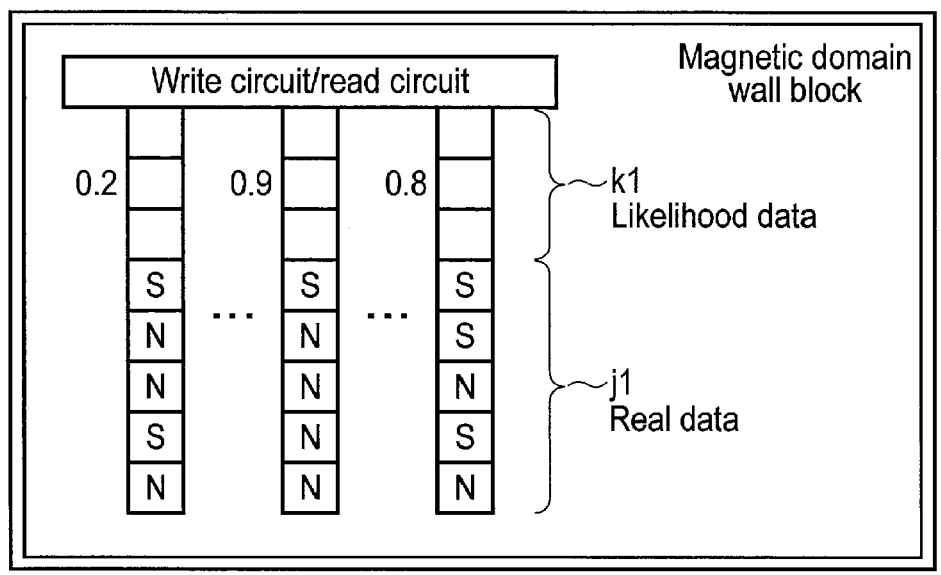
F I G. 45

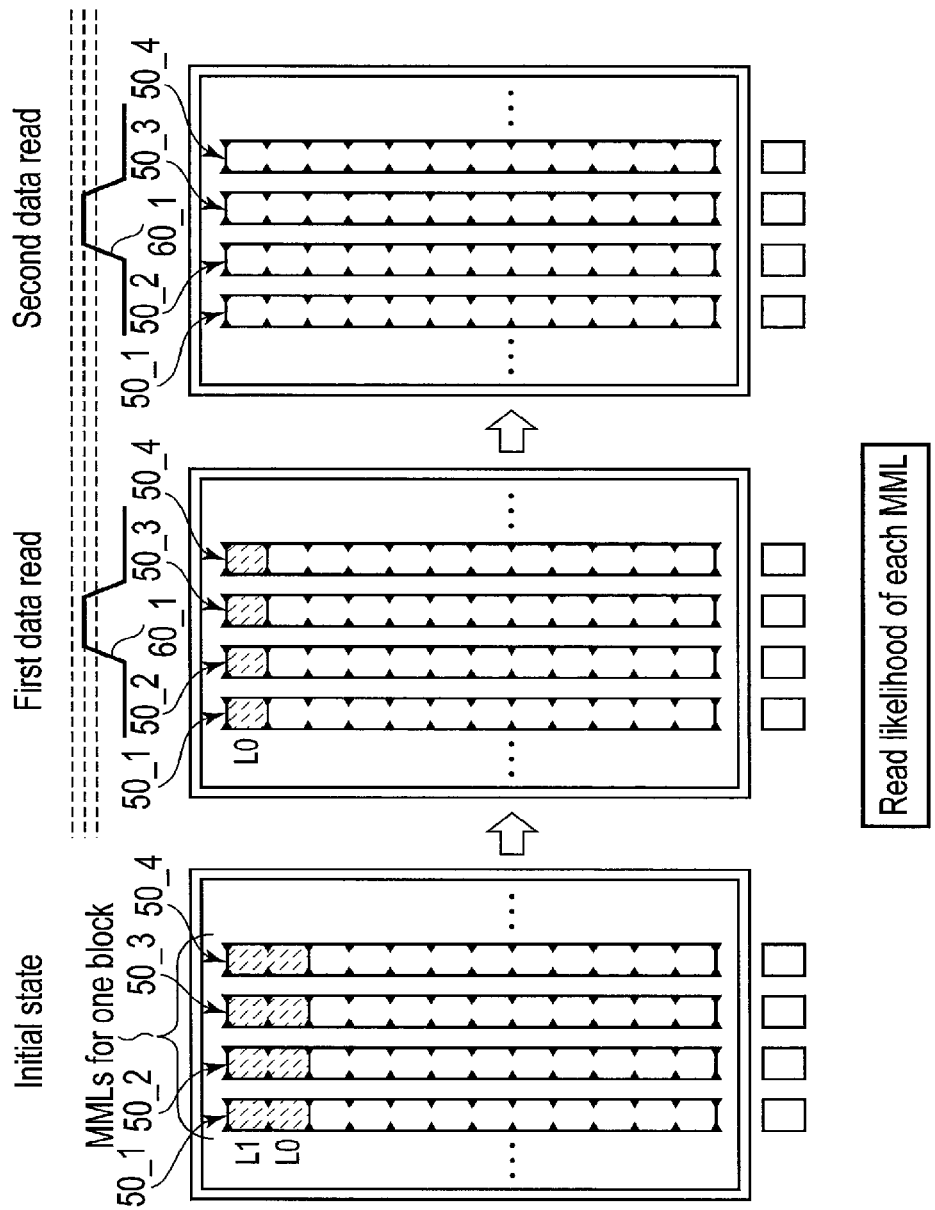
F I G. 46

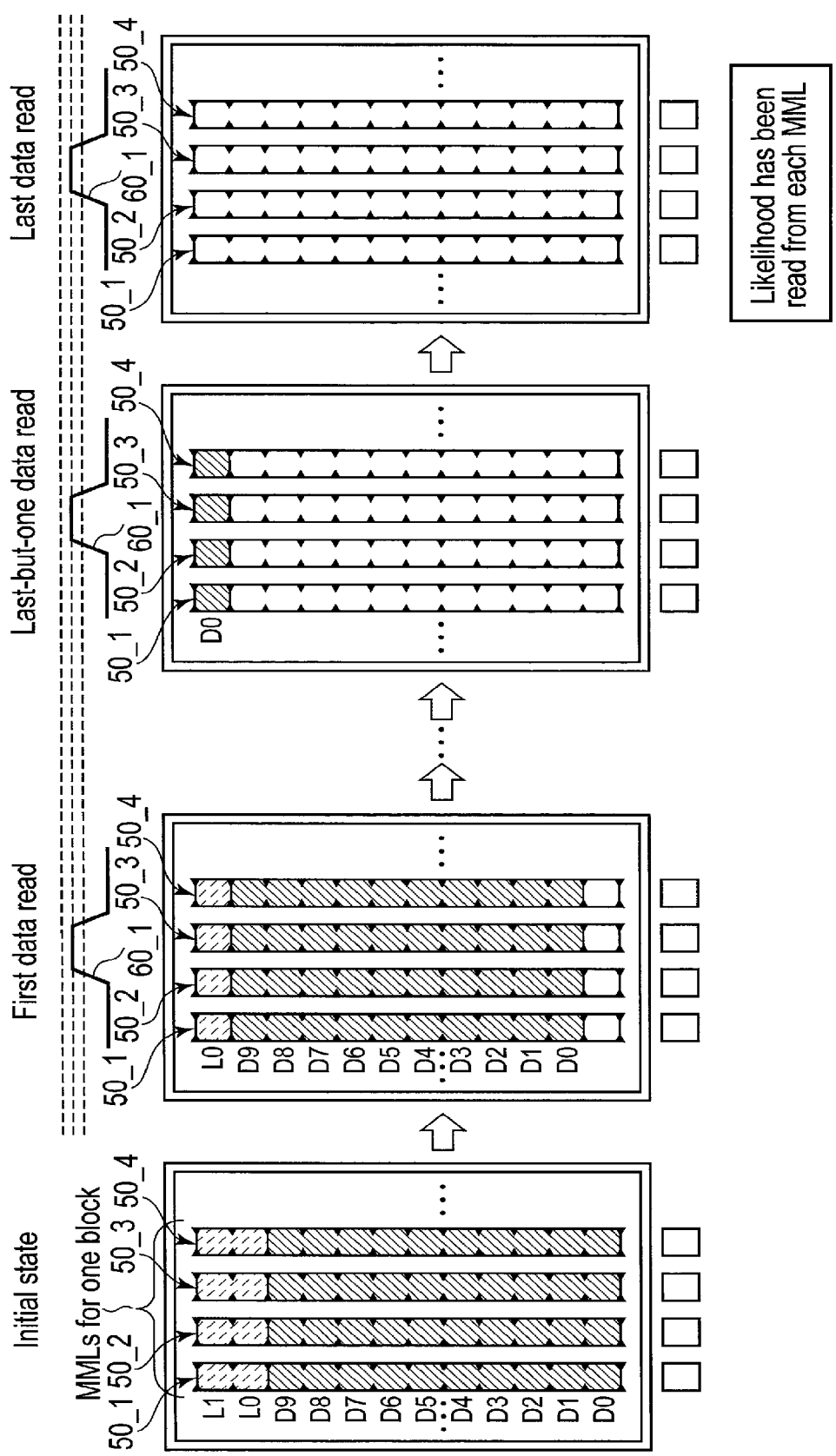
F I G. 48

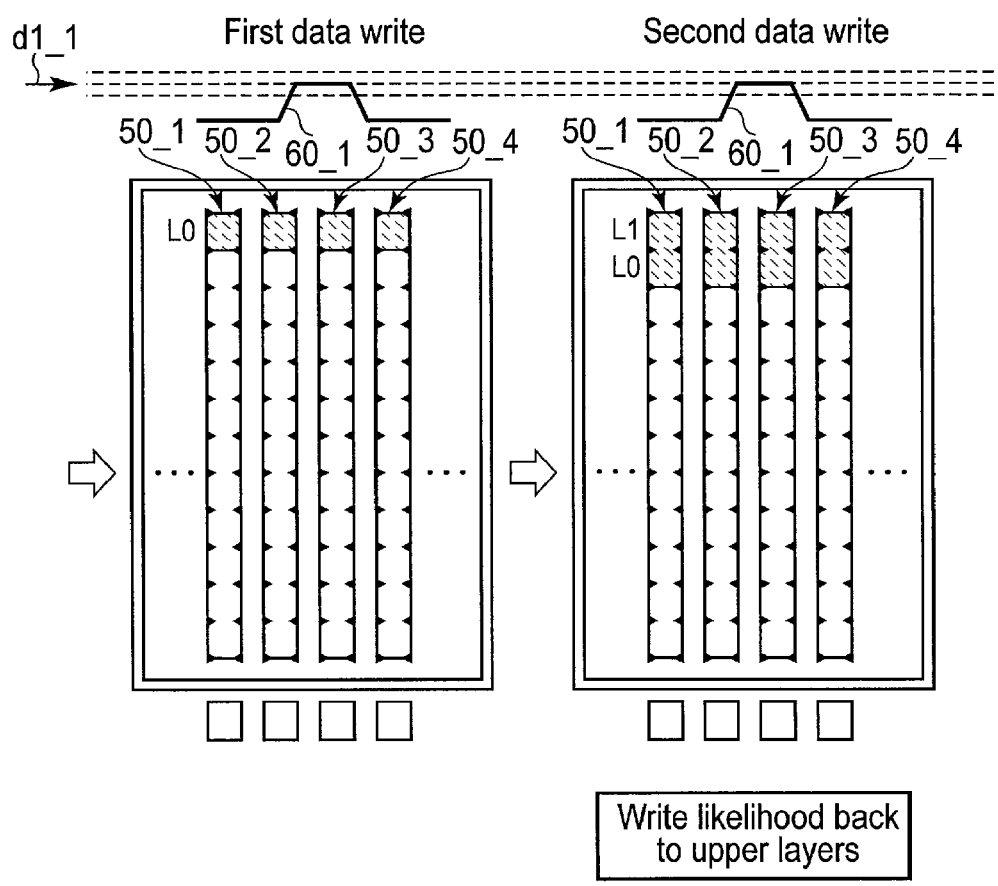
F I G. 49

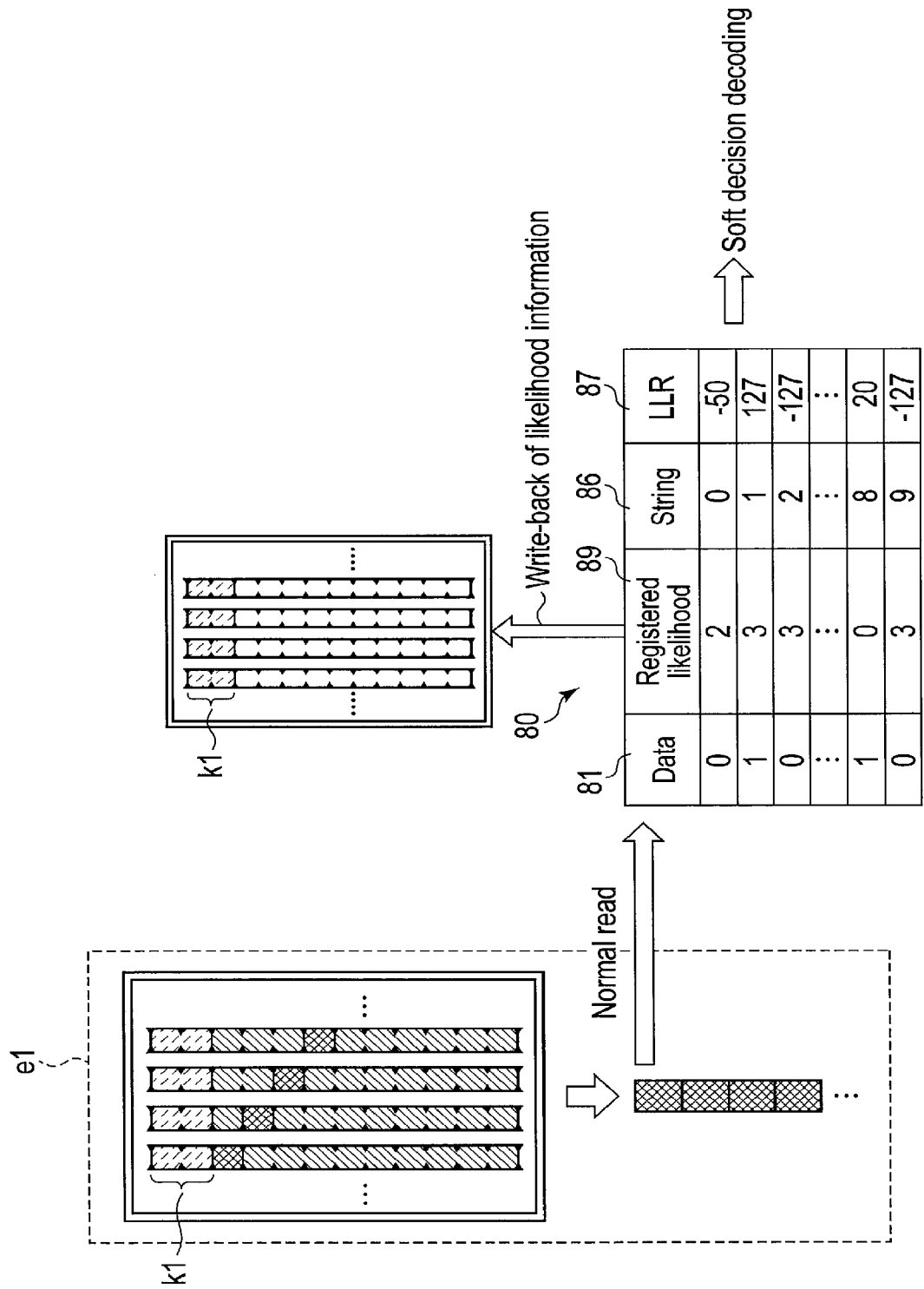
F I G. 50

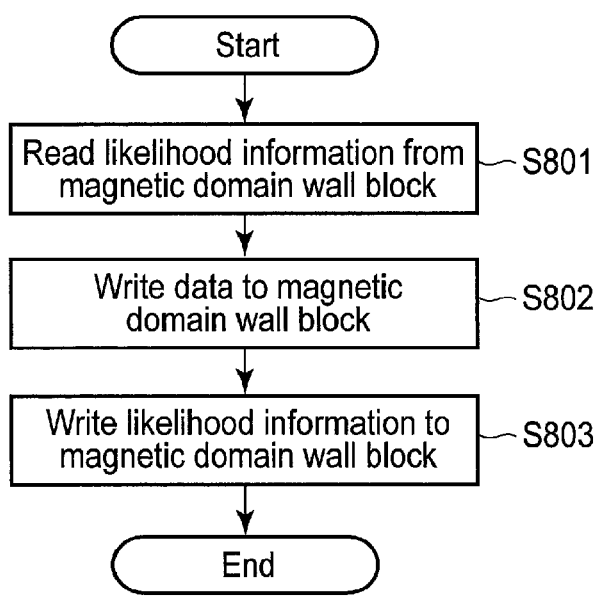
F I G. 52

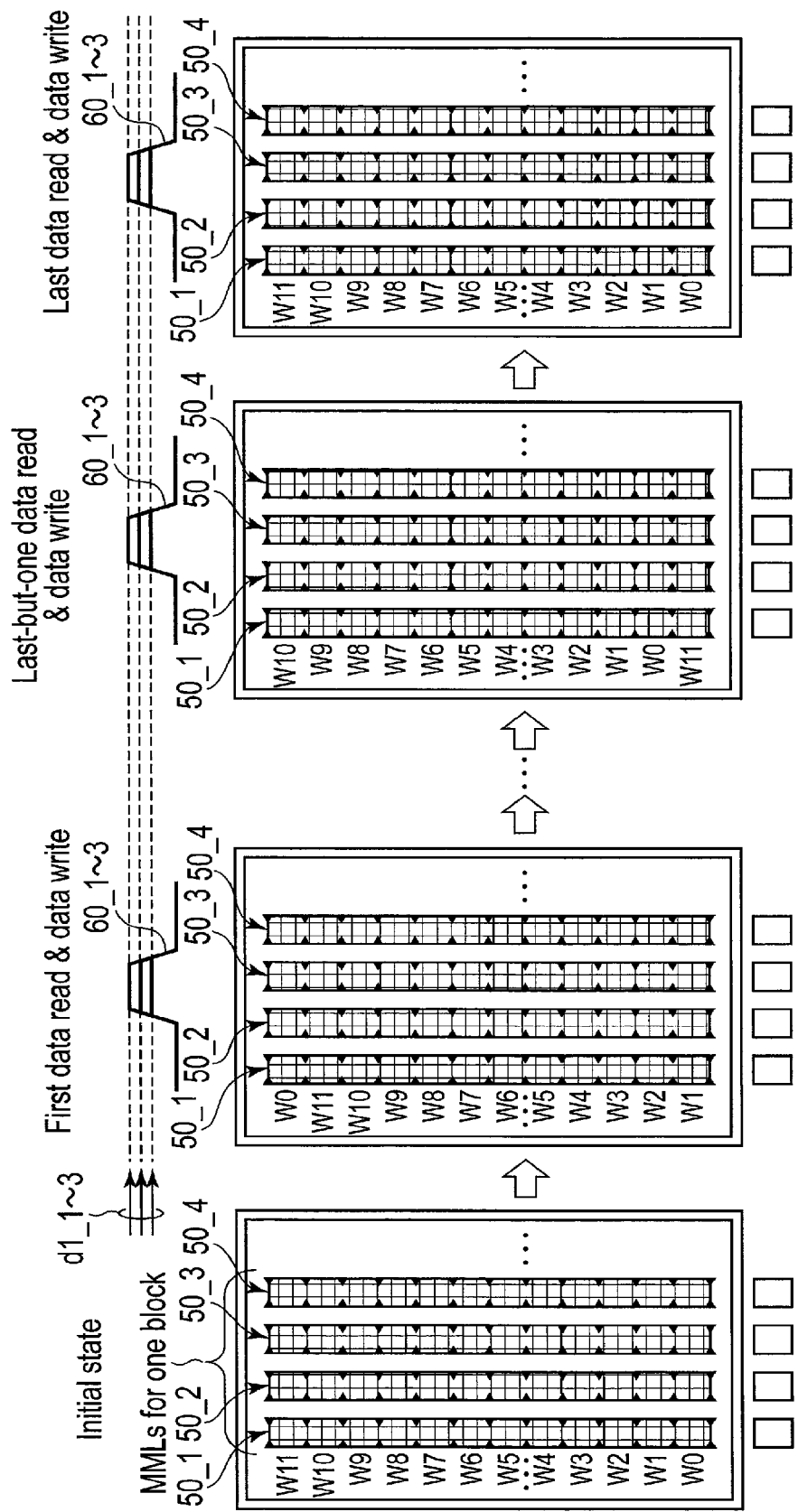
F I G. 54

MEMORY SYSTEM AND SHIFT REGISTER MEMORY

CROSS-REFERENCE TO RELATED APPLICATIONS

This application is based upon and claims the benefit of priority from Japanese Patent Application No. 2020-050894, filed Mar. 23, 2020, the entire contents of which are incorporated herein by reference.

FIELD

Embodiments described herein relate generally to a technology to control a nonvolatile memory.

BACKGROUND

In recent years, memory systems including nonvolatile memories have been widely spread. As one of the memory systems, a solid-state drive (SSD) including a NAND flash memory is known.

As a next-generation nonvolatile memory, a shift register memory in which data is written and read by the first-in first-out method or the last-in first-out method, has recently started to be developed.

Readout of data from a shift register memory is destructive readout. It was therefore considered that soft decision decoding in which data is read out a plurality of times could not be performed in the shift register memory.

BRIEF DESCRIPTION OF THE DRAWINGS

FIG. 3 is a diagram showing an example of write and read operations for a block in the magnetic domain wall shift memory shown in FIG. 2.

FIG. 5 is a diagram showing an example of write and read operations for a block in the magnetic domain wall shift memory shown in FIG. 4.

FIG. 9 is an illustration of write/read of test data to calculate likelihood information to be used for soft decision decoding by the memory system according to the embodiment.

FIG. 10 is an illustration of checking a tendency of errors generated in a cell array by writing/reading test data a plurality of times by different shift pulses by the memory system according to the embodiment.

FIG. 11 is an illustration of calculating likelihood information to be used in soft decision decoding based on a result of writing/reading of test data by the memory system according to the embodiment.

FIG. 12 is a flowchart showing a rough procedure for performing soft decision decoding for data that is destructively read out of the magnetic domain wall shift memory according to the embodiment.

FIG. 13 is a block diagram showing an exemplary configuration of soft decision decoding of the memory system according to the embodiment.

FIG. 14 is a schematic diagram showing a read-mode operation of the magnetic domain wall shift memory of the memory system according to the embodiment.

FIG. 16 is a diagram showing an operation of the magnetic domain wall shift memory which is performed when test data is read by the first shift pulse of the memory system according to the embodiment.

FIG. 19 is a diagram showing an operation of the magnetic domain wall shift memory which is performed when test data is written by a third shift pulse of the memory system according to the embodiment.

FIG. 21 is a diagram illustrating calculation of likelihood information of data read out of an MML, which is performed by the memory system according to the embodiment.

FIG. 23 is a flowchart showing an example (first pattern) of a procedure for a retry process to be performed by the memory system according to the embodiment.

FIG. 28 is a diagram showing a basic read operation of a first-in first-out magnetic domain wall shift memory of the memory system according to the embodiment.

FIG. 32 is a diagram showing an operation of the first-in first-out magnetic domain wall shift memory which is performed when test data is read by the second shift pulse of the memory system according to the embodiment.

FIG. 34 is a diagram showing an operation of the first-in first-out magnetic domain wall shift memory which is performed when test data is read by the third shift pulse of the memory system according to the embodiment.

FIG. 35 is a diagram illustrating calculation of likelihood information of data read out of an MML, which is performed by the memory system according to the embodiment.

FIG. 36 is a diagram illustrating a modification to test data write/read performed by the memory system according to the embodiment.

FIG. 37 is a diagram showing an example where the magnetic domain wall shift memory retains data to calculate likelihood information based on the number of magnetic domain walls by the memory system according to the embodiment.

FIG. 38 is a diagram showing an example where magnetic domain wall number data is written to the magnetic domain wall shift memory to calculate likelihood information based on the number of magnetic domain walls by the memory system according to the embodiment.

FIG. 40 is a diagram showing a write operation of a last-in first-out magnetic domain wall shift memory which is performed when the number of magnetic domain walls is recorded by the memory system according to the embodiment.

FIG. 41 is a diagram showing a read operation of the last-in first-out magnetic domain wall shift memory which is performed when the number of magnetic domain walls is recorded by the memory system according to the embodiment.

FIG. 43 is a flowchart showing an example of a procedure for a write process to be performed when the memory system according to the present embodiment calculates likelihood information based on the number of magnetic domain walls.

FIG. 45 is a diagram showing an example of writing likelihood information to the magnetic domain wall shift memory by the memory system according to the present embodiment.

FIG. 46 is a diagram showing a first example of a write operation of the last-in first-out magnetic domain wall shift memory which is performed when the memory system according to the embodiment records likelihood information.

FIG. 48 is a diagram showing a first example of a read operation of the last-in first-out magnetic domain wall shift memory which is performed when the memory system according to the embodiment records likelihood information.

FIG. 49 is a diagram showing a second example of the read operation of the last-in first-out magnetic domain wall shift memory which is performed when the memory system according to the embodiment records likelihood information.

FIG. 50 is a diagram showing a reuse cycle of likelihood information for use in soft decision decoding in the memory system according the embodiment.

FIG. 52 is a flowchart showing an example of a procedure for a write process to be performed when the memory system according to the embodiment records likelihood information.

FIG. 54 is a diagram showing an operation of the first-in first-out magnetic domain wall shift memory to be performed during parallel read/write for write data diverted as test data by the memory system according to the embodiment.

DETAILED DESCRIPTION

Various embodiments will be described hereinafter with reference to the accompanying drawings.

In general, according to one embodiment, a memory system includes a shift register memory and a controller. The shift register memory includes a plurality of blocks each including a plurality of data storing shift strings, and is configured to write and read data to and from each of the blocks using a first-in first-out method or a last-in first-out method by shifting data stored in each of a plurality of layers included in each of the data storing shift strings in a first direction from an uppermost layer to a lowermost layer or in a second direction opposite to the first direction. The controller is configured to control the shift register memory. The shift register memory is configured to set a current value or voltage application time of a shift pulse to be applied to a plurality of data storing shift strings in a first block in order to store data in an uppermost layer of each of the data storing shift strings in the first block or to shift data stored in a plurality of layers included in each of the data storing shift strings in the first block in the first direction or the second direction, based on a first parameter of a first command when receiving the first command from the controller. The controller is configured to: change a shift pulse, which is to be applied to the data storing shift strings in the first block from which first data is read by applying a first shift pulse, to a second shift pulse, which differs from the first shift pulse in current value or voltage application time, by the first parameter to write second data to each of the data storing shift strings in the first block and to read the second data from each of the data storing shift strings in the first block; create likelihood information of data read from each of the data storing shift strings in the first block in accordance with a read result of the second data which is written to each of the data storing shift strings in the first block and which is read from each of the data storing shift strings in the first block; and perform soft decision decoding for the first data using the likelihood information.

Figure 1:
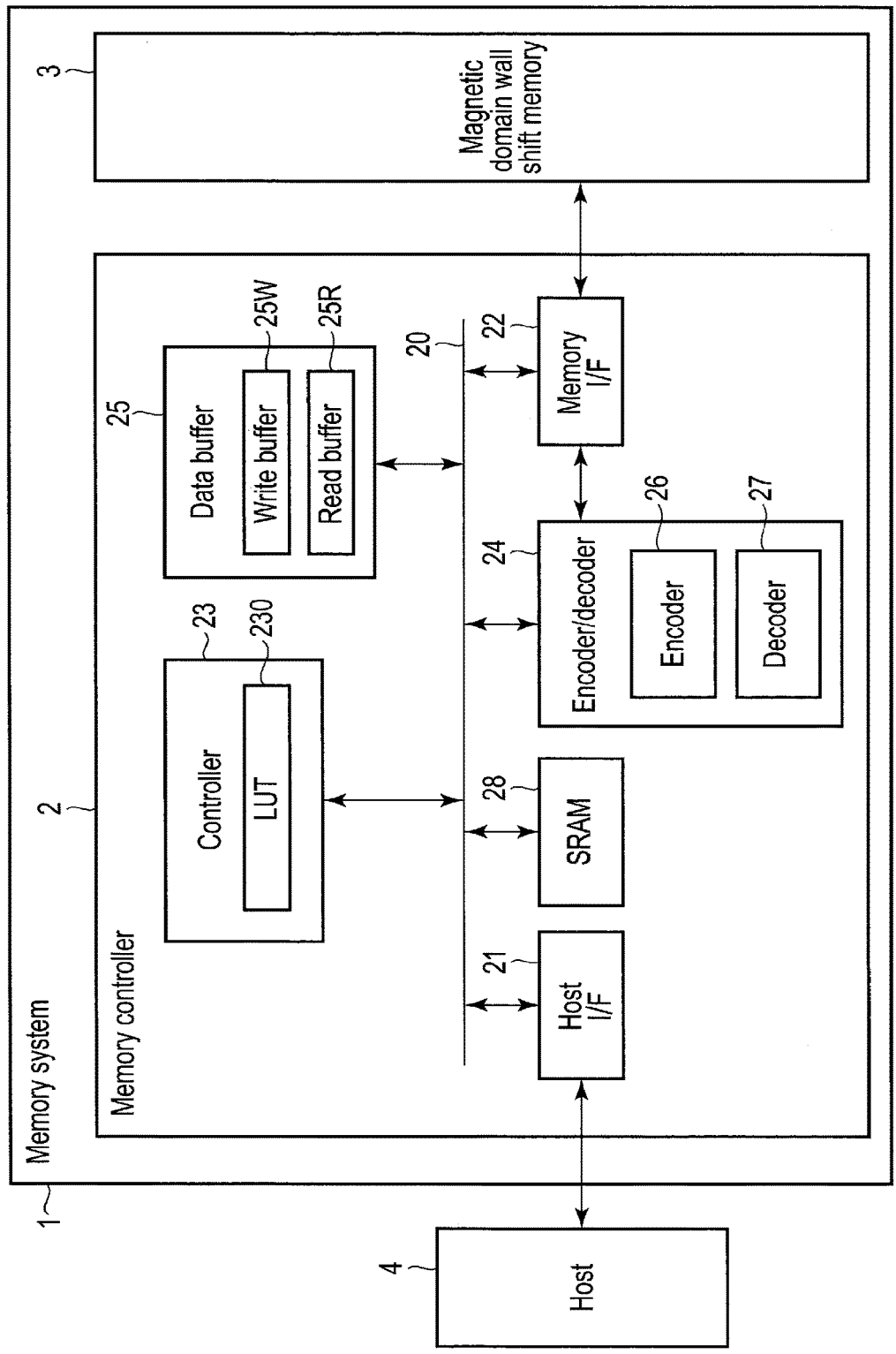
FIG. 1 is a block diagram showing an exemplary configuration of a memory system according to an embodiment.

FIG. 1 shows an exemplary configuration of a memory system 1 according to the embodiment. The memory system 1 includes a memory controller 2 and a shift register memory. The memory system 1 can be connected to a host 4. In FIG. 1, the memory system 1 is connected to the host 4. The host 4 is an electronic device such as a personal computer, a server, and a mobile terminal.

The shift register memory is a memory that stores data nonvolatilely. The shift register memory is configured to write and read data in a certain capacity unit called a physical block by the last-in first-out method (also referred to as the first-in last-out method) or the first-in first-out method. Hereinafter, the physical block will also be referred to simply as a block.

The shift register memory includes a plurality of blocks. Each of the blocks includes a plurality of layers that function as a plurality of stages of a shift register. In other words, one of the layers functions as its corresponding one of the stages in the shift register. In the last-in first-out shift register memory, data is written to and read from a certain block using the last-in first-out method by shifting data stored in each layer in a first direction from a layer corresponding to a first stage toward a layer corresponding to a last stage or in a second direction opposite to the first direction. In the first-in first-out shift register memory, data is written to and read from a certain block using the first-in first-out method by shifting data stored in each layer in a first direction from a layer corresponding to a first stage toward a layer corresponding to a last stage.

There is a magnetic domain wall shift memory 3 as an example of the shift register memory in which data is written and read by the last-in first-out method or the first-in first-out method. To write data to and read data from the magnetic domain wall shift memory 3, each of magnetic domains for storing information ("1" or "0") is shifted (moved) by causing current to flow through a magnetic shift register including the magnetic domains. The following is an example where the shift register memory in the memory system 1 is the magnetic domain wall shift memory 3. A variety of operations in the magnetic domain wall shift memory 3 to be described later can be applied to different shift register memories.

The memory system 1 may be implemented as a solid-state drive (SSD) or a memory card in which the memory controller 2 and the magnetic domain wall shift memory 3 are configured as one package.

The memory controller 2 controls writing of data to the magnetic domain wall shift memory 3 in response to a write request (e.g., a write command) from the host 4. The memory controller 2 also controls reading of data from the magnetic domain wall shift memory 3 in response to a read request (e.g., a read command) from the host 4.

The memory controller 2 may be implemented by a circuit such as an SoC. The memory controller 2 includes a host interface 21, a memory interface 22, a controller 23, an encoder/decoder 24, a data buffer 25, a static random access memory (SRAM) 28, and the like. The host interface 21, memory interface 22, controller 23, encoder/decoder 24, data buffer 25 and SRAM 28 are connected to an internal bus 20.

The host interface 21 performs a process in conformity with the interface standard between the host and the device, and outputs a request, user data, etc., received from the host 4 to the internal bus 20. The host interface 21 transmits user data read from the magnetic domain wall shift memory 3, a response received from the controller 23, etc., to the host 4. In the present embodiment, data to be written to the magnetic domain wall shift memory 3 in response to a write request from the host 4 is called user data.

The memory interface 22 performs a write operation to write data to the magnetic domain wall shift memory 3 based on an instruction from the controller 23. The memory interface 22 also performs a read operation to read data from the magnetic domain wall shift memory 3 based on an instruction from the controller 23.

The controller 23 comprehensively controls the components of the memory system 1. The controller 23 may be implemented by a CPU (processor).

Upon receiving a request from the host 4 via the host interface 21, the controller 23 performs control corresponding to the request. For example, the controller 23 instructs the memory interface 22 to write user data and parity to the magnetic domain wall shift memory 3 in response to a write request from the host 4. The controller 23 also instructs the memory interface 22 to read user data and parity from the magnetic domain wall shift memory 3 in response to a read request from the host 4. Here, the parity means an error correction code (ECC) obtained by encoding user data. The write request specifies a logical address and the like. The logical address specified by the write request indicates a logical address to which write data is written. The read request specifies a logical address and the like. The logical address specified by the read request indicates a logical address corresponding to data to be read.

Upon receiving a write request from the host 4, the controller 23 determines a storage area (memory area) on the magnetic domain wall shift memory 3 to which user data stored in the data buffer 25 is to be written. That is, the controller 23 manages a destination to which the user data is written. The controller 23 also manages mapping between a logical address designated in response to the write request from the host 4 and a physical address representing a storage area on the magnetic domain wall shift memory 3 to which user data corresponding to the logical address is written, using a lookup table (LUT) 230 that functions as an address conversion table. The LUT 230 may be stored in a RAM (dynamic RAM (DRAM) or SRAM 28) in the memory system 1 or may be stored nonvolatilely in the magnetic domain wall shift memory 3. In the latter case, when the memory system 1 is powered on, the LUT 230 may be loaded from the magnetic domain wall shift memory 3 into the RAM in the memory system 1.

Upon receiving a read request from the host 4, the controller 23 converts a logical address designated by the read request into a physical address using the LUT 230, and instructs the memory interface 22 to read data from the physical address.

An ECC frame (also referred to as a frame hereinafter) including user data and ECC is written to a block included in the magnetic domain wall shift memory 3. The block may be divided logically into a plurality of pages. In other words, a plurality of ECC frames may be written to a block.

The data buffer 25 may include a write buffer 25W that temporarily stores data to be written to the magnetic domain wall shift memory 3. The data to be written to the magnetic domain wall shift memory 3 is, for example, user data received from the host 4 upon receipt of a write request. The data buffer 25 may also include a read buffer 25R that temporarily stores data read from the magnetic domain wall shift memory 3. The data buffer 25 may temporarily store an ECC frame that is a code word generated by encoding user data. The data buffer 25 is constructed in, for example, the foregoing RAM (SRAM 28 or DRAM).

The user data transmitted from the host 4 is transferred to the internal bus 20 and stored in the data buffer 25. The encoder/decoder 24 encodes data to be written to the magnetic domain wall shift memory 3 to generate an ECC frame that is a code word. As coding, for example, Reed Solomon (RS) coding, Bose Chaudhuri Hocquenghem (BCH) coding, and Low Density Parity Check (LDPC) coding can be used, but any other coding can be used. The encoder/decoder 24 includes an encoder 26 and a decoder 27.

For the sake of simplifying the description, it is assumed in the present embodiment that the magnetic domain wall shift memory 3 includes one magnetic domain wall shift memory chip. However, the present embodiment can be applied to a configuration in which the magnetic domain wall shift memory 3 includes a plurality of magnetic domain wall shift memory chips. Hereinafter, the magnetic domain wall shift memory chip will also be referred to simply as a memory chip.

<Last-In First-Out Magnetic Domain Wall Shift Memory>

Figure 2:
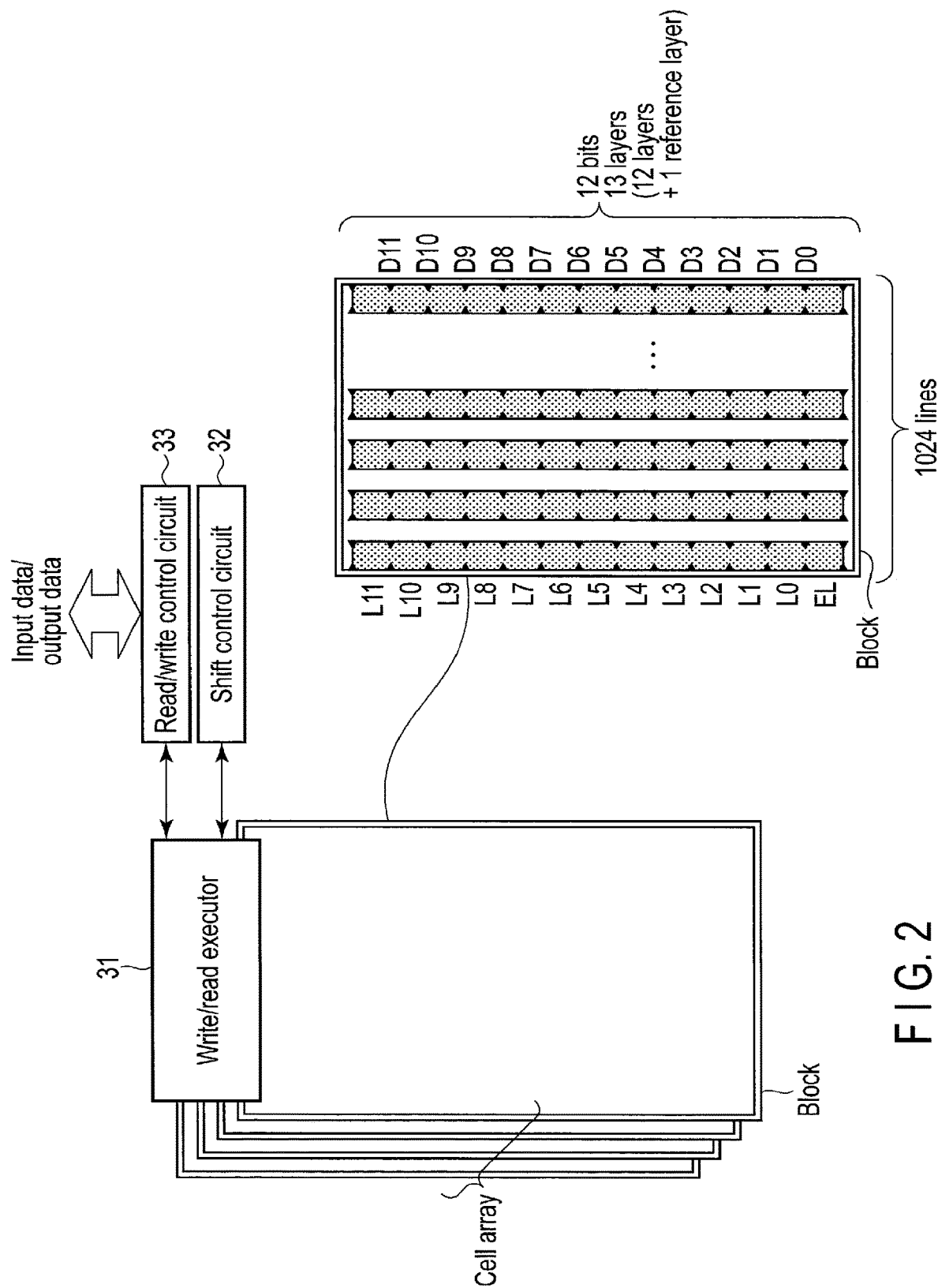
FIG. 2 is a diagram showing an exemplary configuration of a last-in first-out cell array in a magnetic domain wall shift memory included in the memory system according to the embodiment.

FIG. 2 shows an exemplary configuration of a cell array included in a last-in first-out magnetic domain wall shift memory 3 of the last-in first-out system. For easy understanding of the following descriptions, specific numerical values are used to describe an exemplary configuration of a cell array, but the numerical values are an example only, and the present embodiment is not limited to the numerical values, and any numerical value can be applied to the configuration of the cell array of the present embodiment.

The cell array includes a plurality of blocks. Each of the blocks is a unit in which data is written and read by the last-in first-out method.

Assume here that each of the blocks includes a total of 13 layers including an extended layer (EL) and layers L0 to L11. These 13 layers function as a plurality of stages of the foregoing shift register. The layer L11 corresponds to a first stage of the shift register and the extended layer EL corresponds to a last stage of the shift register.

The extended layer EL and layers L0 to L11 of each block can be achieved by a plurality of data storing shift strings included in the block. Each of the data storing shift strings is a unit in which one-bit data is written and read by the last-in first-out method. The data storing shift strings are magnetic substances which are referred to as a magnetic storage line (MML), a magnetic storage fine line, a magnetic substance column, a magnetic line, a magnetic fine line, a string, or the like. The following is an example where the data storing shift strings are MMLs.

It is here assumed that each block includes 1024 (1K) MMLs. In the magnetic domain wall shift memory 3, the MMLs are magnetic shift registers and are achieved by, for example, magnetic materials extending in one direction. Each MML can include a plurality of memory cells corresponding to their respective stages from the first to last stages. The magnetization direction of each memory cell is used as information indicative of "1" or "0". The magnetization direction is, for example, either S or N. The magnetic domain wall shift memory 3 may employ two methods for storing "1" or "0" in an MML including a plurality of memory cells. The first method is for storing "1" or "0" depending on the magnetization direction itself. In the first method, for example, when the magnetization direction of the memory cells is N, it is used as information of "1" and when the magnetization direction of the memory cells is S, it is used as information of "0". The second method is for storing "1" or "0" depending on whether or not the magnetization direction changes. In the second method, for example, when the magnetization directions of two adjacent memory cells are S or N, they are used as information of "0" and when one of the magnetization directions is S and the other is N, they are used as information of "1". The boundary at which the magnetization direction of a memory cell is changed from S to N or from N to S will be referred to as a magnetic domain wall. It is assumed here that the second method is adopted. In the second method for storing data depending on the presence or absence of a magnetic domain wall, for example, N is first written in order to write data to an MML. Then, N is written if the data to be written first is "0", and S is written if the data is "1". If S is written, then S is written when data to be written next is "0" and N is written when the data is "1". After data for one block is written, N is written to the extended layer EL of the lowermost layer. That is, one MML retains 12-bit data in a block including a total of 13 layers of the extended layer EL and layers L0 to L11 shown in FIG. 2. In the block shown in FIG. 2, therefore, the block size is 12 Kbits (=12 bits× 1024 (1K)). Note that the extended layer is also referred to as a reference layer.

Each MML is accessed by the last-in first-out method in which the storage location of previously-written data (boundary between adjacent two layers) is moved to the back when the next data is written, and the data at the back cannot be read before later-written data is read.

It is assumed in the present embodiment that one MML can store 12 bits as shown in FIG. 2. This assumption corresponds to a configuration in which one MML of the magnetic domain wall shift memory 3 includes a total of 13 memory cells of the extended layer EL and layers L0 to L11 as described above.

In the above case, the size of one block is 12 Kbits (=12 bits×1024 (1K)) as described above. It is considered that, for example, two of 12 bits retained in each MML may be used for information to be attached to data and stored as well as for parity. For the sake of simplicity, it is assumed that for example, two bits are used for parity. The parity is an error correction code (ECC) to be added to data. Note that the numerical value of two bits is an example, and a variety of other numerical values can be applied to the present embodiment.

In FIG. 2, a cylinder whose longitudinal direction is the axial direction is shown as one MML. A combination of 1024 (1K) MMLs is one block. The block is represented by a double square. The 1024 (1K) MMLs contained in the block constitute a total of 13 layers of the extended layer EL and layers L0 to L11. The MMLs retain 12-bit data of D0 to D11 with the extended layer EL and layers L0 to L11.

One end of each of the 1024 (1K) MMLs included in each block is connected to its corresponding one of 1024 (1K) write/read executors. In FIG. 2, a set of the 1024 (1K) input/output units is shown as a write/read executor 31. The write/read executor 31 writes and reads data to and from the block.

The layer L11 that is closest to the write/read executor 31 is used as a first stage of the shift register, and the extended layer EL that is farthest from the write/read executor 31 is used as a last stage of the shift register.

In the write operation, the magnetization direction stored in each layer is shifted toward a first direction (direction from top to bottom in FIG. 2) from the layer L11 corresponding to the first stage toward the extended layer EL corresponding to the last stage.

In the read operation, the magnetization direction stored in each layer is shifted to a second direction opposite to the first direction (direction from bottom to top in FIG. 2).

For example, user data is written as D0 to D9 and ECC is written as D10 and D11 to a total of 13 layers of the extended layer EL and layers L0 to L11 of each MML. In this case, one block is equal to one frame (user data+ECC). In addition, a block may be logically divided into a plurality of pages, and one block may be equal to a plurality of frames.

The write/read executor 31 is connected to a shift control circuit 32 and a read/write control circuit 33. The shift control circuit 32 shifts data for each layer in the block from the layer L11 toward the extended layer EL or from the extended layer EL toward the layer L11.

In the magnetic domain wall shift memory 3, the shift control circuit 32 supplies a current pulse to each MML in the block to shift (move) a magnetic domain wall in the MML. This current pulse is also referred to as a shift pulse. In each MML, a section separated by a magnetic domain wall is called a magnetic domain. Each magnetic domain includes one or more memory cells. In each MML, when a magnetic domain wall moves, the magnetic domains are shifted (moved) in layer units (i.e., in bit units).

The read/write control circuit 33 controls writing and reading of data to and from the block via the write/read executor 31. In a write operation, each of the input/output units included in the write/read executor 31 forms magnetization with a specific magnetization direction in part of an MML connected to the write/read executor in response to a signal from the read/write control circuit 33. Each of the write/read executors included in the write/read executor 31 includes a sense amplifier which detects a magnetization direction of part of one MML connected to the write/read executor in response to a signal from the read/write control circuit 33 in a read operation. The sense amplifier includes a sense latch which temporarily latches a detection result in the magnetization direction. The read/write control circuit 33 can read data from the MML 10 based on the detection result in the magnetization direction latched in the sense latch.

With the foregoing configuration, information is written to and read from each MML by the last-in first-out method. Reading information out of each MML is destructive readout.

FIG. 3 shows an example of performing write and read operations for a block in the last-in first-out magnetic domain wall shift memory 3. As described above, the block includes a plurality of MMLs. Writing of data to all the MMLs included in the same block are performed in parallel. Reading of data from all the MMLs included in the same block are performed in parallel.

In a write operation of writing data to a block, a predetermined magnetization direction (e.g., N) is first written to the uppermost layer L11. Then, the magnetization direction written to the layer L11 is shifted to the next lower layer L10, and a magnetization direction (N or S) indicating data ("1" or "0") is written to the layer L11 in association with the magnetization direction shifted to the layer L10. Subsequently, the magnetization directions written to the layers L11 and L10 are shifted to the next lower layers L10 and L9, respectively, and a magnetization direction indicating the subsequent data is written to the layer L11 in association with the magnetization direction shifted to the layer L10. Similarly, an operation of shifting the written magnetization direction for each layer from the uppermost layer L11 to the lowermost extended layer EL (i.e., toward the first direction) and writing a magnetization direction indicating the subsequent data (in association with the magnetization direction shifted to the layer L10) to the uppermost layer L11, is repeated to write data of "the total number of layers−1" to the block.

In a read operation of reading data from the block, a magnetization direction is first read out of the uppermost layer L11, and a magnetization direction is shifted for each layer from the lowermost extended layer EL to the uppermost layer L11 (i.e., in the second direction). Then, the magnetization direction shifted from the layer L10 is read out of the uppermost layer L11, and data is read out in association with the relationship between two magnetization directions of the last read magnetization direction and the currently read magnetization direction. In this case, too, the magnetization direction written to each layer is shifted from the layer L0 that is the next higher than the lowermost extended layer EL to the uppermost layer L11. Similarly, an operation of reading a magnetization direction from the uppermost layer L11 and shifting the magnetization direction written to each layer toward the second direction is repeated to write data of "the total number of layers−1" to the block.

In the last-in first-out magnetic domain wall shift memory 3, data written to a block first cannot be read out before data written thereafter is read out. In other words, in the last-in first-out magnetic domain wall shift memory 3, data written to a block last can be read out first.

<First-In First-Out Magnetic Domain Wall Shift Memory>

Figure 4:
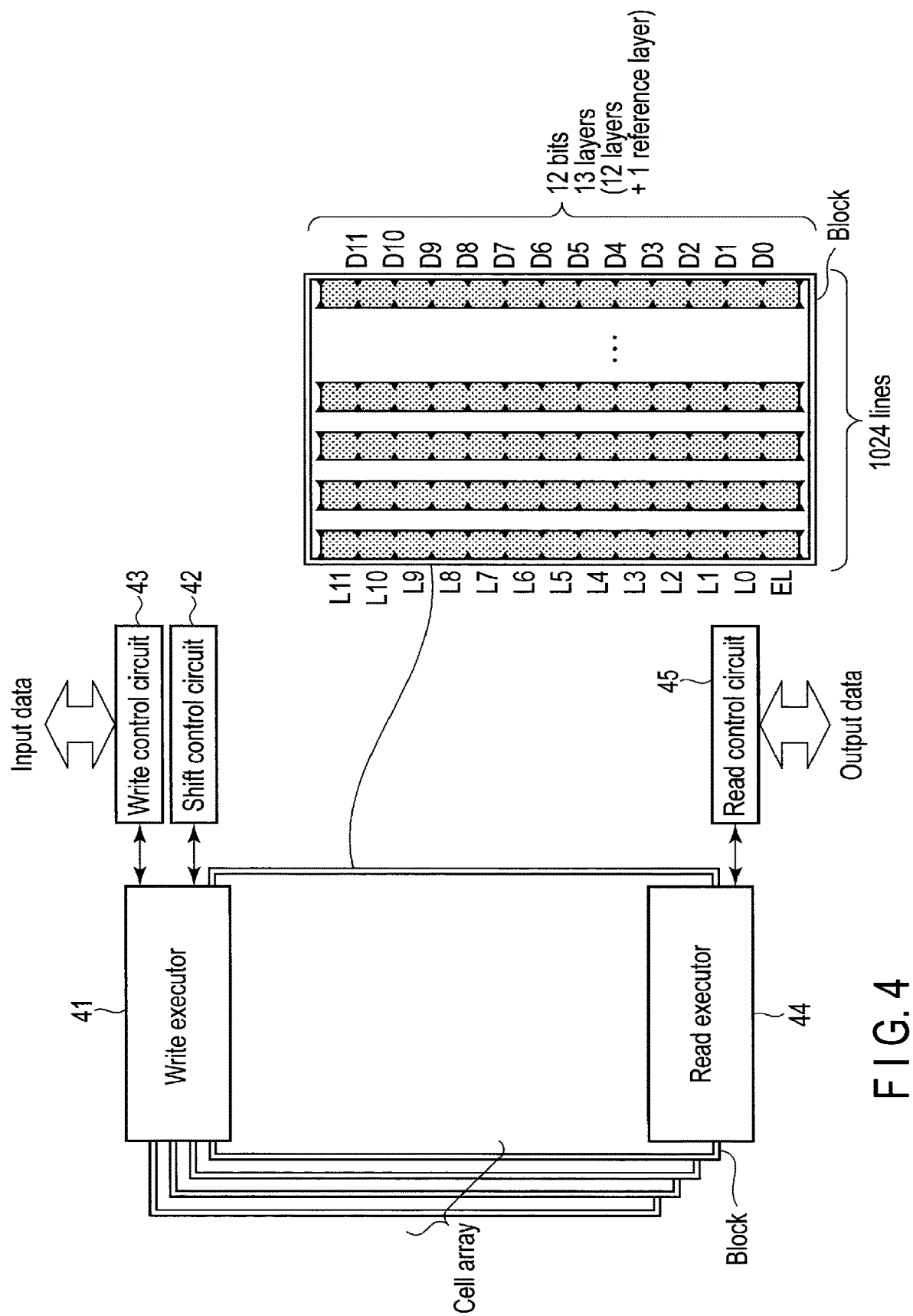
FIG. 4 is a diagram showing an exemplary configuration of a first-in first-out cell array in the magnetic domain wall shift memory included in the memory system according to the embodiment.

FIG. 4 shows an exemplary configuration of a cell array included in a first-in first-out magnetic domain wall shift memory 3. The cell array includes a plurality of blocks. Each of the blocks is a unit in which data is written and read by the first-in first-out method.

It is assumed here that each block includes a total of 13 layers including an extended layer EL and layers L0 to L11 as in the case of the memory cell array included in the last-in first-out magnetic domain wall shift memory 3 described above with reference to FIG. 2. Hereinafter, the differences of the first-in first-out magnetic domain wall shift memory 3 from the last-in first-out magnetic domain wall shift memory 3 will mainly be described, and the similarities between them will not be described.

The extended layer EL and layers L0 to L11 of each block can be achieved by a plurality of data storing shift strings included in the block. Each of the data storing shift strings is a unit in which one-bit data is written and read by the first-in first-out method. The following is a case where the data storing shift strings are MMLs.

Each of the MMLs is accessed by the first-in first-out method in which the storage location of previously-written data (boundary between adjacent two layers) is moved to the back when the next data is written, and data at the front cannot be read before the previously-written data is read.

In FIG. 4, a cylinder whose longitudinal direction is the axial direction is shown as one MML. A combination of 1024 (1K) MMLs is one block. The block is represented by a double square. The 1024 (1K) MMLs contained in the block constitute a total of 13 layers of the extended layer EL and layers L0 to L11. The MMLs retain 12-bit data of D0 to D11 with the extended layer EL and layers L0 to L11.

One end of each of the 1024 (1K) MMLs included in each block is connected to its corresponding one of 1024 (1K) write executors, and the other end thereof is connected to its corresponding one of 1024 (1K) read executors. In FIG. 4, a set of the 1024 (1K) write executors is shown as a write executor 41, and a set of the 1024 (1K) read executors is shown as a read executor 44. The write executor 41 writes to the block and the read executor 44 read data from the block.

The layer L11 that is closest to the write executor 41 is used as a first stage of the shift register, and the extended layer EL that is farthest from the write executor 41 is used as a last stage of the shift register.

In the write and read operations, the magnetization direction stored in each layer is shifted toward a first direction (direction from top to bottom in FIG. 4) from the layer L11 corresponding to the first stage toward the extended layer EL corresponding to the last stage.

The write executor 41 is connected to a shift control circuit 42 and a read control circuit 45. The shift control circuit 42 shifts data for each layer in the block from the layer L11 toward the extended layer EL.

In the magnetic domain wall shift memory 3, the shift control circuit 42 supplies a current pulse to each MML in the block to shift (move) a magnetic domain wall (boundary between adjacent two layers) in the MML.

The write control circuit 43 controls writing of data to the block via the write executor 41. In a write operation, each of the input units included in the write executor 41 forms magnetization with a specific magnetization direction in part of an MML connected to the input unit in response to a signal from the read control circuit 43.

The read control circuit 45 controls reading of data from the block via the read executor 44. Each of the output units included in the read executor 44 includes a sense amplifier which detects a magnetization direction of part of one MML connected to the output unit in response to a signal from the read control circuit 45 in a read operation. The sense amplifier includes a sense latch which temporarily latches a detection result in the magnetization direction. The read control circuit 45 can read data from the MML 10 based on the detection result in the magnetization direction latched in the sense latch.

With the foregoing configuration, information is written to and read from each MML by the first-in first-out method. Reading information out of each MML is destructive readout.

FIG. 5 shows an example of performing write and read operations for a block in the first-in first-out magnetic domain wall shift memory 3. As described above, the block includes a plurality of MMLs.

In a write operation of writing data to a block, a predetermined magnetization direction (e.g., N) is first written to the uppermost layer L11. Then, the magnetization direction written to the layer L11 is shifted to the next lower layer L10, and a magnetization direction (N or S) indicating data ("1" or "0") is written to the layer L11 in view of the magnetization direction shifted to the layer L10. Subsequently, the magnetization directions written to the layers L11 and L10 are shifted to the next lower layers L10 and L9, respectively, and a magnetization direction indicating the subsequent data is written to the layer L11 in view of the magnetization direction shifted to the layer L10. Similarly, an operation of shifting the written magnetization direction for each layer from the uppermost layer L11 to the lowermost extended layer EL (i.e., toward the first direction) and writing a magnetization direction indicating the subsequent data (in view of the magnetization direction shifted to the layer L10) to the uppermost layer L11, is repeated to write data of "the total number of layers–1" to the block.

In a read operation of reading data from the block, a magnetization direction is first read out of the lowermost extended layer FL, and a magnetization direction written to each layer is shifted in the first direction. Then, the magnetization direction shifted from the layer L0 is read out of the lowermost extended layer EL, and data is read out in view of the relationship between two magnetization directions of the last read magnetization direction and the currently read magnetization direction. In this case, too, the magnetization direction written to each layer is shifted from the layer L10 that is the next lower than the uppermost layer L11 to the lowermost extended layer EL. Similarly, an operation of reading a magnetization direction from the lowermost extended layer EL and shifting the magnetization direction written to each layer toward the first direction is repeated to read data of "the total number of layers–1" from the block.

In the first-in first-out magnetic domain wall shift memory 3, data written to a block first can be read first. In other words, in the first-in first-out magnetic domain wall shift memory 3, data written to a block last cannot be read out before data written first is read out.

Figure 6A:
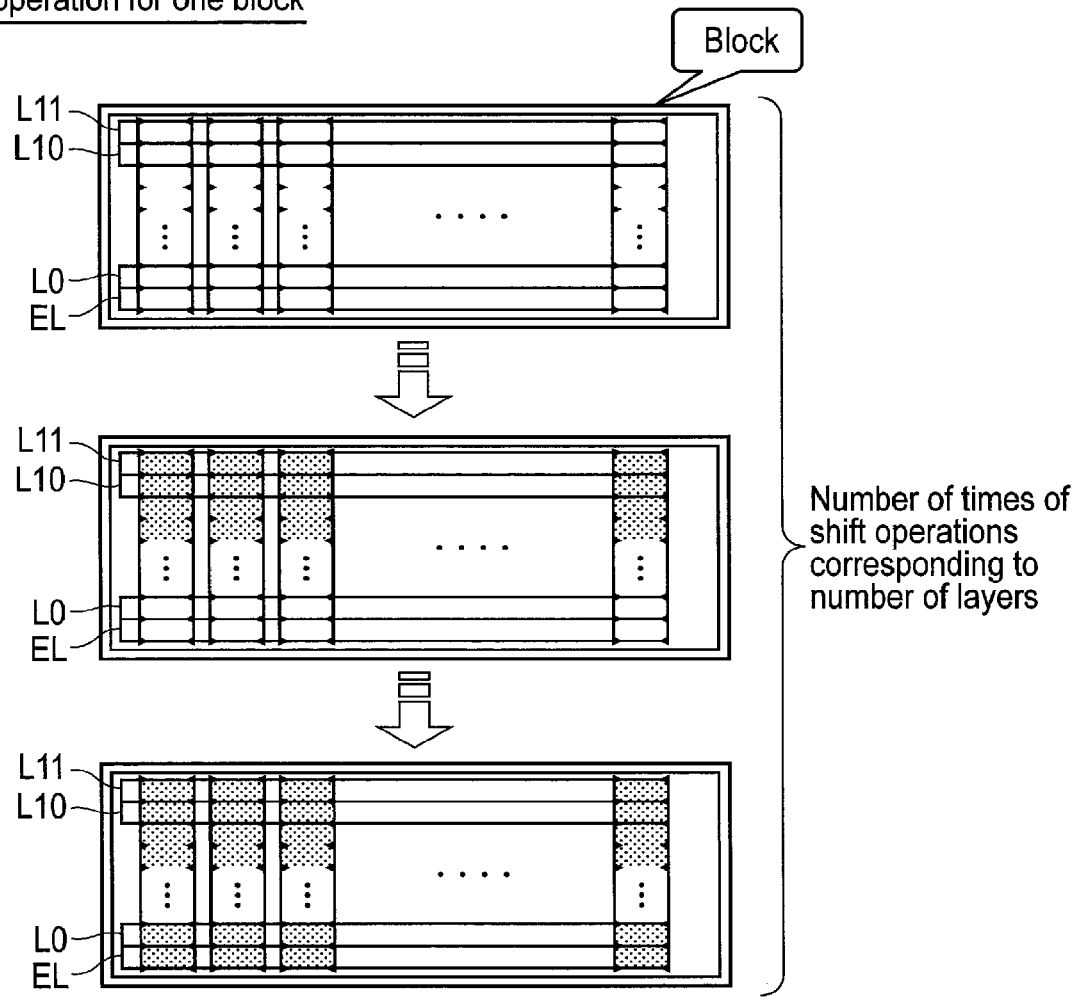
FIG. 6A is a diagram showing an example of the number of shifts in a write operation for a block in the magnetic domain wall shift memory shown in FIG. 4.

FIG. 6A shows the number of shift operations in a write operation for one block. As described above, in the write operation, an operation of shifting the written magnetization direction for each layer in the first direction from the uppermost layer L11 toward the lowermost extended layer EL and writing a magnetization direction indicating data to the uppermost layer L11 (in view of the magnetization direction shifted to the layer L10) is repeated.

To perform a write operation of writing write data of a block size using one free block as a write target block, shift operations corresponding to the number of layers included in the block are required. The block size is a data size corresponding to one block.

Figure 6B:
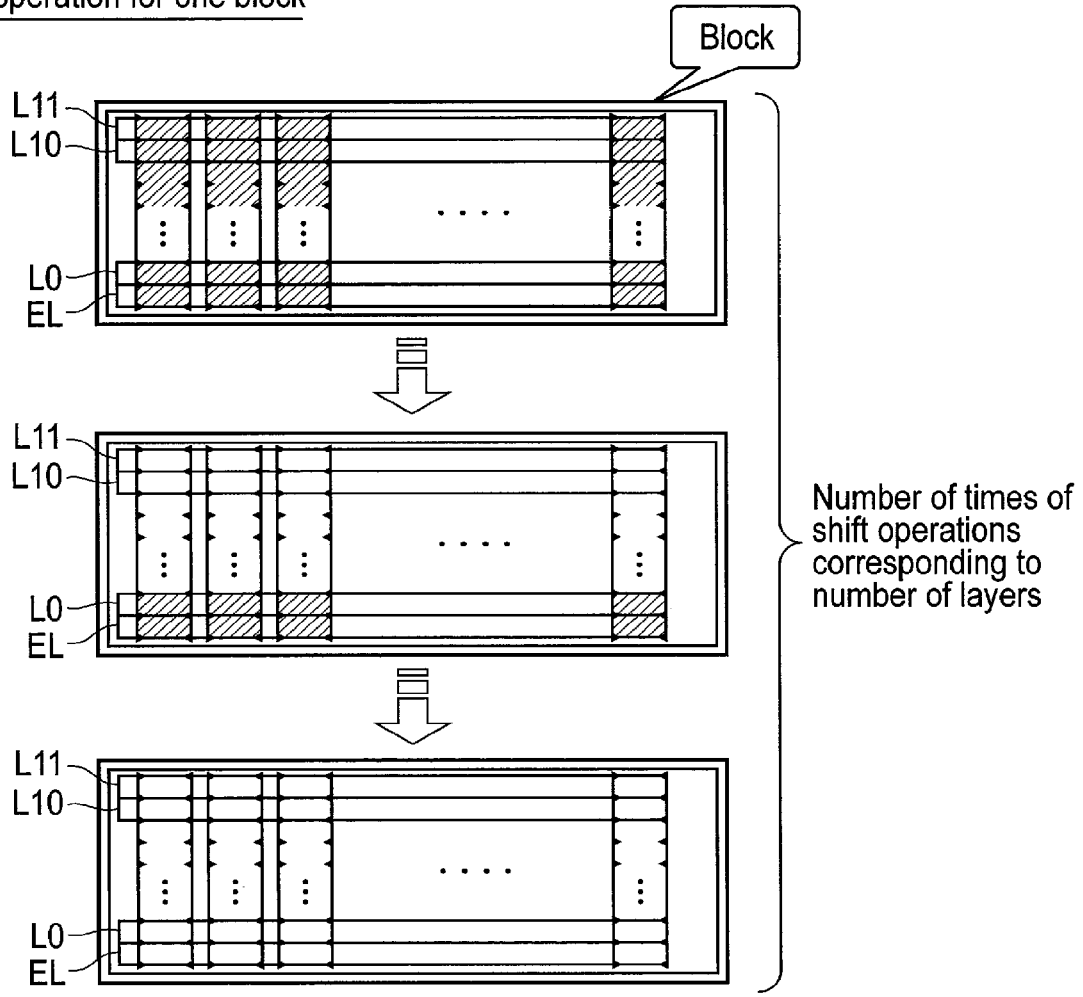
FIG. 6B is a diagram showing an example of the number of shifts in a read operation for a block in the magnetic domain wall shift memory shown in FIG. 4.

FIG. 6B shows the number of shift operations in a read operation for one block. As described above, in the read operation, an operation of reading a magnetization direction from the lowermost extended layer EL and shifting a magnetization direction written to each layer in the first direction, is repeated.

To perform a read operation using one written block as a read target block, shift operations corresponding to the number of layers included in the block are required.

As described above, FIGS. 6A and 6B show an example in which write and read operations are performed independently of each other for one block.

Figure 7:
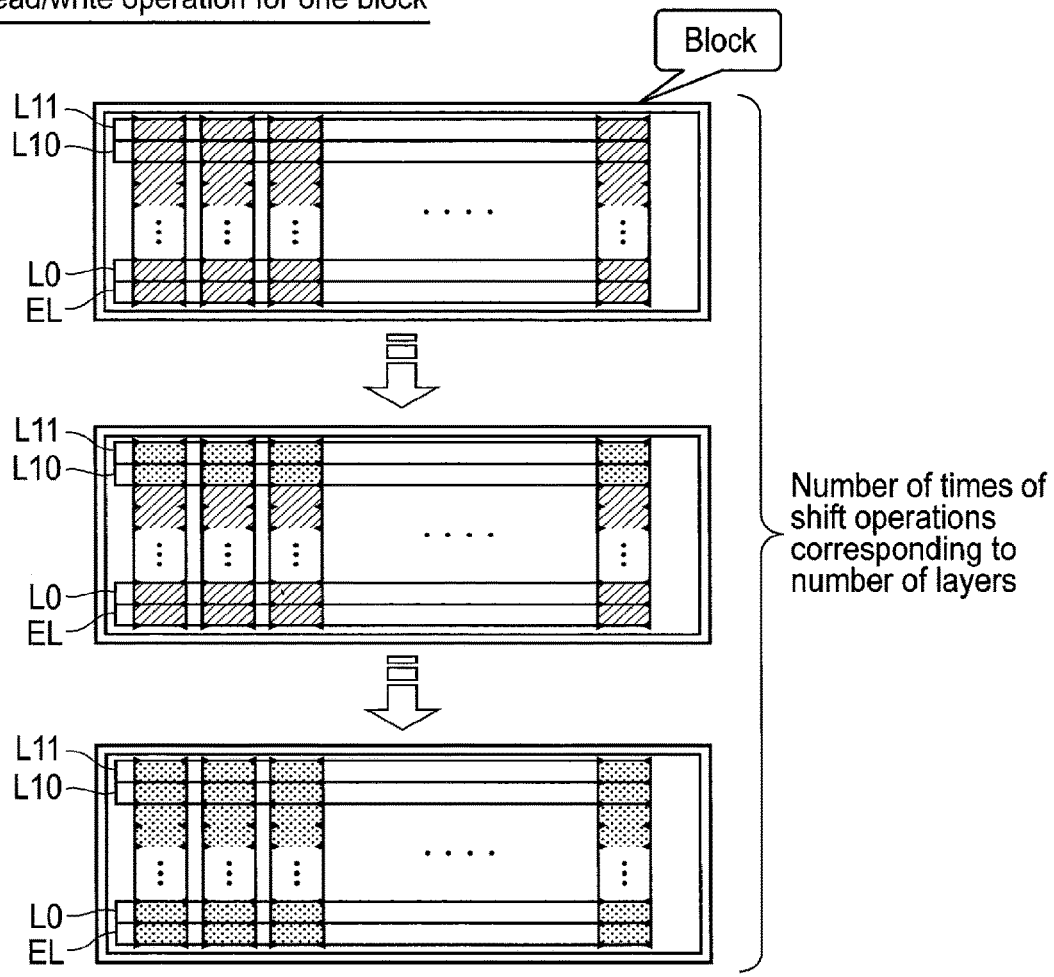
FIG. 7 is a diagram showing an example of a parallel read/write operation for a block in the magnetic domain wall shift memory shown in FIG. 4.

FIG. 7 shows an example of a parallel read/write operation for one block. The parallel read/write operation is an operation in which a read operation and a write operation are performed in parallel for a written block with write data of a block size in preparation.

In the first-in first-out magnetic domain wall shift memory 3, when read is requested using a written block as a read target block, a parallel read/write operation can be performed in which a magnetization direction is read out of the lowermost extended layer EL, a magnetization direction written to each layer is shifted in the first direction, and a magnetization direction for write data is written to the uppermost layer L11. That is, reading of data from a read target block and writing of write data to the read target block can be performed in parallel.

As described above with reference to FIGS. 6A and 6B, in order to perform write and read operations for a block independently of each other, shift operations corresponding to the number of layers in the block are required for each of the write and read operations. In contrast, in the parallel read/write operation, both the read and write operations can be performed during the shift operations corresponding to the number of layers in a block. In the parallel read/write operation, therefore, necessary shift operations can be halved as compared with the case where the write and read operations for a block are performed independently of each other. The parallel read/write operation can thus reduce the exhaustion of the magnetic domain wall shift memory 3 and increase the endurance thereof. In addition, the parallel read/write operation is improved in its access performance because read access and write access are performed in parallel.

Figure 8:
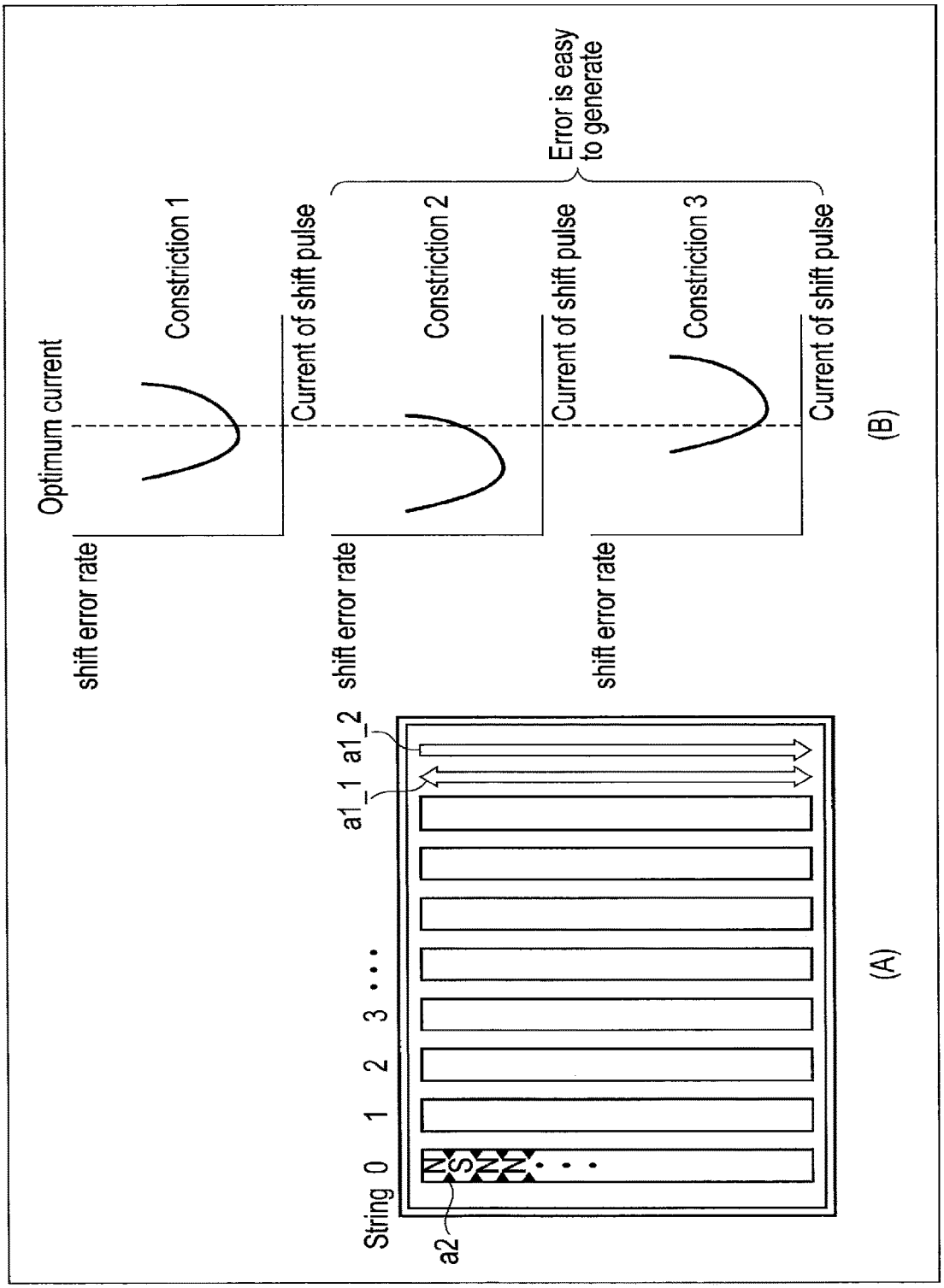
FIG. 8 is an illustration of one of the main factors in a data read error which may be generated in the magnetic domain wall shift memory included in the memory system according to the embodiment.

FIG. 8 is an illustration of one of the main factors in a data read error which may be generated in the magnetic domain wall shift memory 3 including the last-in first-out or first-in first-out cell array configured as described above.

In FIG. 8, (A) shows an example of one of the blocks included in the cell array of the magnetic domain wall shift memory 3. As shown in (A) of FIG. 8, the block includes a plurality of MMLs (strings). As described above, in each of the MMLs, a magnetic domain is shifted for each layer. In the last-in first-out cell array, a magnetic domain is shifted in a first direction from a layer corresponding to a first stage toward a layer corresponding to a last stage (toward a direction from top to bottom in FIG. 8) in a write operation, while it is shifted in a second direction opposite to the first direction (toward a direction from bottom to top in FIG. 8) in a read operation. That is, in a last-in first-out cell array, a magnetic domain is shifted bidirectionally (a1_1). In the first-in first-out cell array, a magnetic domain is shifted in the first direction in both the write and read operations. That is, in the first-in first-out cell array, a magnetic domain is shifted only in a specific direction (a1_2).

In (A) of FIG. 8, symbol a2 denotes a partition between adjacent layers in each MML, which is called a constriction or the like. When a shift pulse is supplied to each MML, the magnetization direction (S or N) of each layer moves beyond the constriction to its adjacent layer in the shift direction. The current value and voltage application time of the shift pulse are set to theoretical values obtained as optimum values to move the magnetization direction between adjacent two layers with a constriction therebetween by, for example, actual measurement and statistical methods.

In actuality, however, the optimum shift pulse to move the magnetization direction varies from constriction to constriction. In FIG. 8, (B) shows an example of variations in optimum shift pulse for each constriction. The "optimum current" in (B) of FIG. 8 is a current value (shift current) set as a shift pulse and obtained as the foregoing theoretical value.

As shown in (B) of FIG. 8, a constriction (constriction 2 and constriction 3) in which the optimum shift pulse greatly deviates from the "optimum current" is likely to generate an error at the time of shifting. The error is that the magnetization direction cannot be moved correctly. For example, when the magnetization direction of a layer of the movement source is N and the magnetization direction of a layer of the movement destination is S, the latter magnetization direction is to be updated from S to N; however, an event that it will be maintained as S is considered. It can be said that an MML having a constriction in which the optimum shift pulse greatly deviates from the "optimum current" is likely to generate a data error in which written data is not correctly read out. In other words, it is likely to generate what is called a data corruption ("1"→"0", "0"→"1"). The tendency of errors generated in the MMLs depends on a constriction in which the optimal shift pulse is farthest from the "optimum current". In other words, it does not depend on data to be written to the MMLs at different times.

One block including a plurality of MMLs includes a plurality of pages each of which can store an ECC frame (data part+error correction code [ECC]). In this case, if a data error in which the number of data corruptions falls within an allowable number is small based on the premise that the data part and ECC are arranged across the MMLs, it can be recovered by hard decision decoding. That is, the data corruption can be restored to its original state.

As a decoding method for recovering a large data error which cannot be recovered by hard decision decoding for a semiconductor memory cell, soft decision decoding is known in which data is read a plurality of times at different read voltages and decoded by repetitive calculation using probability. For example, a table (log likelihood ratio (LLR) table) which retains the likelihood of data that is read out at each of a read voltage with a standard value, one or more read voltages whose value is lower than the standard value and one or more read voltages whose value is higher than the standard value, is prepared to recover a data corruption to its original state using data and its likelihood (and ECC) which are obtained by reading data a plurality of times.

In the magnetic domain wall shift memory 3 in which data read from each MML is destructive read, however, it has been considered that data cannot be read a plurality of times at different read voltages and soft decision decoding cannot be performed. Therefore, the memory system 1 of the present embodiment makes it possible to perform soft decision decoding for data that is read destructively from the magnetic domain wall shift memory 3, which will be described in detail below.

First, with reference to FIGS. 9 through 12, a description will be given of an outline of soft decision decoding which is performed by the memory system 1, which includes the magnetic domain wall shift memory 3 that is a shift register memory as a memory that stores data nonvolatilely, for data destructively read from the magnetic domain wall shift memory 3.

FIG. 9 shows that when a data error is generated at the time of reading data from a certain block and cannot be recovered by hard decision decoding, the memory system 1 writes/reads test data to/from each MML after the data is read by changing the current value or voltage application time of a shift pulse. The test data write/read is performed regardless of the last-in first-out method or the first-in first-out method.

The current value or voltage application time of the shift pulse is changed by transmitting a command to request the system to set the shift pulse and a parameter to specify a voltage value, a current value, voltage application time and the like to the magnetic domain wall shift memory 3. That is, the magnetic domain wall shift memory 3 included in the memory system 1 has a function of setting a voltage value, a current value, and voltage application time, and the like of the shift pulse based on an external command and parameter, that is, a function of allowing the current value or voltage application time of the shift pulse to be varied. An example of the commands and parameters will be described later.

In addition to changing a shift pulse for shifting the information stored in each layer to its adjacent layer, a current pulse (write pulse) for storing information in the uppermost layer may be changed. That is, the magnetic domain wall shift memory 3 included in the memory system 1 may have a function of setting a write pulse based on an external command and parameter, that is, a function of allowing a write pulse to be varied. An example of this command and parameter will be described later.

The test data in the above case preferably has a pattern such as "010101 . . . " which is most likely to generate an error. In FIG. 9, an arrow represented by symbol b1_1 indicates that test data is written to and read from each MML with a shift pulse whose current value is lower than or whose voltage application time is shorter than that at the time of data reading. The arrow represented by symbol b1_2 indicates that test data is written to and read from each MML with a shift pulse whose current value is higher than or whose voltage application time is longer than that at the time of data reading. The memory system 1 may also write and read test data to and from each MML with the same shift pulse as that at the time of data reading. The memory system 1 induces a data error if test data with a pattern that is likely to generate an error is written/read by varying a shift pulse.

Since test data is known data, it can be used as an expected value to be compared with the read test data. As shown in FIG. 10, the memory system 1 performs writing/reading of test data a plurality of times with the foregoing different shift pulses (b1_1, b1_2) to check a tendency of errors generated in each MML, which is due to variations in the optimum shift pulse for each constriction.

In accordance with a result of the above check, the memory system 1 calculates the likelihood (likelihood information) of data read out of each MML, which is to be used in soft decision decoding.

For example, as shown in FIG. 11, when data corruption (c2_1) is generated in test data read out of the MML indicated by symbol c1_1 and data corruption (c2_2) is generated in test data read out of the MML indicated by symbol c1_2, the memory system 1 calculates likelihood information of the data read out of each of the two MMLs such that the likelihood of the data read out of the MMLs becomes low. Assume a first-in first-out MML in FIG. 11. The data corruptions (c2_1, c2_2) are generated in the two MMLs by one of the test data write/read operations with different shift pulses (b_1, b_2). It is also conceivable that two or more data corruptions are generated in one MML when test data is written/read a plurality of times with different shift pulses.

Then, the memory system 1 uses the likelihood information (and ECC) of data read out of the MMLs and so calculated to perform soft decision decoding for data which is read out of a page including the MMLs and which causes a large data error which cannot be recovered by hard decision decoding.

FIG. 12 is a flowchart showing a rough procedure for performing soft decision decoding for data that is destructively read out of the magnetic domain wall shift memory 3 by the memory system 1. This flowchart is directed to a process in which a data error is generated in data that is read out of a certain block including a page to be read and cannot be recovered by hard decision decoding.

The memory system 1 destructively reads data from an MML in its corresponding block to be read (S101). When a data error, which cannot be recovered by hard decision decoding using an ECC, is generated, the memory system 1 writes test data to each MML after the data is destructively read (S102), and reads the written test data (S103). Then, the memory system 1 compares test data obtained through the write and read with an expected value (original test data) (S103).

It is preferable that the test data be written/read (the test data be compared with an expected value) a plurality of times including a case of using a shift pulse whose current value is lower than or whose voltage application time is shorter than that at the time of data reading and a case of using a shift pulse whose current value is higher than or whose voltage application time is longer than that at the time of data reading. That is, it is preferable to repeat steps S102 to S104 a plurality of times.

Based on a result of the comparison in step S104, the memory system 1 calculates likelihood information (LLR) of data to be read destructively from each MML to/from which test data has been written/read (S105). The memory system 1 uses the calculated likelihood information to perform soft decision decoding for the data read destructively in S101 (S106).

On the basis of the outline described above, the soft decision decoding for data read destructively from the magnetic domain wall shift memory 3, which is performed by the memory system 1, will be described in detail in several cases.

<Last-In First-Out Magnetic Domain Wall Shift Memory 3>

FIG. 13 is a block diagram showing an exemplary configuration of soft decision decoding of the memory system 1.

As has been described with reference to FIG. 1, the memory system 1 includes the memory controller 2 and magnetic domain wall shift memory 3. The memory controller 2 includes the host interface 21, memory interface 22, controller 23, encoder/decoder 24, data buffer 25, SRAM 28, and the like. The encoder/decoder 24 includes the encoder 26 and decoder 27. The data buffer 25 includes the write buffer 25W and read buffer 25R.

In the memory controller 2, the controller 23 includes a writer 231, a reader 232, a test data storage module 233, a test data write/read controller 234, a comparison module 235, and a likelihood determination module 236 as a configuration related to soft decision decoding. The decoder 27 includes an error correction module 271.

The writer 231 writes write data stored in the write buffer 25W to the magnetic domain wall shift memory 3 via the memory interface 22 based on a write instruction received from the host 4 via the host interface 21. The writer 231 also writes test data, which is stored in the write buffer 25W by the test data write/read controller 234, to the magnetic domain wall shift memory 3 via the memory interface 22 based on an instruction from the test data write/read controller 234.

Based on a read instruction from the host 4 received via the host interface 21, the reader 232 reads data (user data) from the magnetic domain wall shift memory 3 via the memory interface 22 and stores the data in the read buffer 25R. Based on an instruction from the test data write/read controller 234, the reader 232 reads data (test data) from the magnetic domain wall shift memory 3 via the memory interface 22 and stores the data in the read buffer 25R.

The test data storage module 233 stores test data which is written to the magnetic domain wall shift memory 3 and read therefrom under the control of the test data write/read controller 234. The test data storage module 233 stores test data, for example, by loading the test data nonvolatilely stored in the magnetic domain wall shift memory 3 into the SRAM 28 in the memory controller 2 when the memory system 1 is powered on.

Upon receiving from the error correction module 271 of the decoder 27 a notification that the memory system 1 has failed in hard decision decoding, the test data write/read controller 234 writes the test data stored in the test data storage module 233 to the magnetic domain wall shift memory 3 and reads the test data from the magnetic domain wall shift memory 3. Specifically, first, the test data write/read controller 234 stores the test data stored in the test data storage module 233 in the write buffer 25W, and writes the test data to the magnetic domain wall shift memory 3, which is targeted for the MML from which the data which failed in hard decision decoding is read. Second, the test data write/read controller 234 reads the written test data from the magnetic domain wall shift memory 3. The test data read from the magnetic domain wall shift memory 3 is stored in the read buffer 25R. The test data write/read controller 234 writes the test data to the magnetic domain wall shift memory 3 and reads it therefrom a plurality of times by varying a shift pulse.

Upon receiving a notification from the test data write/read controller 234, the comparison module 235 compares the test data stored in the read buffer 25R, written to the magnetic domain wall shift memory 3 and read therefrom with the test data stored in the test data stored in the test data storage module 233. The comparison module 235 notifies the likelihood determination module 236 of a result of the comparison.

The likelihood determination module 236 calculates likelihood information of data read from each MML to be tested based on the comparison result of which it is notified from the comparison module 235. The error correction module 271 of the decoder 27 performs soft decision decoding for data which has failed in hard decision decoding, using the likelihood information (and ECC) calculated by the likelihood determination module 236.

FIG. 14 is a schematic diagram showing a read-mode operation of the magnetic domain wall shift memory 3. Though a number of blocks can be included in the cell array of the magnetic domain wall shift memory 3, FIG. 14 shows four MMLs 50_1 to 50_4 included in one block. The rectangles shown below each of the MMLs 50_1 to 50_4 correspond to sense latches in the output unit group 44. Each sense latch temporarily retains a result of reading from its corresponding MML. For simplicity of description, it is assumed here that each of the MMLs 50_1 to 50_4 can store 11-bit data and includes 12 (11+1) layers.

Also, it is here assumed that the layer of each of the MMLs 50_1 to 50_4 stores information indicative of "1" or "0" as an initial state. That is, each of the MMLs 50_1 to 50_4 stores 12 items of the information. Symbols R0 to R11 are expressed so as to be able to recognize how the 12 information items to be read shift in each of the MMLs 50_1 to 50_4. In the 12 information items in each of the MMLs 50_1 to 50_4, for example, information item R0 and information item R1 indicate data of the first bit, and information item R10 and information item R11 indicate data of the last 11th bit.

In FIG. 14, symbol 60_1 denotes a shift pulse (first shift pulse) supplied to each of the MMLs 50_1 to 50_4 in order to read information out of the MML. Symbol d1_1 denotes a current value of the first shift pulse 60_1.

When first data read is performed by supplying the first shift pulse 60_1 to each of the MMLs 50_1 to 50_4, information item R11 is read out of the uppermost layer in each of the MMLs 50_1 to 50_4 using the last-in first-out method, and information items R10 to R0 stored in the layers below the uppermost layer are each shifted toward the uppermost layer. After that, information items R10 to R0 are read out in sequence while the first shift pulse 60_1 is supplied to each of the MMLs 50_1 to 50_4. When last-but-one data read is performed, information item R0 stored in the lowermost layer in the initial state is shifted to the uppermost layer, and information item R0 shifted from the lowermost layer to the uppermost layer is read by last data read. That is, reading of 11-bit data indicated by information items R0 to R11 is completed. The memory system 1 performs hard decision decoding using an ECC for data read out of each of the MMLs 50_1 to 50_4.

An operation of the magnetic domain wall shift memory 3, which is performed during the write/read of test data when the memory system 1 has failed in hard decision decoding, will be described with reference to FIGS. 15 to 20. Assume here that the test data writing/reading is repeated three times using the foregoing first shift pulse 60_1, a second shift pulse 60_2 whose current value is lower than that of the first shift pulse 60_1, and a third shift pulse 60_3 whose current value is higher than that of the first shift pulse 60_1. The number of times of test data writing/reading is not limited to three, and an optional number of times can be used. The second shift pulse 60_2 and the third shift pulse 60_3 may vary in its voltage application time instead of varying in the current value. In addition, it is assumed here that the test data writing/reading is performed in the order of the first shift pulse 60_1, second shift pulse 60_2 and third shift pulse 60_3 so described, but the test data writing/reading is not limited to this order but may be performed in any order.

Figure 15:
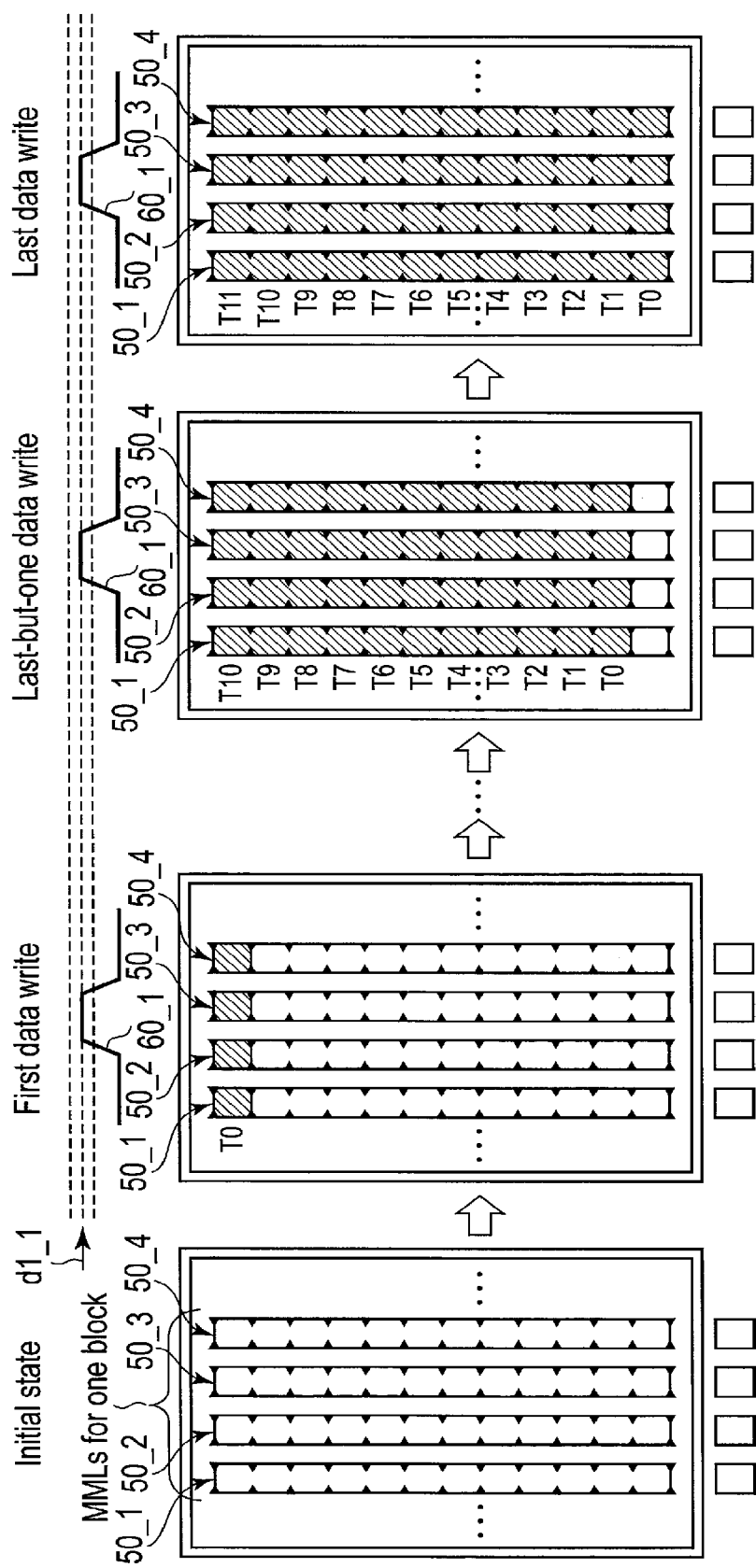
FIG. 15 is a diagram showing an operation of the magnetic domain wall shift memory which is performed when test data is written by a first shift pulse of the memory system according to the embodiment.

FIG. 15 shows an operation of the magnetic domain wall shift memory 3 which is performed when test data is written by the first shift pulse 60_1. Symbols T0 to T11 are expressed so as to be able to recognize how each information item indicating test data to be read shifts in each of the MMLs 50_1 to 50_4.

The initial state shown in FIG. 15 is the state of each of the MMLs 50_1 to 50_4 from which information items R0 to R11 are read. The memory system 1 stores test data, which is to be stored in the test data storage module 233, in the write buffer 25W (test pattern generation) to start to write test data to each of the MMLs 50_1 to 50_4 by the first shift pulse 60_1.

When first data write of test data to each of the MMLs 50_1 to 50_4 in the initial state shown in FIG. 15 is performed by the first shift pulse 60_1, the initial information item T0 is stored in the uppermost layer. After that, information items T1 to T11 are written in sequence while the first shift pulse 60_1 is supplied to each of the MMLs 50_1 to 50_4. At this time, information stored in each layer is shifted to the next lower layer, and information to be written is stored in the uppermost layer. When last-but-one data write is performed, information item T0 stored in the uppermost layer by the first data write is shifted to the next upper layer of the lowermost layer, and information items T1 to T10 subsequent to information item T0 are stored in each layer continuously in the upward direction from the layer storing information item T0. Then, information items T0 to T11 indicating test data are stored in all layers of each of the MMLs 50_1 to 50_4 by the last data write.

FIG. 16 shows an operation of the magnetic domain wall shift memory 3 which is performed when test data is read by the first shift pulse.

The initial state shown in FIG. 16 is the state of each of the MMLs 50_1 to 50_4 to which information items T0 to T11 indicative of test data are written by the first shift pulse.

When first data read is performed by supplying the first shift pulse 60_1 to each of the MMLs 50_1 to 50_4, information item T11 is read out of the uppermost layer in each of the MMLs 50_1 to 50_4 using the last-in first-out method, and information items T10 to T0 stored in the layers below the uppermost layer are each shifted toward the uppermost layer. After that, information items T10 to T0 are read out in sequence while the first shift pulse 60_1 is supplied to each of the MMLs 50_1 to 50_4. When last-but-one data read is performed, information item T0 stored in the lowermost layer in the initial state is shifted to the uppermost layer, and information item T0 shifted from the lowermost layer to the uppermost layer is read by the last data read. That is, reading of test data indicated by information items T0 to T11 is completed. Since the test data is known data, the memory system 1 can compare the test data read out of each of the MMLs 50_1 to 50_4 with an expected value (original test data). Based on this comparison, the memory system 1 detects a defective MML.

Figure 17:
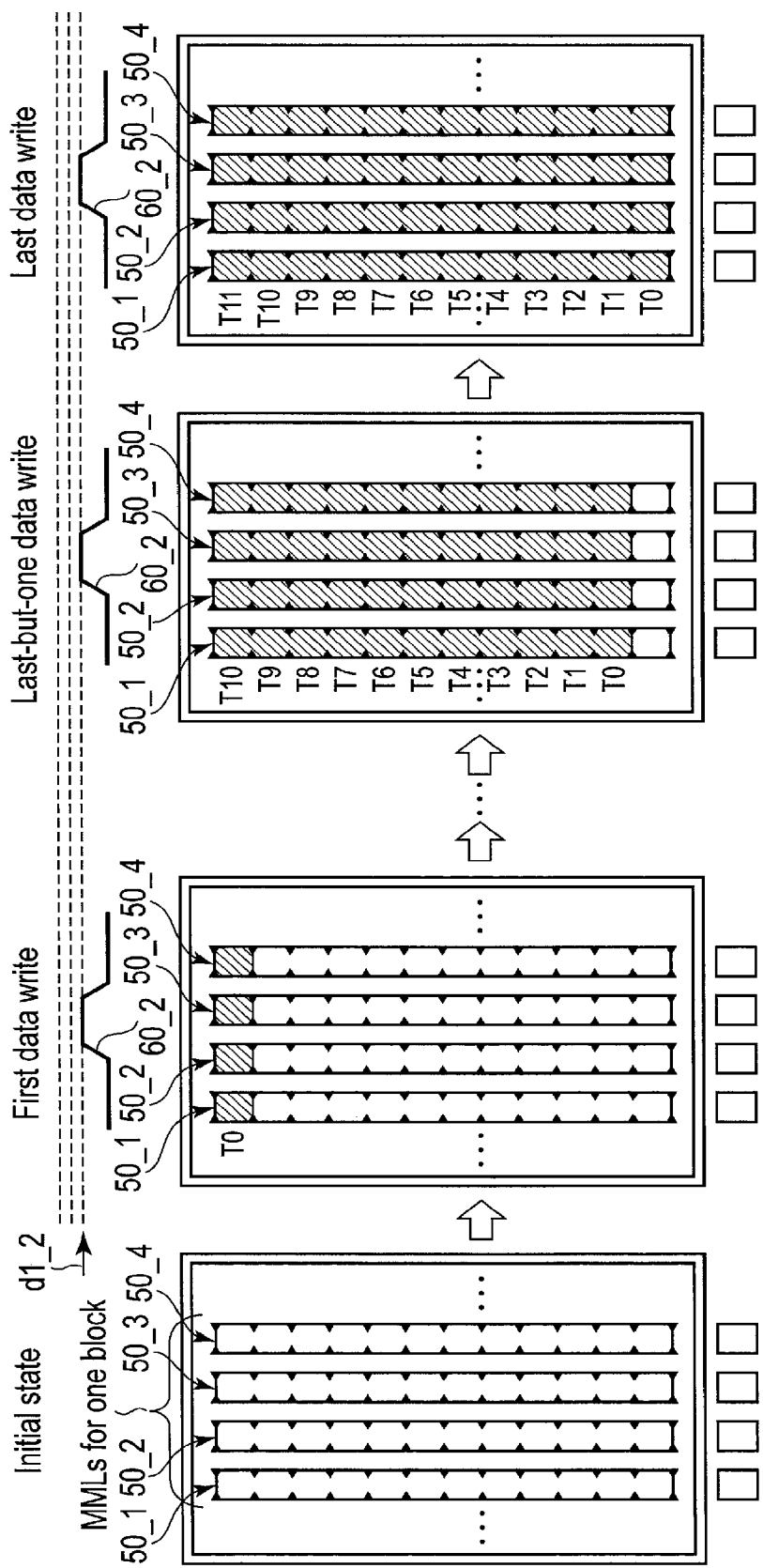
FIG. 17 is a diagram showing an operation of the magnetic domain wall shift memory which is performed when test data is written by a second shift pulse of the memory system according to the embodiment.

FIG. 17 shows an operation of the magnetic domain wall shift memory 3 which is performed when test data is written by the second shift pulse 60_2. In FIG. 17, symbol d1_2 indicates a current value of the second shift pulse 60_2. Symbol d1_2 indicates that the current value of the second shift pulse 60_2 is lower than that of the first shift pulse 60_1. As described above, the voltage application time of the second shift pulse 60_2 may be shortened, instead of making the current value of the second shift pulse 60_2 lower than that of the first shift pulse 60_1.

The initial state shown in FIG. 17 is the state of each of the MMLs 50_1 to 50_4 from which information items T0 to T11 are read by the first shift pulse 60_1. The memory system 1 stores test data, which is stored in the test data storage module 233, in the write buffer 25W (test pattern generation) to start to write the test data to each of the MMLs 50_1 to 50_4 by the second shift pulse 60_2. As the test data, the test data used in the write/read by the first shift pulse 60_1 may be used.

When first data write of test data to each of the MMLs 50_1 to 50_4 in the initial state shown in FIG. 17 is performed by the second shift pulse 60_2, the initial information item T0 is stored in the uppermost layer. After that, information items T1 to T11 are written in sequence while the second shift pulse 60_2 is supplied to each of the MMLs 50_1 to 50_4. At this time, information stored in each layer is shifted to the next lower layer, and information to be written is stored in the uppermost layer. When last-but-one data write is performed, information item T0 stored in the uppermost layer by the first data write is shifted to the next upper layer of the lowermost layer, and information items T1 to T10 subsequent to information item T0 are stored in each layer continuously in the upward direction from the layer storing information item T0. Then, information items T0 to T11 indicating test data are stored in all layers of each of the MMLs 50_1 to 50_4 by the last data write.

Figure 18:
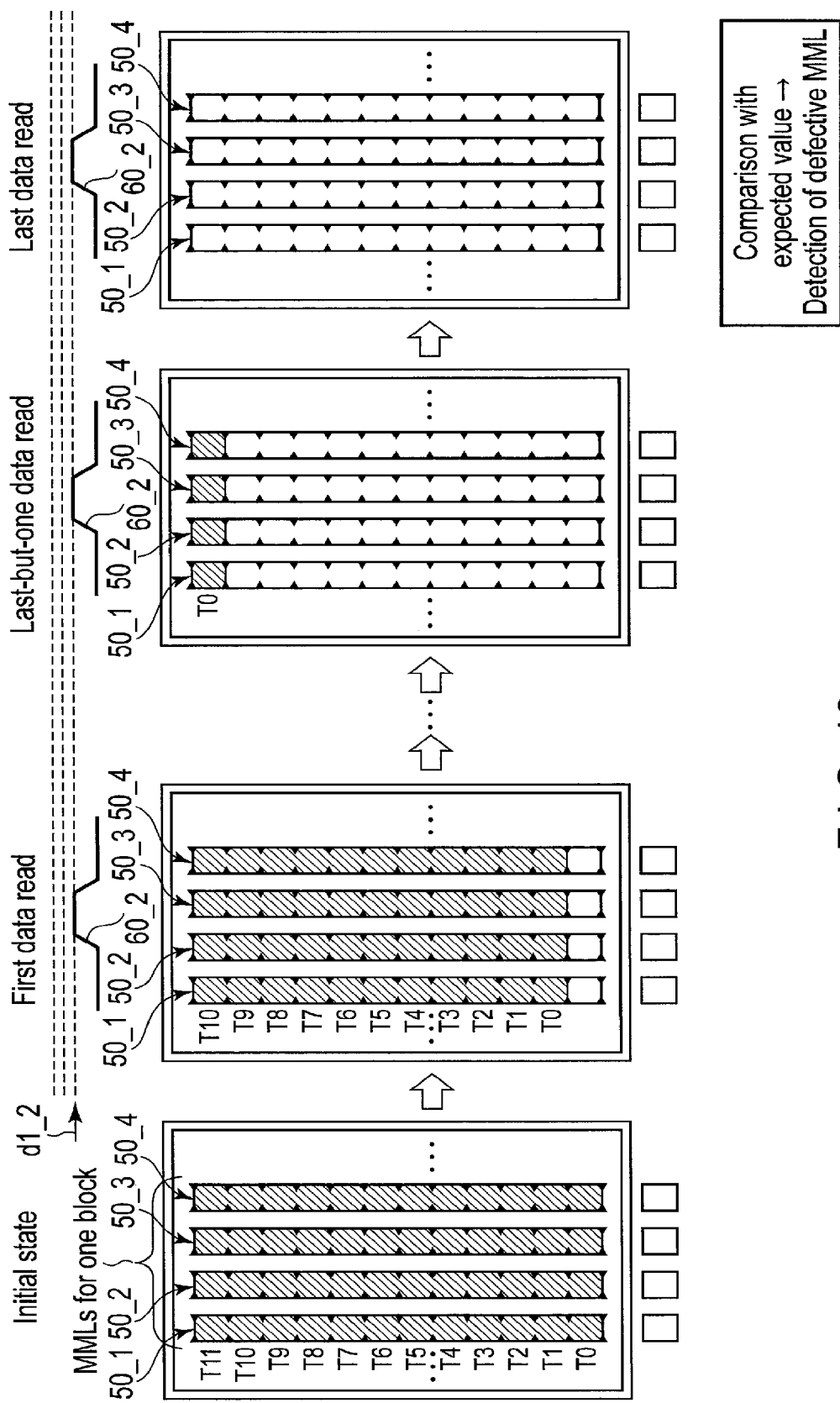
FIG. 18 is a diagram showing an operation of the magnetic domain wall shift memory which is performed when test data is read by the second shift pulse of the memory system according to the embodiment.

FIG. 18 shows an operation of the magnetic domain wall shift memory 3 which is performed when test data is read by the second shift pulse.

The initial state shown in FIG. 18 is the state of each of the MMLs 50_1 to 50_4 to which information items T0 to T11 indicative of test data are written by the second shift pulse.

When first data read is performed by supplying the second shift pulse 60_2 to each of the MMLs 50_1 to 50_4, information item T11 is read out of the uppermost layer in each of the MMLs 50_1 to 50_4 using the last-in first-out method, and information items T10 to T0 stored in the layers below the uppermost layer are each shifted toward the uppermost layer. After that, information items T10 to T0 are read out in sequence while the second shift pulse 60_2 is supplied to each of the MMLs 50_1 to 50_4. When last-but-one data read is performed, information item T0 stored in the lowermost layer in the initial state is shifted to the uppermost layer, and information item T0 shifted from the lowermost layer to the uppermost layer is read by the last data read. That is, reading of test data indicated by information items T0 to T11 is completed. Since the test data is known data, the memory system 1 can compare the test data read out of each of the MMLs 50_1 to 50_4 with an expected value (original test data). Based on this comparison, the memory system 1 detects a defective MML.

FIG. 19 shows an operation of the magnetic domain wall shift memory 3 which is performed when test data is written by the third shift pulse 60_3. In FIG. 19, symbol d1_3 indicates a current value of the third shift pulse 60_3. Symbol d1_3 indicates that the current value of the third shift pulse 60_3 is higher than that of the first shift pulse 60_1. As described above, the voltage application time of the third shift pulse 60_3 may be lengthened, instead of making the current value of the third shift pulse 60_3 higher than that of the first shift pulse 60_1.

The initial state shown in FIG. 19 is the state of each of the MMLs 50_1 to 50_4 from which information items T0 to T11 are read by the second shift pulse 60_2. The memory system 1 stores test data, which is stored in the test data storage module 233, in the write buffer 25W (test pattern generation) to start to write the test data to each of the MMLs 50_1 to 50_4 by the third shift pulse 60_3. Like in the case of writing by the second shift pulse 60_1, as the above test data, the test data used in the write/read by the first shift pulse 60_1 may be used.

When first data write of test data to each of the MMLs 50_1 to 50_4 in the initial state shown in FIG. 19 is performed by the third shift pulse 60_3, the initial information item T0 is stored in the uppermost layer. After that, information items T1 to T11 are written in sequence while the third shift pulse 60_2 is supplied to each of the MMLs 50_1 to 50_4. At this time, information stored in each layer is shifted to the next lower layer, and information to be written is stored in the uppermost layer. When last-but-one data write is performed, information item T0 stored in the uppermost layer by the first data write is shifted to the next upper layer of the lowermost layer, and information items T1 to T10 subsequent to information item T0 are stored in each layer continuously in the upward direction from the layer storing information item T0. Then, information items T0 to T11 indicating test data are stored in all layers of each of the MMLs 50_1 to 50_4 by the last data write.

Figure 20:
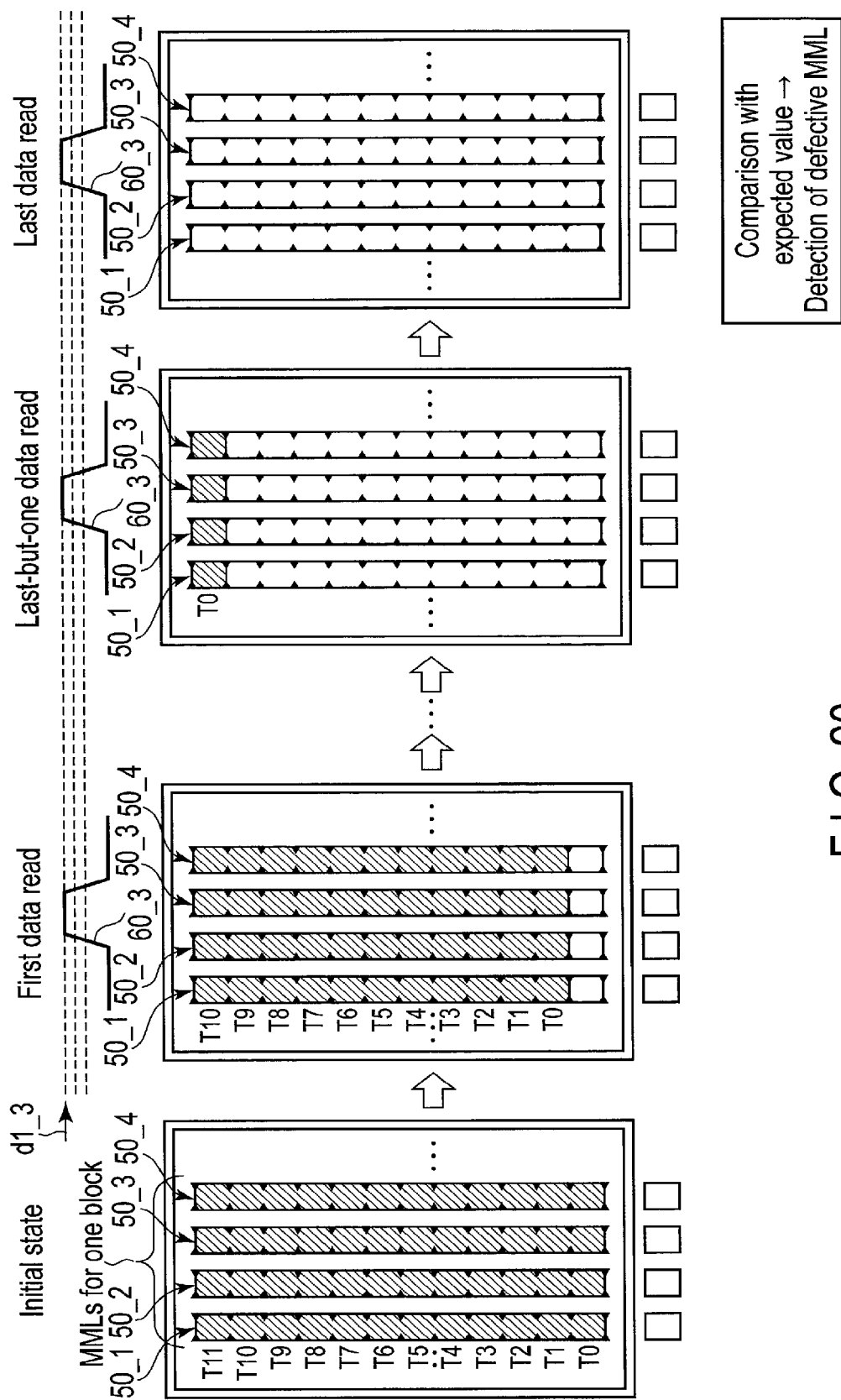
FIG. 20 is a diagram showing an operation of the magnetic domain wall shift memory which is performed when test data is read by the third shift pulse of the memory system according to the embodiment.

FIG. 20 shows an operation of the magnetic domain wall shift memory 3 which is performed when test data is read by the third shift pulse.

The initial state shown in FIG. 20 is the state of each of the MMLs 50_1 to 50_4 to which information items T0 to T11 indicative of test data are written by the third shift pulse.

When first data read is performed by supplying the third shift pulse 60_3 to each of the MMLs 50_1 to 50_4, information item T11 is read out of the uppermost layer in each of the MMLs 50_1 to 50_4 using the last-in first-out method, and information items T10 to T0 stored in the layers below the uppermost layer are each shifted toward the uppermost layer. After that, information items T10 to T0 are read out in sequence while the second shift pulse 60_2 is supplied to each of the MMLs 50_1 to 50_4. When last-but-one data read is performed, information item T0 stored in the lowermost layer in the initial state is shifted to the uppermost layer, and information item T0 shifted from the lowermost layer to the uppermost layer is read by the last data read. That is, reading of test data indicated by information items T0 to T11 is completed. Since the test data is known data, the memory system 1 can compare the test data read out of each of the MMLs 50_1 to 50_4 with an expected value (original test data). Based on this comparison, the memory system 1 detects a defective MML.

FIG. 21 is a diagram illustrating calculation of likelihood information of data read from an MML, which is performed by detecting an error by writing/reading test data using the first shift pulse, second shift pulse and third shift pulse in the memory system 1. The error here means that the test data obtained through writing/reading does not coincide with an expected value (original test data). That is, the detection of an error is the detection of a defective MML.

FIG. 21 shows an example of arrangement of data items to be subjected to soft-decision decoding on a plurality of MMLs (strings) in the area indicated by symbol e1. Assume that the data items are arranged over the MMLs and in different layers. In the area indicated by symbol e2_1, test data is written/read by the first shift pulse. Similarly, in the area indicated by symbol e2_2, test data is written/read by the second shift pulse, and in the area indicated by symbol e2_3, test data is written/read by the third shift pulse. In FIG. 21, the write/read of test data by the first shift pulse is represented as "normal write & normal read (normal W/R)", the write/read of test data by the second shift pulse is represented as "weak write & weak read (weak W/R)" and the write/read of test data by the third shift pulse is represented as "strong write & strong read (strong W/R)".

FIG. 21 also shows an example of an LLR table 70 used by the memory system 1. The LLR table 70 retains the likelihood of data read from an MLL for each error detection state in the MLL and retains information for the likelihood determination module 236 to calculate likelihood information of the data read from the MLL. FIG. 21 also shows a likelihood information calculation table 80 for convenience in order to explain the calculation of likelihood information performed by the memory system 1. The LLR table 70 is, for example, loaded from the magnetic domain wall shift memory 3 into the SRAM 28 in the memory controller 2 when the memory system 1 is powered on.

The six curves on the LLR table 70 shown in FIG. 21 indicate the following for each of the positions of layers in an MML: (1) the likelihood of data "1" read from an MML in which no error is detected [LLR(1) NORMAL]; (2) the likelihood of data "0" read from an MML in which no error is detected [LLR(0) NORMAL]; (3) the likelihood of data "1" read from an MML in which an error is detected in test data written/read by the second shift pulse [LLR(1) n1 fail]; (4) the likelihood of data "0" read from an MML in which an error is detected in test data written/read by the second shift pulse [LLR(0) n1 fail]; (5) the likelihood of data "1" read from an MML in which an error is detected in test data written/read by the third shift pulse [LLR(1) n0 fail]; and (6) the likelihood of data "0" read from an MML in which an error is detected in test data written/read by the third shift pulse [LLR(0) n0 fail]. The numerical value of each position indicates data represented by information stored in a lower layer as the value is larger.

The likelihood in the LLR table 70 is represented by a positive value for data "1" and a negative value for data "0". The larger the absolute value, the higher the probability that the data is correct. When an error is detected in both test data written/read by the second shift pulse and test data written/read by the third shift pulse, for example, the latter curves (LLR(1) n0 fail, LLR(0) n0 fail) indicating a low likelihood is applied. When no error is detected in test data written/read by the first shift pulse, for example, the curves (LLR(1) NORMAL, LLR(0) NORMAL) indicating the likelihood of data read from an MML in which no error is detected is applied, even though an error is detected in one or both of test data written/read by the second shift pulse and test data written/read by the third shift pulse.

In the case of the last-in first-out MML, for example, data indicated by information stored in the lowermost layer and information stored in the next higher layer is shifted from the uppermost layer through a number of layers during writing, and it is shifted to the uppermost layer through a number of layers during reading. The larger the number of shifts, the lower the likelihood of data read out of the MML. Thus, the absolute value of the likelihood of each of the six curves on the LLR table 70 decreases with increase of the numerical value of the position.

Assume here that the likelihood information calculation table 80 shown in FIG. 21 is obtained as a result of writing/reading of test data by the first shift pulse, writing/reading of test data by the second shift pulse and writing/reading of test data by the third shift pulse. Also, assume that the likelihood information calculation table 80 includes a "data" field 81, a "position" field 82, a "strong W/R" field 83, a "weak W/R" field 84, a "normal W/R" field 85, a "string" field 86, and an "LLR" field 87.

The "data" field 81 records data read from the MML. The "position" field 82 records a position in the MML where information indicating the read data is stored. The "strong W/R" field 83 records the presence or absence of an error in test data written/read by the third shift pulse. The "weak W/R" field 83 records the presence or absence of an error in test data written/read by the second shift pulse. The "normal W/R" field 84 records the presence or absence of an error in test data written/read by the first shift pulse. The "string" field 86 records identification information of the MML. The "LLR" field 87 records the calculated likelihood information.

For example, the likelihood of data "0" read from position 1 of string 0 is calculated as −85 (V5) [LLR(0) n0 fail] because an error is detected in test data of string 0 written/read by the third shift pulse. The likelihood of data "1" read from position 2 of string 1 is calculated as 95 (V1) [LLR(1) n0 fail] because an error is detected in test data of string 1 written/read by the third shift pulse. Furthermore, the likelihood of data "0" read from position 3 of string 2 is calculated as −73 (V4) [LLR (0) n1 fail] because an error is detected in test data of string 2 written/read by the second shift pulse.

Similarly, the likelihood of data "1" read from position 9 of string 8 is calculated as 32 (V2) [LLR(1) n1 fail] because an error is detected in test data of string 8 written/read by the second shift pulse. The likelihood of data "0" read from position 10 of string 9 is calculated as −41 (V3) [LLR(0) NORMAL] because no error is detected in test data of string 9.

The memory system 1 performs soft decision decoding for data read out of an MLL using the likelihood information (and ECC) thus calculated.

Figure 22:
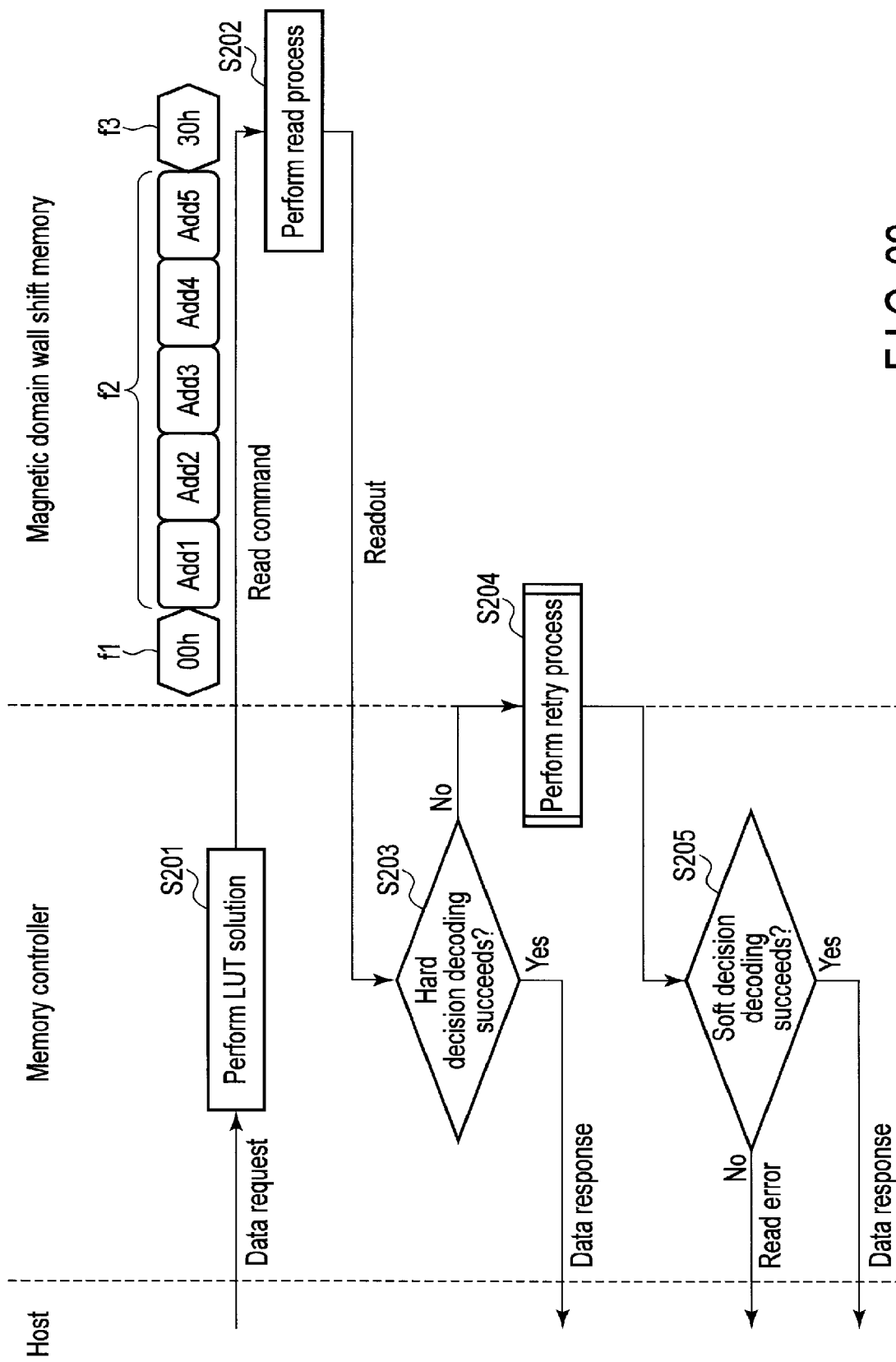
FIG. 22 is a flowchart showing an example of a procedure for a read process to be performed by the memory system according to the embodiment.

FIG. 22 is a flowchart showing an example of a procedure for a read process to be performed by the memory system 1.

Upon receiving a data request (read request) from the host 4, for example, the memory controller 2 in the memory system 1 performs an LUT solution to convert a logical address specified by the host 4 into a physical address (S201). The memory controller 2 issues a read command, which specifies the physical address obtained by the LUT solution, to the magnetic domain wall shift memory 3. FIG. 22 shows an example of a format of the read command issued to the magnetic domain wall shift memory 3 by the memory controller 2 (f1 to f3).

"00h" indicated by symbol f1 is a command corresponding to a declaration that an address for read is input. Then, an address is input in a predetermined number of cycles (the number is 5 here) (f2). "30h" indicated by symbol f3 is a read execution command. When the magnetic domain wall shift memory 3 receives the command "00h" and the address in a predetermined number of cycles to determine a target to be read, and then receives the command "30h", it performs a read process (S202). The magnetic domain wall shift memory 3 transmits the data read in the read process to the memory controller 2.

Upon receiving data from the magnetic domain wall shift memory 3, the memory controller 2 performs hard decision decoding to detect and correct an error that may be included in the data (S203). If the memory controller 2 succeeds in the hard decision decoding (Yes in S203), it transmits the data received from the magnetic domain wall shift memory 3 or the corrected data to the host 4.

Figure 24:
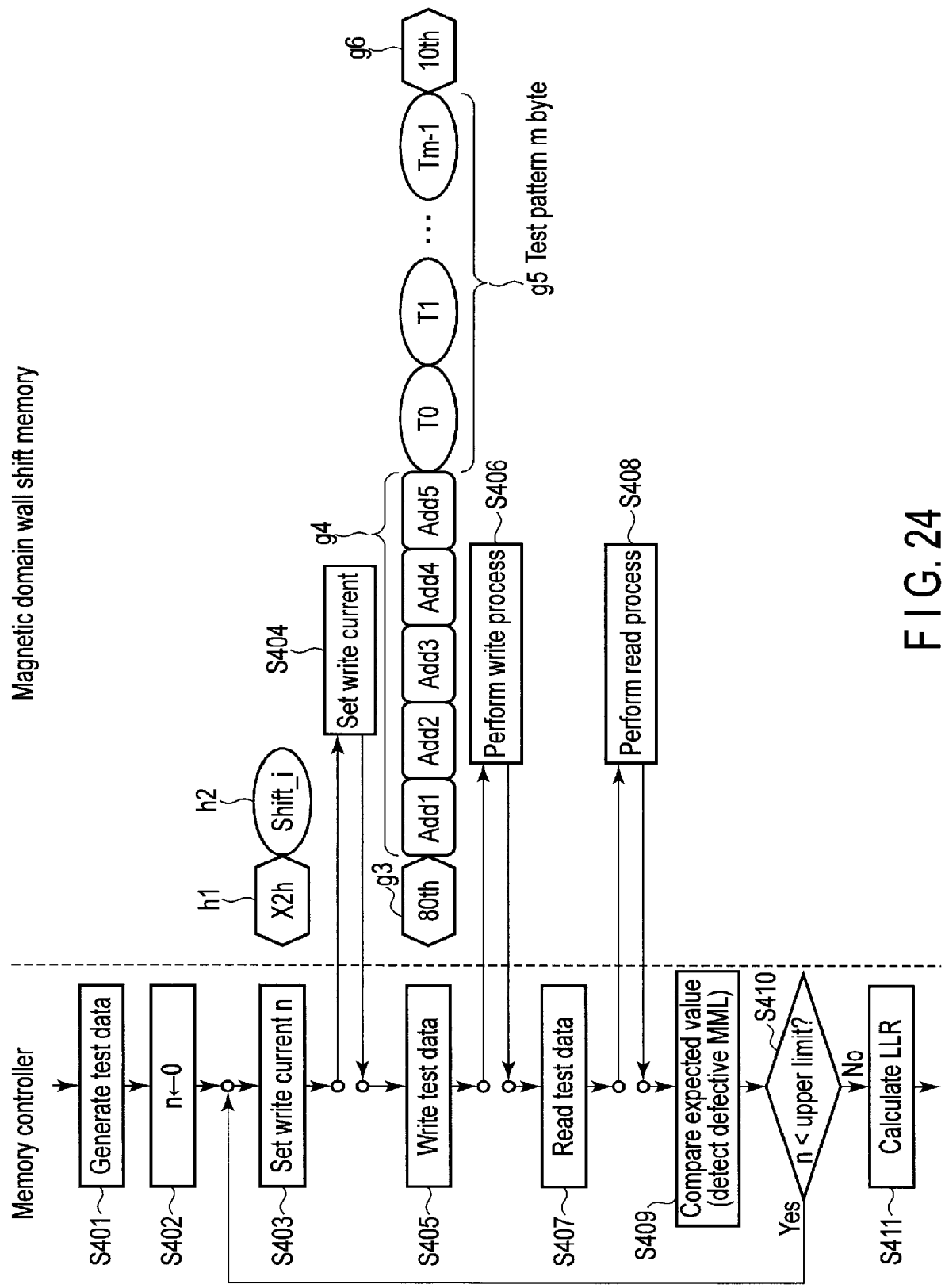
FIG. 24 is a flowchart showing another example (second pattern) of a procedure for the retry process to be performed by the memory system according to the embodiment.

If the memory controller 2 fails in the hard decision decoding (No in S203), it performs a retry process to obtain likelihood information necessary for soft decision decoding, the procedure for which is shown in FIG. 23 (first pattern) and FIG. 24 (second pattern), in cooperation with the magnetic domain wall shift memory 3 (S204). The memory controller 2 uses the likelihood information obtained in the retry process to perform soft decision decoding for the data that has failed in hard decision decoding (S205). When the memory controller 2 succeeds in the soft decision decoding (Yes in S205), it transmits the data corrected by the soft decision decoding to the host 4, and when the controller 2 fails in the soft decision decoding (No in S205), it notifies the host 4 of a read error.

FIG. 23 is a flowchart showing an example (first pattern) of a procedure for a retry process (S204 in FIG. 22) to be performed by the memory system 1.

The memory controller 2 first generates test data (S301). The generation of test data is, for example, to store test data in the write buffer 25W from the test data storage module 233.

Assume here that test data is written/read a predetermined number of times by varying the current value of a shift pulse. Also, assume that a predetermined number of current values are predetermined to set different current values (shift current 0, shift current 1, . . . ). When the memory controller 2 starts to write/read test data, it initializes the value of a counter for selecting the current values one by one from among the predetermined number of current values to "0" indicating a first current value (S302).

The memory controller 2 sets the first current value (shift current 0) indicated by the counter as a current value of the shift pulse (S303). Specifically, the memory controller 2 transmits a command to the magnetic domain wall shift memory 3 to make a request to set the current value of the shift pulse to shift current 0. FIG. 23 shows an example of a format of a command issued to the magnetic domain wall shift memory 3 by the memory controller 2 to make a request to set a shift current (g1, g2).

"X1h" indicated by symbol g1 is a command corresponding to a declaration that parameters (voltage value, current value, voltage application time) related to the shift is to be input. Then, a parameter "Shift_i" is input in a data cycle (g2). Upon receiving the command "X1h" and parameter "Shift_i", the magnetic domain wall shift memory 3 sets a shift pulse as setting of a current value to be assumed here (S304). That is, the magnetic domain wall shift memory 3 included in the memory system 1 can set a shift pulse based on the command "X1h" and parameter "Shift_i".

When the memory controller 2 sets a shift pulse, it writes test data (S305). Specifically, the memory controller 2 transmits a command to the magnetic domain wall shift memory 3 to request the memory 3 to write data (test data). FIG. 23 shows an example of a format of a command issued to the magnetic domain wall shift memory 3 by the memory controller 2 to request the memory 3 to write data (g3 to g6).

"80h" indicated by symbol g3 is a command corresponding to a declaration that an address for write is to be input. Then, the address is input in a predetermined number (5 here) of cycles (g4). This address is an address (f2 in FIG. 22) designated by a read command issued in the read process. Following the address, write data (test data) is input in a data cycle (g5). "10h" indicated by symbol g6 is a write execution command. When the command "80h" is input and the address is input in a predetermined number of cycles to determine a write destination, the magnetic domain wall shift memory 3 performs a write process for data input further in a data cycle in response to the command "10h" (S306). Upon completion of the write process, the magnetic domain wall shift memory 3 notifies the memory controller 2 of the completion.

Then, the memory controller 2 reads test data (S305). Specifically, the memory controller 2 transmits a command to the magnetic domain wall shift memory 3 to request the memory 3 to read data (test data). This command corresponds to f1 to f3 in FIG. 22. Upon receiving the command, the magnetic domain wall shift memory 3 reads the data (S308) and transmits it to the memory controller 2.

The memory controller 2 compares the test data received from the magnetic domain wall shift memory 3 with an expected value that is the original test data generated in S301 to detect a defective MML that has caused an error (S309). The memory controller 2 determines whether or not the value of the counter is smaller than the upper limit (S310). If the value is smaller than the upper limit (Yes in S310), the memory controller 2 increments the value by one, and repeats the process from S303. That is, the memory controller 2 changes the shift pulse to the next current value to write/read the test data. If the value of the counter is not smaller than the upper limit (No in S310), the memory controller 2 calculates likelihood information (LLR) of data read from each MML based on the detection result of the defective MML obtained in S310 (S311).

In the first pattern described above, the write/read of test data is performed a plurality of times by varying a shift pulse to obtain likelihood information of data read out of each MML and perform soft decision decoding for data destructively read out of the magnetic domain wall shift memory.

FIG. 24 is a flowchart showing another example (second pattern) of a procedure for the retry process to be performed by the memory system 1 according to the embodiment.

The second pattern differs from the first pattern described with reference to FIG. 23 in that it is assumed that test data is written by varying the current value of a write pulse. It is also assumed here that a predetermined number of current values are predetermined to set different current values (write current 0, write current 1, . . . ). Since, furthermore, S401, S402 and S405 to S411 in FIG. 24 correspond to S301, S302 and S305 to S311 in FIG. 23, their descriptions will be omitted, and only S403 and S404 in FIG. 24 will be described.

The memory controller 2 sets the current value (write current n) indicated by the counter as a current value of the write pulse (S403). Specifically, the memory controller 2 transmits a command to the magnetic domain wall shift memory 3 to request the memory 3 to set the current value of the write pulse to the write current n. FIG. 23 shows an example of a format of a command issued to the magnetic domain wall shift memory 3 by the memory controller 2 to make a request to set a write current (h1, h2).

"X2h" indicated by symbol h1 is a command corresponding to a declaration that parameters (voltage value, current value, voltage application time) related to the write is to be input. Then, a parameter "Shift_i" is input in a data cycle (h2). Upon receiving the command "X2h" and parameter "Shift_i," the magnetic domain wall shift memory 3 sets a write pulse as setting of a current value to be assumed here (S404). That is, the magnetic domain wall shift memory 3 included in the memory system 1 can set a write pulse based on the command "X2h" and parameter "Shift_i".

In the second pattern described above, the write/read of test data is performed a plurality of times by varying a write pulse to obtain likelihood information of data read out of each MML and perform soft decision decoding for data destructively read out of the magnetic domain wall shift memory.

Figure 25:
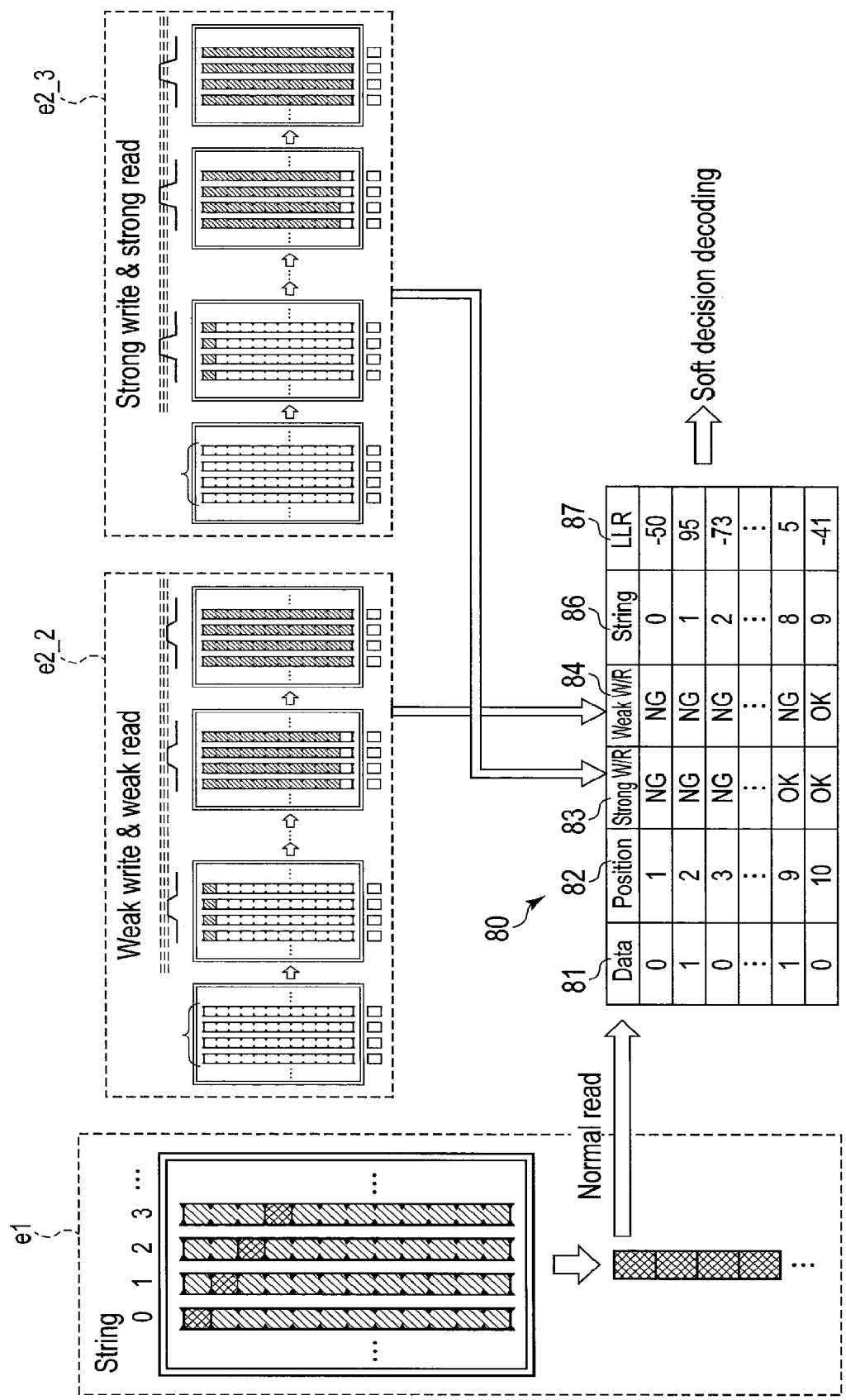
FIG. 25 is a diagram illustrating a modification to the calculation of likelihood information of data read out of an MML, which is performed by the memory system according to the embodiment.

The above is directed to an example of writing/reading test data three times, that is, writing/reading of test data by the first shift pulse (normal write and normal read), writing/reading of test data by the second shift pulse (weak write and weak read), and writing/reading of test data by the third shift pulse (strong write and strong read). As described above, the number of times of writing/reading of test data is not limited to three, but any number of times can be applied. For example, when it is required to reduce the number of times of writing/reading of test data because of response time constraints, likelihood information for soft decision decoding may be obtained by performing two test data write/read operations of weak write & weak read and strong write & strong read twice by shift pulses other than a shift pulse used when data for soft decision decoding is read out as shown in FIG. 25. In order to write/read test data a plurality of times, it is preferable to include test data write/read using a shift pulse whose current value is lower than or whose voltage application time is shorter than that of the shift pulse used when data for soft decision decoding is read out, and test data write/read using a shift pulse whose current value is higher than or whose voltage application time is longer than that of the shift pulse used when data for soft decision decoding is read out.

Figure 26:
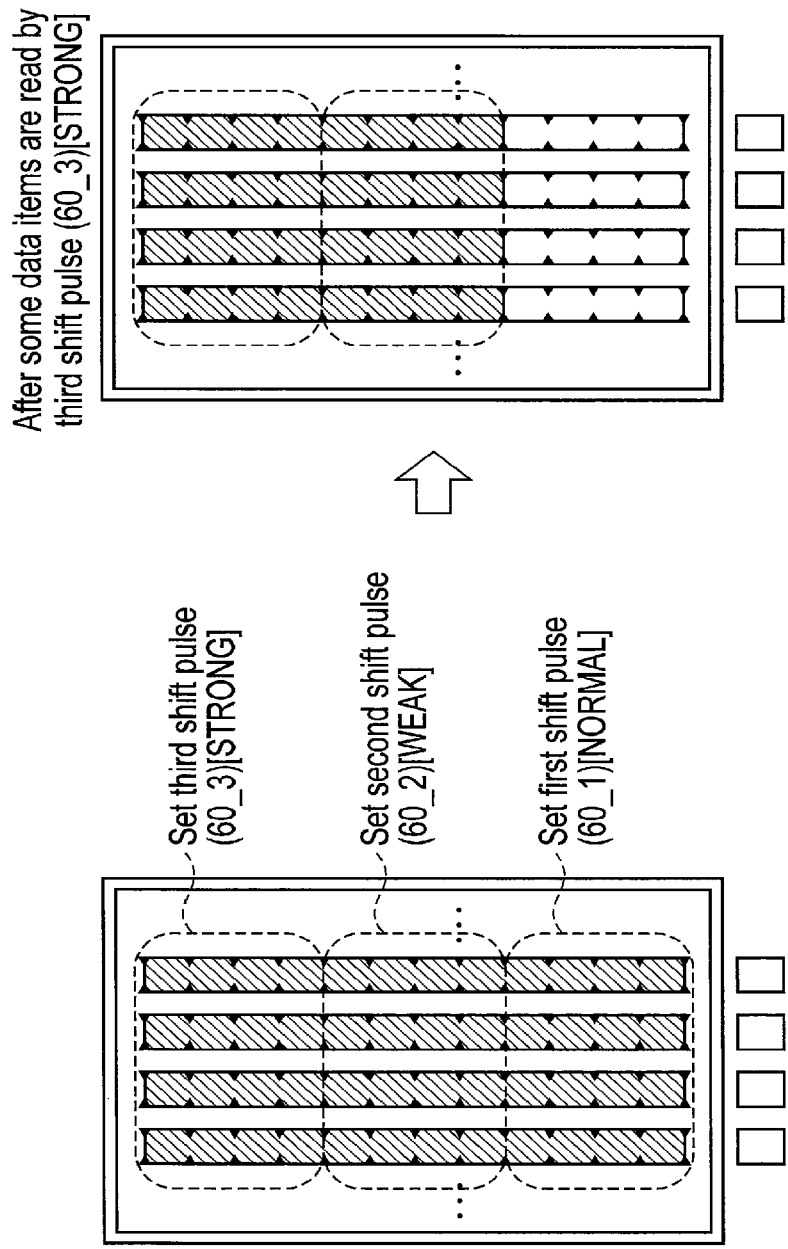
FIG. 26 is a diagram illustrating a modification to test data write/read performed by the memory system according to the embodiment.

Since the magnetic domain wall shift memory 3 included in the memory system 1 can set a shift pulse in response to commands and parameters from outside, if a position is excluded from calculation elements of likelihood information, likelihood information of data read from each MML can also be calculated by applying three shift pulses when one test data item is written and applying three shift pulses when the one test data item is read out. That is, for example, as shown in FIG. 26, the first ⅓ of test data is written by the first shift pulse (normal write), the middle ⅓ of the test data is written by the second shift pulse (weak write), and the last ⅓ of the test data is written by the third shift pulse (strong write). On the other hand, when test data is read, the last ⅓ is read by the third shift pulse (strong read), the middle ⅓ of the test data is read by the second shift pulse (weak read), and the first ⅓ of the test data is read by the first shift pulse (normal read). FIG. 26 shows a state in which the entire test data is written by normal write, weak write and strong write and a state in which what part of the test data is read by strong read from the former state.

As described above, normal write, weak write and strong write are partly performed for one test data item, and strong read, weak read and normal read are partly performed. Thus, an error is detected in each of normal write & normal read, weak write & weak read and strong write & strong read, and likelihood information of data read from each MML can be calculated.

FIG. 26 shows a state in which test data is written using all layers of each MML. If a position is excluded from the calculation elements of likelihood information, it is not essential to use all the layers including the lowermost layer. The data length of test data can thus be decreased. In other words, test data can be written/read using some of the layers (higher layers) of each MML.

Figure 27:
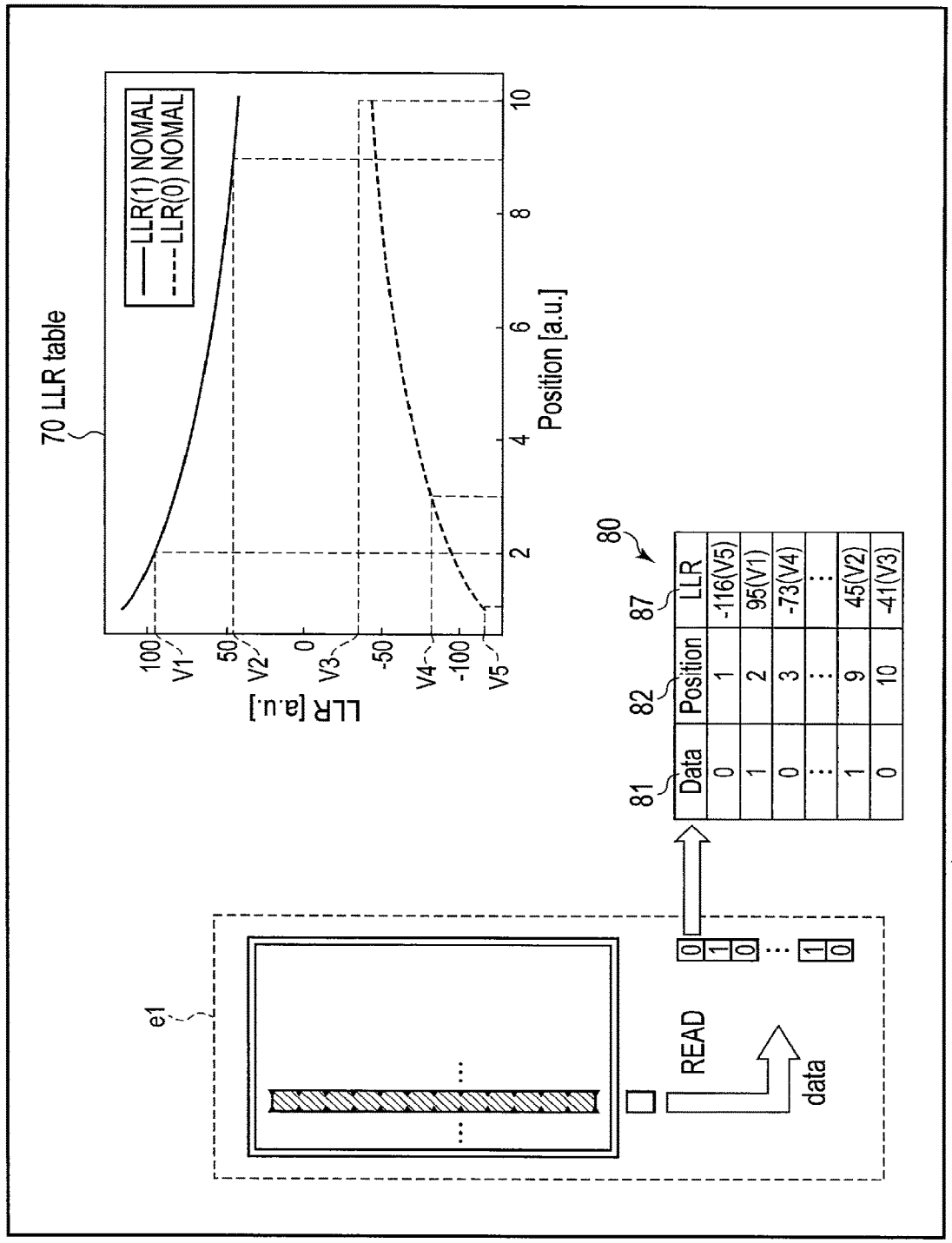
FIG. 27 is an illustration of an example of calculating likelihood information of data, which is read out of an MML, only from positional information in the MML by the memory system according to the embodiment.

Alternatively, likelihood information of data read out of each MML can be obtained only by positions. FIG. 27 is an illustration of an example of calculating likelihood information of data read out of an MML only by positions. In this case, the LLR table 70 retains the likelihood [LLR(1) NORMAL] of data "1" read out of an MML and the likelihood [LLR(0) NORMAL] of data "0" read out of an MML for each of the positions of layers of the MML.

For example, soft decision decoding can be performed assuming that the likelihoods of data "0" read from positions 1, 3 and 10 are −116 (V5), −73 (V4) and −41 (V3) [LLR(0) NORMAL], respectively, and the likelihoods of data "1" read from positions 2 and 9 are 95 (V1) and 45 (V2) [LLR(1) NORMAL], respectively.

<First-In First-Out Magnetic Domain Wall Shift Memory 3>

Next is a description of a first-in first-out magnetic domain wall shift memory 3. In this memory 3, too, an exemplary configuration of the memory system 1 regarding soft-decision decoding is the same as that in the last-in first-out magnetic domain wall shift memory 3 described with reference to FIG. 13, and thus its description will be omitted here.

FIG. 28 shows a basic read operation of the first-in first-out magnetic domain wall shift memory 3. FIG. 28 also shows four MMLs 50_1 to 50_4 included in one of a number of blocks that may be included in the cell array of the magnetic domain wall shift memory 3. It is also assumed here that information indicating "1" or "0" is stored in each of the layers of each MML 50_1 to 50_4 as an initial state.

When first data read is performed by supplying the first shift pulse 60_1 to each of the MMLs 50_1 to 50_4, information item R0 is read out of the lowermost layer in each of the MMLs 50_1 to 50_4 using the first-in first-out method, and information items R1 to R11 stored in the layers below the lowermost layer are each shifted toward the lowermost layer. After that, information items R1 to R11 are read out in sequence while the first shift pulse 60_1 is supplied to each of the MMLs 50_1 to 50_4. When last-but-one data read is performed, information item R11 stored in the uppermost layer in the initial state is shifted to the lowermost layer, and information item R11 shifted from the uppermost layer to the lowermost layer is read by last data read. That is, reading of 11-bit data indicated by information items R0 to R11 is completed. The memory system 1 performs hard decision decoding using an ECC for data read out of each of the MMLs 50_1 to 50_4.

An operation of the first-in first-out magnetic domain wall shift memory 3, which is performed during the write/read of test data when the memory system 1 has failed in hard decision decoding, will be described with reference to FIGS. 29 to 34.

Figure 29:
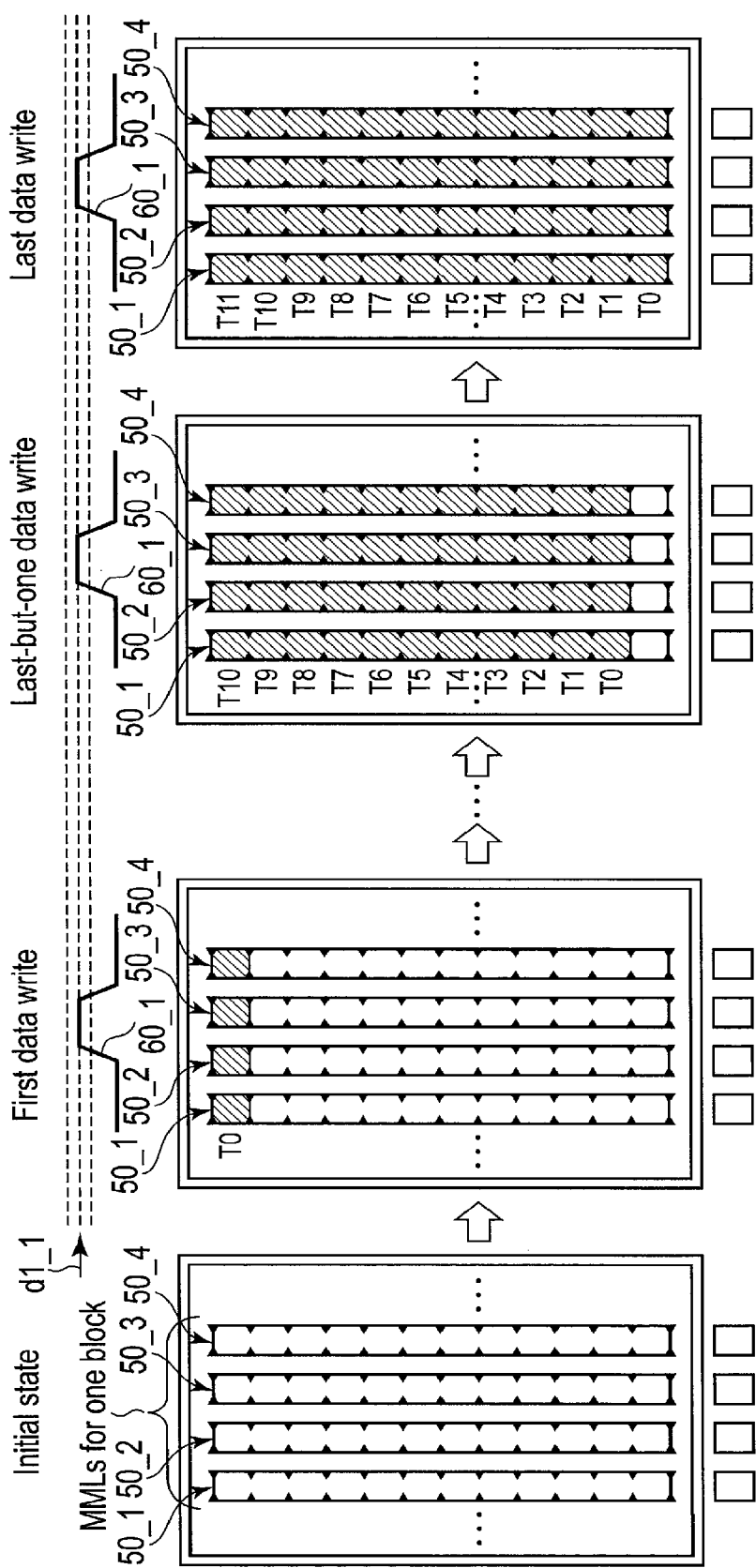
FIG. 29 is a diagram showing an operation of the first-in first-out magnetic domain wall shift memory which is performed when test data is written by the first shift pulse of the memory system according to the embodiment.

FIG. 29 shows an operation of the first-in first-out magnetic domain wall shift memory 3 which is performed when test data is written by the first shift pulse 60_1.

The initial state shown in FIG. 29 is the state of each of the MMLs 50_1 to 50_4 from which information items R0 to R11 are read. The memory system 1 stores test data, which is to be stored in the test data storage module 233, in the write buffer 25W (test pattern generation) to start to write test data to each of the MMLs 50_1 to 50_4 by the first shift pulse 60_1.

When first data write of test data to each of the MMLs 50_1 to 50_4 in the initial state shown in FIG. 29 is performed by the first shift pulse 60_1, the initial information item T0 is stored in the uppermost layer. After that, information items T1 to T11 are written in sequence while the first shift pulse 60_1 is supplied to each of the MMLs 50_1 to 50_4. At this time, information stored in each layer is shifted to the next lower layer, and information to be written is stored in the uppermost layer. When last-but-one data write is performed, information item T0 stored in the uppermost layer by the first data write is shifted to the next upper layer of the lowermost layer, and information items T1 to T10 subsequent to information item T0 are stored in each layer continuously in the upward direction from the layer storing information item T0. Then, information items T0 to T11 indicating test data are stored in all layers of each of the MMLs 50_1 to 50_4 by the last data write.

Figure 30:
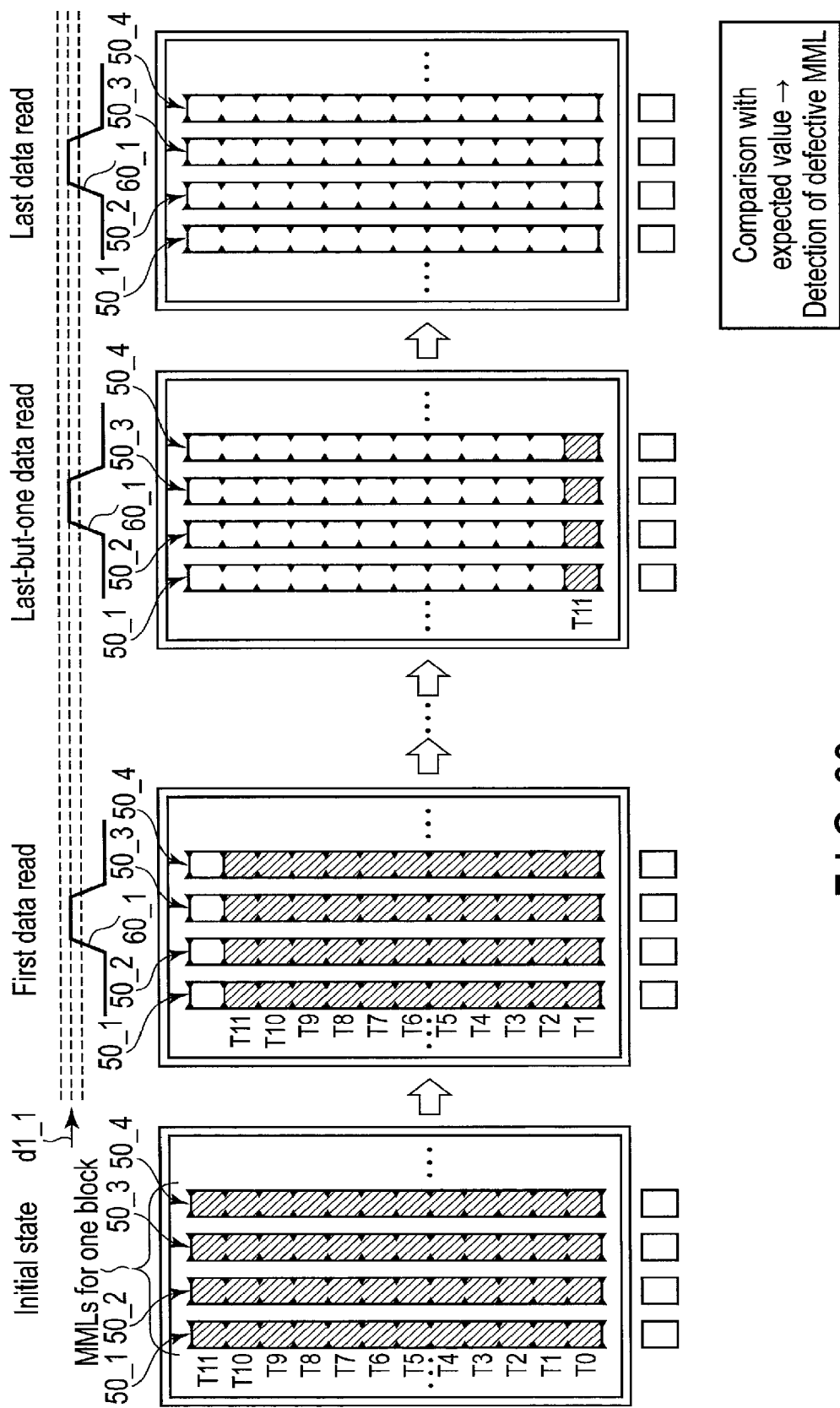
FIG. 30 is a diagram showing an operation of the first-in first-out magnetic domain wall shift memory which is performed when test data is read by the first shift pulse of the memory system according to the embodiment.

FIG. 30 shows an operation of the first-in first-out magnetic domain wall shift memory 3 which is performed when test data is read by the first shift pulse.

The initial state shown in FIG. 30 is the state of each of the MMLs 50_1 to 50_4 to which information items T0 to T11 indicative of test data are written by the first shift pulse.

When first data read is performed by supplying the first shift pulse 60_1 to each of the MMLs 50_1 to 50_4, information item T1 is read out of the lowermost layer in each of the MMLs 50_1 to 50_4 using the first-in first-out method, and information items T1 to T11 stored in the layers above the lowermost layer are each shifted toward the lowermost layer. After that, information items T1 to T11 are read out in sequence while the first shift pulse 60_1 is supplied to each of the MMLs 50_1 to 50_4. When last-but-one data read is performed, information item T11 stored in the uppermost layer in the initial state is shifted to the lowermost layer, and information item T11 shifted from the uppermost layer to the lowermost layer is read by the last data read. That is, reading of test data indicated by information items T0 to T11 is completed. Since the test data is known data, the memory system 1 can compare the test data read out of each of the MMLs 50_1 to 50_4 with an expected value (original test data). Based on this comparison, the memory system 1 detects a defective MML.

Figure 31:
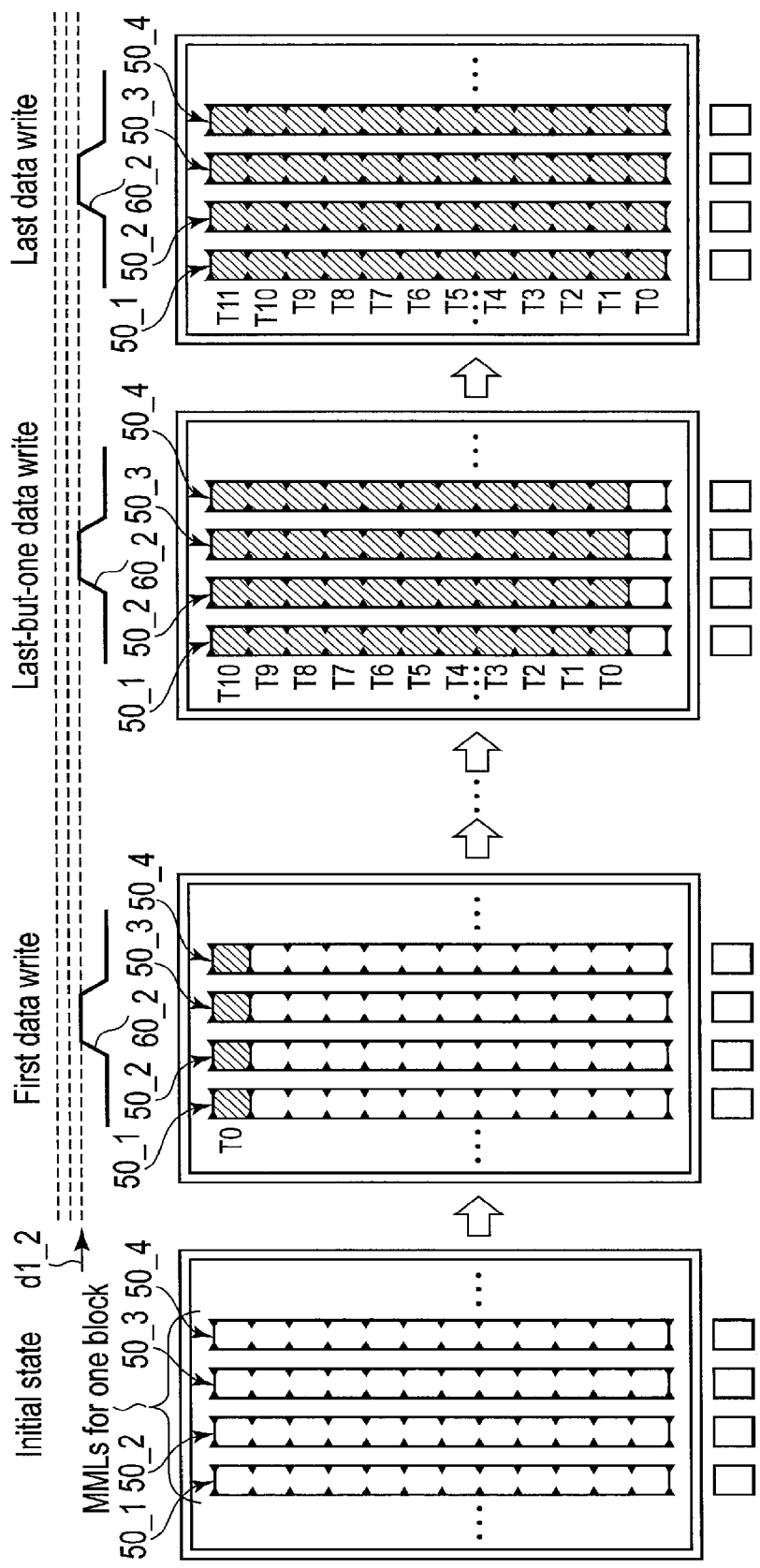
FIG. 31 is a diagram showing an operation of the first-in first-out magnetic domain wall shift memory which is performed when test data is written by the second shift pulse of the memory system according to the embodiment.

FIG. 31 shows an operation of the first-in first-out magnetic domain wall shift memory 3 which is performed when test data is written by the second shift pulse 60_2. In this case, too, the voltage application time of the second shift pulse 60_2 may be shortened, instead of making the current value of the second shift pulse 60_2 lower than that of the first shift pulse 60_1.

The initial state shown in FIG. 31 is the state of each of the MMLs 50_1 to 50_4 from which information items T0 to T11 are read by the first shift pulse 60_1. The memory system 1 stores test data, which is stored in the test data storage module 233, in the write buffer 25W (test pattern generation) to start to write the test data to each of the MMLs 50_1 to 50_4 by the second shift pulse 60_2. In this case, too, as the test data, the test data used in the write/read by the first shift pulse 60_1 may be used.

When first data write of test data to each of the MMLs 50_1 to 50_4 in the initial state shown in FIG. 31 is performed by the second shift pulse 60_2, the initial information item T0 is stored in the uppermost layer. After that, information items T1 to T11 are written in sequence while the second shift pulse 60_2 is supplied to each of the MMLs 50_1 to 50_4. At this time, information stored in each layer is shifted to the next lower layer, and information to be written is stored in the uppermost layer. When last-but-one data write is performed, information item T0 stored in the uppermost layer by the first data write is shifted to the next upper layer of the lowermost layer, and information items T1 to T10 subsequent to information item T0 are stored in each layer continuously in the upward direction from the layer storing information item T0. Then, information items T0 to T11 indicating test data are stored in all layers of each of the MMLs 50_1 to 50_4 by the last data write.

FIG. 32 shows an operation of the first-in first-out magnetic domain wall shift memory 3 which is performed when test data is read by the second shift pulse.

The initial state shown in FIG. 32 is the state of each of the MMLs 50_1 to 50_4 to which information items T0 to T11 indicative of test data are written by the second shift pulse.

When first data read is performed by supplying the second shift pulse 60_2 to each of the MMLs 50_1 to 50_4, information item T0 is read out of the lowermost layer in each of the MMLs 50_1 to 50_4 using the first-in first-out method, and information items T1 to T11 stored in the layers above the lowermost layer are each shifted toward the lowermost layer. After that, information items T1 to T11 are read out in sequence while the second shift pulse 60_2 is supplied to each of the MMLs 50_1 to 50_4. When last-but-one data read is performed, information item T11 stored in the uppermost layer in the initial state is shifted to the lowermost layer, and information item T11 shifted from the uppermost layer to the lowermost layer is read by the last data read. That is, reading of test data indicated by information items T0 to T11 is completed. Since the test data is known data, the memory system 1 can compare the test data read out of each of the MMLs 50_1 to 50_4 with an expected value (original test data). Based on this comparison, the memory system 1 detects a defective MML.

Figure 33:
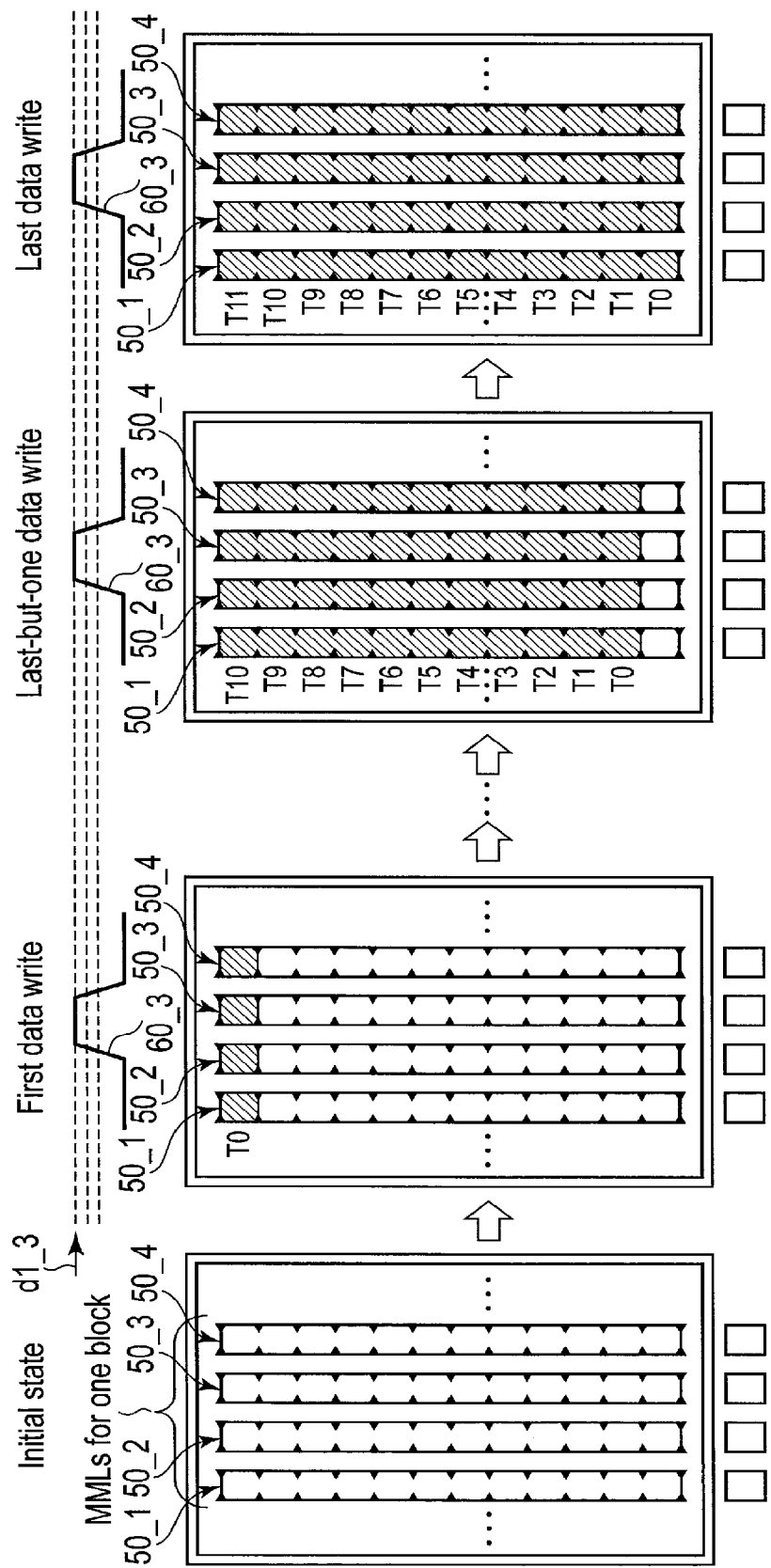
FIG. 33 is a diagram showing an operation of the first-in first-out magnetic domain wall shift memory which is performed when test data is written by the third shift pulse of the memory system according to the embodiment.

FIG. 33 shows an operation of the first-in first-out magnetic domain wall shift memory 3 which is performed when test data is written by the third shift pulse 60_3.

The initial state shown in FIG. 33 is the state of each of the MMLs 50_1 to 50_4 from which information items T0 to T11 are read by the second shift pulse 60_2. The memory system 1 stores test data, which is stored in the test data storage module 233, in the write buffer 25W (test pattern generation) to start to write the test data to each of the MMLs 50_1 to 50_4 by the third shift pulse 60_3. Like in the case of writing by the second shift pulse 60_1, as the above test data, the test data used in the write/read by the first shift pulse 60_1 may be used.

When first data write of test data to each of the MMLs 50_1 to 50_4 in the initial state shown in FIG. 33 is performed by the third shift pulse 60_3, the initial information item T0 is stored in the uppermost layer. After that, information items T1 to T11 are written in sequence while the third shift pulse 60_2 is supplied to each of the MMLs 50_1 to 50_4. At this time, information stored in each layer is shifted to the next lower layer, and information to be written is stored in the uppermost layer. When last-but-one data write is performed, information item T0 stored in the uppermost layer by the first data write is shifted to the next upper layer of the lowermost layer, and information items T1 to T10 subsequent to information item T0 are stored in each layer continuously in the upward direction from the layer storing information item T0. Then, information items T0 to T11 indicating test data are stored in all layers of each of the MMLs 50_1 to 50_4 by the last data write.

FIG. 34 shows an operation of the first-in first-out magnetic domain wall shift memory 3 which is performed when test data is read by the third shift pulse.

The initial state shown in FIG. 34 is the state of each of the MMLs 50_1 to 50_4 to which information items T0 to T11 indicative of test data are written by the third shift pulse.

When first data read is performed by supplying the third shift pulse 60_3 to each of the MMLs 50_1 to 50_4, information item T0 is read out of the lowermost layer in each of the MMLs 50_1 to 50_4 using the first-in first-out method, and information items T1 to T11 stored in the layers above the lowermost layer are each shifted toward the lowermost layer. After that, information items T1 to T11 are read out in sequence while the second shift pulse 60_2 is supplied to each of the MMLs 50_1 to 50_4. When last-but-one data read is performed, information item T11 stored in the uppermost layer in the initial state is shifted to the lowermost layer, and information item T11 shifted from the uppermost layer to the lowermost layer is read by the last data read. That is, reading of test data indicated by information items T0 to T11 is completed. Since the test data is known data, the memory system 1 can compare the test data read out of each of the MMLs 50_1 to 50_4 with an expected value (original test data). Based on this comparison, the memory system 1 detects a defective MML.

FIG. 35 is a diagram illustrating calculation of likelihood information of data read from an MML, which is performed by detecting an error by writing/reading test data using the first shift pulse, second shift pulse and third shift pulse in the memory system 1 including the first-in first-out magnetic domain wall shift memory 3.

In the first-in first-out magnetic domain wall shift memory 3, all data items are indicated by information shifted the same number of times from the uppermost layer to the lowermost layer in an MML. Unlike the last-in first-out magnetic domain wall shift memory 3, therefore, it cannot adopt a position as a calculation element of likelihood information. That is, the likelihood information calculation table 80 includes no equivalent to the "position" field 82 in the first-in first-out magnetic domain wall shift memory 3. In the memory system 1 including the first-in first-out magnetic domain wall shift memory 3, the LLR table 70 (not shown in FIG. 35) retains six information items of (1) the likelihood of data "1" read from an MML in which no error is detected; (2) the likelihood of data "0" read from an MML in which no error is detected; (3) the likelihood of data "1" read from an MML in which an error is detected in test data written/read by the second shift pulse; (4) the likelihood of data "0" read from an MML in which an error is detected in test data written/read by the second shift pulse; (5) the likelihood of data "1" read from an MML in which an error is detected in test data written/read by the third shift pulse; and (6) the likelihood of data "0" read from an MML in which an error is detected in test data written/read by the third shift pulse, and the likelihood determination module 236 performs soft decision decoding using these information items.

In the first-in first-out magnetic domain wall shift memory 3, a position cannot be a calculation element of likelihood information, as described above. It is thus possible to calculate likelihood information of data read out of each MML by applying three shift pulses to write one test data item and applying three shift pulses to read the one test data item.

For example, as shown in FIG. 36, the first ⅓ of test data is written by the first shift pulse (normal write), the middle ⅓ of the test data is written by the second shift pulse (weak write), and the last ⅓ of the test data is written by the third shift pulse (strong write). In test data read, too, the first ⅓ is read by the first shift pulse (normal read), the middle ⅓ of the test data is read by the second shift pulse (weak read), and the last ⅓ of the test data is read by the third shift pulse (strong read). FIG. 36 shows a state in which the entire test data is written by normal write, weak write and strong write and a state in which part of the test data is read by normal read from the former state.

In the memory system 1 including the first-in first-out magnetic domain wall shift memory 3, too, normal write, weak write and strong write are partly performed for one test data item, and strong read, weak read and normal read are partly performed, as described above. Thus, an error is detected in each of normal write & normal read, weak write & weak read and strong write & strong read, and likelihood information of data read from each MML can be calculated.

FIG. 36 shows a state in which test data is written using all layers of each MML. In the first-in first-out magnetic domain wall shift memory 3, however, a position cannot be a calculation element of likelihood information as described above. Thus, it is not essential that the test data have a size covering all layers and it is possible to shorten the data length of the test data.

<Example of Calculating Likelihood Information Based on Number of Magnetic Domain Walls>

An example of writing/reading test data to/from an MML from which data is read to calculate likelihood information of data destructively read, has been described so far. That is, an example of calculating likelihood information for soft decision decoding has been described using test data.

Next is a description of an example where likelihood information for soft decision decoding is calculated based on the number of magnetic domain walls without using test data. An outline of calculation of likelihood information based on the number of magnetic domain walls, which is performed by the memory system 1, will be described first with reference to FIGS. 37 and 38.

FIG. 37 shows an example where an MML retains data. The MLL includes a plurality of layers. One data item is represented by, for example, information stored in two adjacent layers. Specifically, the information stored in the layers is, for example, a magnetization direction of S or N. For example, when both the magnetization directions of two adjacent layers are S or N, the information indicates "0". For example, when one of the magnetizations is S and the other is N, the information indicates "1". The magnetic domain walls are a boundary between N and S and a boundary between S and N which are indicated by symbols h_1 and h_2.

When data is written to a block in the magnetic domain wall shift memory 3, the memory system 1 acquires the number of magnetic domain walls generated in each of the MLLs constituting the block. As shown in FIG. 38, the memory system 1 writes data (real data j1) to each of the MMLs, and also writes magnetic domain wall number information (magnetic domain wall number data j2) to an extra area of each of the MMLs. Since the number of magnetic domain walls for each MML is determined if data items to be written are aligned, the magnetic domain wall number data j2 may be written before the real data j1.

If each MML contains, for example, 1000 layers, the maximum number of magnetic domain walls is 999. Therefore, 10 bits are sufficient for recording the magnetic domain wall number data j2. In addition, the magnetic domain wall number data j2 may be multiplexed and recorded for safety.

When the memory system 1 reads data (real data j1+magnetic domain wall number data j2) from the block, it acquires the number of magnetic domain walls for each MML for part of the real data j1. If information (magnetization direction) is not moved correctly by shift during data write/read, the number of magnetic domain walls changes. The memory system 1 thus compares a value indicated by the magnetic domain wall number data j2 and the value of the magnetic domain wall number acquired during the read to set the likelihood of data read from the matched MMLs high and set the likelihood of data read from the mismatched MMLs low. For example, the greater the difference, the lower the likelihood of the data. In other words, the absolute value of the likelihood of the data read from the MMLs the difference between which is 0 is set as the maximum value, and the absolute value is decreased from the maximum value according to the difference. The memory system 1 uses the likelihood information so calculated to perform soft decision decoding of data which has failed in hard decision decoding. The method for calculating likelihood information based on the number of magnetic domain walls can be applied to the last-in first out or first-in first-out magnetic domain wall shift memory 3.

On the basis of the outline described above, the soft decision decoding of data destructively read from the magnetic domain wall shift memory 3, which is performed by the memory system 1 based on the number of magnetic domain walls, will be described in detail.

Figure 39:
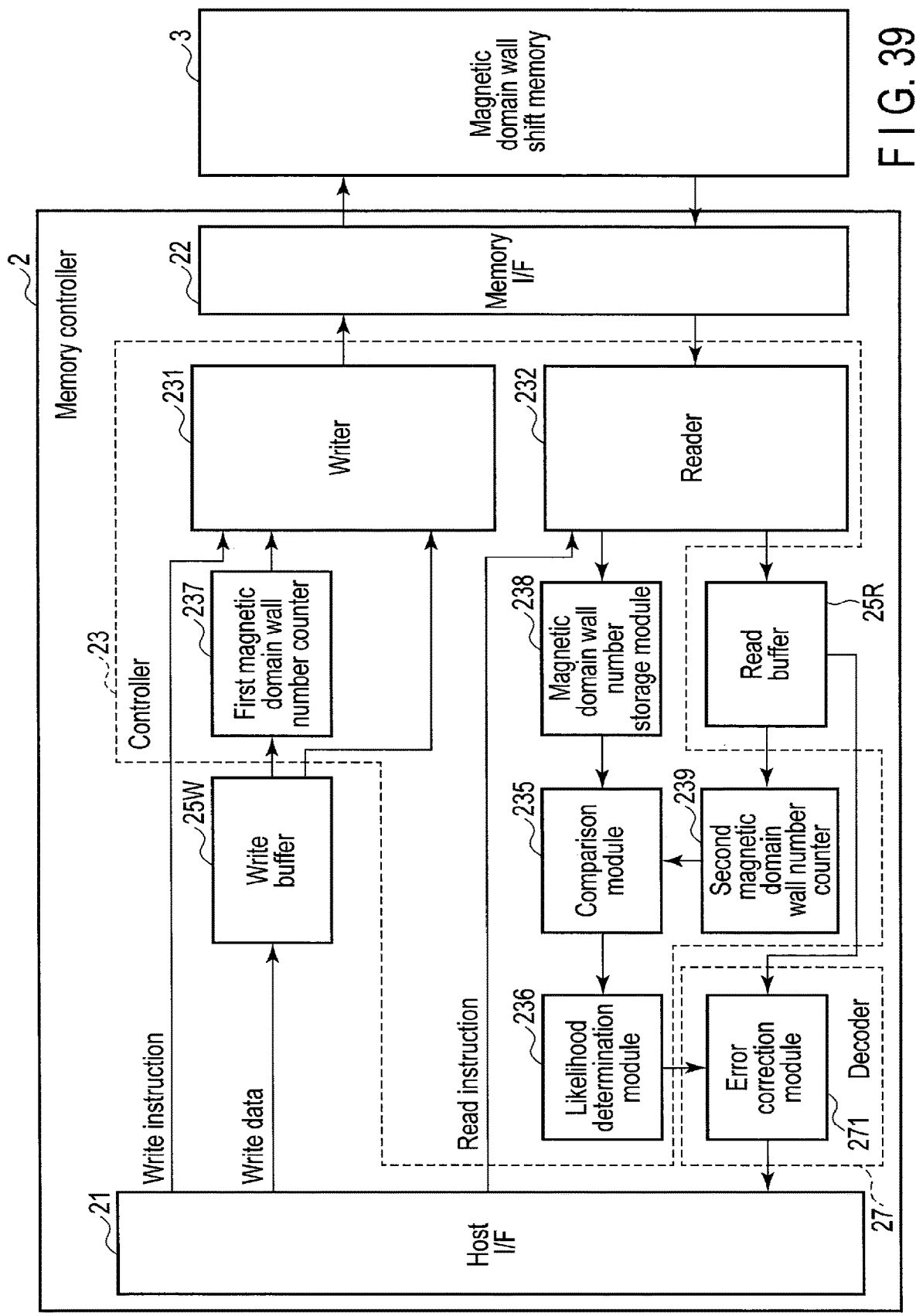
FIG. 39 is a block diagram showing an exemplary configuration of soft decision decoding to calculate likelihood information based on the number of magnetic domain walls by the memory system according to the embodiment.

FIG. 39 is a block diagram showing an exemplary configuration of soft decision decoding of the memory system 1 to calculate likelihood information based on the number of magnetic domain walls. This configuration differs from the configuration of the soft decision decoding of the memory system 1 to calculate likelihood information using test data, which has been described with reference to FIG. 13, in that the controller 23 of the memory controller 2 does not include the test data storage module 233 and the test data write/read controller 234, but includes a first magnetic domain wall number counter 237, a magnetic domain wall number storage module 238 and a second magnetic domain wall number counter 239.

The first magnetic domain wall number counter 237 acquires the number of magnetic domain walls generated for each MML of the magnetic domain wall shift memory 3 when write target data stored in the write buffer 25W is written to the magnetic domain wall shift memory 3. The number of magnetic domain walls acquired by the first magnetic domain wall number counter 237 is sent to the writer 231 and written to the magnetic domain wall shift memory 3 together with the write target data for each MML.

The magnetic domain wall number storage module 238 stores the number of magnetic domain walls read from the magnetic domain wall shift memory 3 by the reader 232, together with read target data. The second magnetic domain wall number counter 239 acquires the number of magnetic domain walls for each MML from the read target data which is read from the magnetic domain wall shift memory 3 and stored in the read buffer 25R.

The comparison module 235 compares the number of magnetic domain walls for each MML stored in the magnetic domain wall number storage module 238 and the number of magnetic domain walls for each MML acquired by the second magnetic domain wall number counter 239. Based on the comparison result of the comparison module 235, the likelihood determination module 236 calculates likelihood information of data read from each MML. The error correction module 271 of the decoder 27 performs soft decision decoding for read target data stored in the read buffer 25R using the likelihood information calculated by the likelihood determination module 236.

FIG. 40 shows a write operation of the last-in first-out magnetic domain wall shift memory 3 which is performed when the number of magnetic domain walls is recorded. Symbols D0 to D9 are expressed so as to be able to recognize how each information item indicating real data j1 shifts in each of the MMLs 50_1 to 50_4. Similarly, symbols N0 and N1 are expressed so as to be able to recognize how each information item indicating magnetic domain wall number data j2 shifts in each of the MMLs 50_1 to 50_4.

The initial state in FIG. 40 is the state of each of the MMLs 50_1 to 50_4 in which no data is stored. The memory system 1 first writes real data j1 to each of the MMLs 50_1 to 50_4 in the initial state and then writes magnetic domain wall number data j2 thereto.

When first data write is performed, the initial information item D0 indicating real data j1 is stored in the uppermost layer. After that, the subsequent information items D1 to D9 and information items N0 and N1 indicating magnetic domain wall number data j2 are written in sequence. At this time, information stored in each layer is shifted to the next lower layer, and information to be written is stored in the uppermost layer. When last-but-one data write is performed, information item D0 stored in the uppermost layer by the first data write is shifted to the next upper layer of the lowermost layer, and the subsequent information items D1 to D9 and information item N0 are stored in each layer continuously in the upward direction from the layer storing information item D0. Then, information items D0 to D9 indicating real data j1 and information items N0 and N1 indicating magnetic domain wall number data j2 are stored in all layers of each of the MMLs 50_1 to 50_4 by the last data write. That is, the number of magnetic domain walls is recorded in the upper layers of each of the MMLs 50_1 to 50_4. As described above, the magnetic domain wall number data j2 can be written prior to the real data j1. In this case, the number of magnetic domain walls is recorded in the lower layers of each of the MMLs 50_1 to 50_4. In the last-in first-out magnetic domain wall shift memory 3, the number of shifts at the time of data write/read is smaller in the upper layers and the probability of error generation is lower. It is thus preferable to record the number of magnetic domain walls in the upper layers of each of the MMLs 50_1 to 50_4. FIG. 40 shows how the magnetic domain wall number data j2 is recorded in two layers, which is intended to show that the magnetic domain wall number data j2 is recorded in the upper layers of each of the MMLs 50_1 to 50_4, and not to show the size of the magnetic domain wall number data j2.

FIG. 41 shows a read operation of the last-in first-out magnetic domain wall shift memory 3 which is performed when the number of magnetic domain walls is recorded.

The initial state in FIG. 41 is the state of each of the MMLs 50_1 to 50_4 to which information items D0 to D9 indicating real data j1 and information items N0 and N1 indicating magnetic domain wall number data j2 are written.

When first data read is performed, information item N1 indicating magnetic domain wall number data j2 is read out of the uppermost layer, and information item N0 and information items D9 to D0 indicating real data j1 stored in the layers below the uppermost layer are each shifted toward the uppermost layer. When last-but-one data read is performed, information item D0 stored in the lowermost layer in the initial state is shifted to the uppermost layer, and information item D0 shifted from the lowermost layer to the uppermost layer is read by the last data read. That is, reading of magnetic domain wall number data j2 indicated by information items N0 and N1 and real data j1 indicated by information items D0 to D9 is completed. During the data read, the memory system 1 acquires the number of magnetic domain walls of each of the MMLs from the read real data j1. Then, the memory system 1 compares the number of magnetic domain walls of each of the MMLs indicated by the magnetic domain wall number data j2 and the number of magnetic domain walls of each of the MMLs acquired from the read real data j1.

Figure 42:
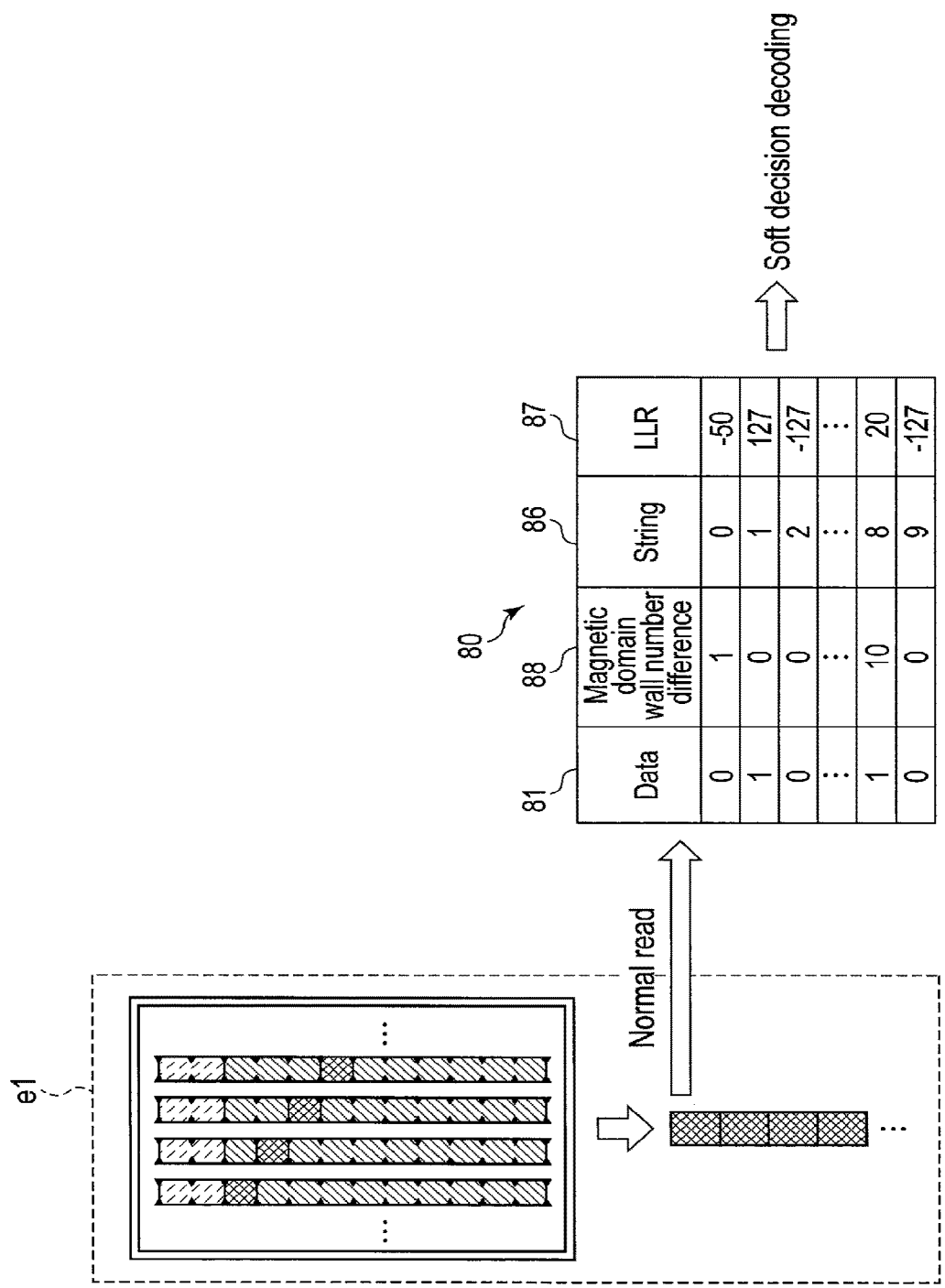
FIG. 42 is an illustration of calculation of likelihood information of data read out of an MML, based on the number of magnetic domain walls, which is performed by the memory system according to the embodiment.

FIG. 42 is an illustration of calculation of likelihood information of data read out of an MML, based on a result of comparison between the number of magnetic domain walls registered during data write and the number of magnetic domain walls acquired during data read, which is performed by the memory system 1.

The likelihood information calculation table 80 shown in FIG. 42 includes a "magnetic domain wall number difference" field 88 in addition to the foregoing "data" field 81, "string" field 86 and "LLR" field 87. For example, the magnetic domain wall number difference is 0 when the string is 1, 2 and 9. The absolute value of the likelihood of data read from these strings is determined as the maximum value of 127. For example, the absolute value of the likelihood of data read from string 0 when the difference is 1 is determined as a low value of 50, and the absolute value of the likelihood of data read from string 8 when the difference is 10 is determined as a much lower value of 20. That is, the LLR table 70 retains the likelihood of data read from an MML for each magnetic domain wall number difference calculated as described above.

The memory system 1 performs soft decision decoding for the data read out from the MLL using the likelihood information (and ECC) calculated as described above.

FIG. 43 is a flowchart showing an example of a procedure for a write process to be performed when the memory system 1 calculates likelihood information based on the number of magnetic domain walls.

The memory system 1 calculates the number of magnetic domain walls in each MML included in a block in the magnetic domain wall shift memory 3 from, for example, write data received from the host 4 (S501). Then, the memory system 1 writes the write data to the block in the magnetic domain wall shift memory 3 (S502) and writes the number of magnetic domain walls calculated in S501 to an extra area of the MML (S503). The order of S502 and S503 may be reversed. The same applies to the first-in first-out method.

Figure 44:
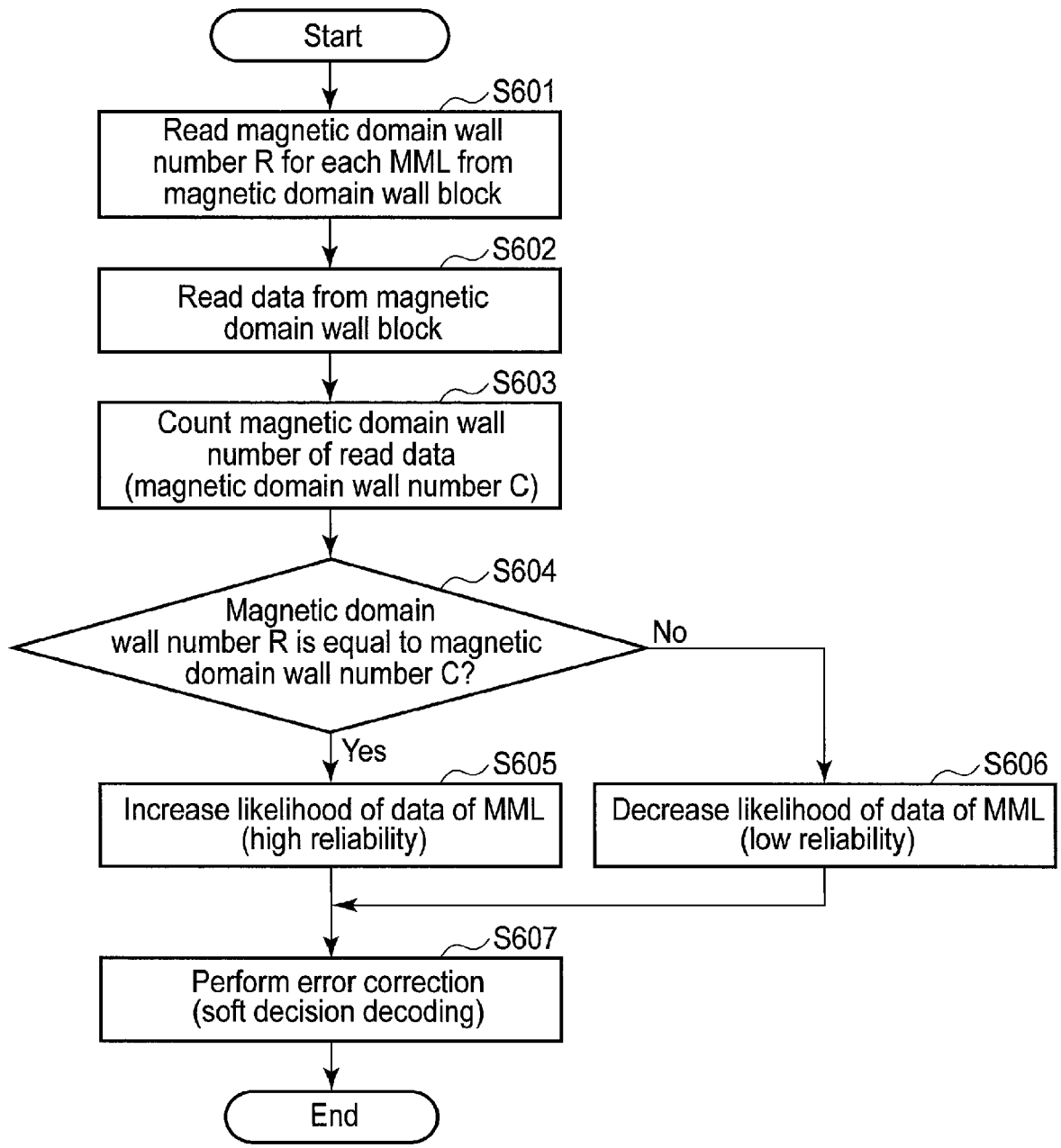
FIG. 44 is a flowchart showing an example of a procedure for a read process to be performed when the memory system according to the present embodiment calculates likelihood information based on the number of magnetic domain walls.

FIG. 44 is a flowchart showing an example of a procedure for a read process to be performed when the memory system 1 calculates likelihood information based on the number of magnetic domain walls.

The memory system 1 reads magnetic domain wall number information for each MML, which is recorded together with, for example, data requested to be read from the host 4, from a certain block in the magnetic domain wall shift memory 3 (S601). Then, the memory system 1 reads the data requested to be read from the host 4 (S602). The order of S601 and S602 is reversed when the order of S502 and S503 in FIG. 43 is reversed. In the first-in first-out method, the order of writing data and the number of magnetic domain walls in the write process coincides with the order of writing data and the number of magnetic domain walls in the read process.

The memory system 1 acquires the number of magnetic domain walls of read data for each MML (S603). Then, the memory system 1 compares the number of magnetic domain walls read in S601 and the number of magnetic domain walls acquired in S603 for each MML (S604). When these numbers coincide with each other (Yes in S604), the memory system 1 increases the likelihood of data read from the MML (S605). When the numbers do not coincide with each other (No in S604), the memory system 1 decreases the likelihood of data read from the MML (S606). The memory system 1 performs soft decision decoding for the read data using the likelihood information determined as described above (S607).

As described above, the memory system 1 can calculate likelihood information based on the number of magnetic domain walls and perform soft decision decoding. An example in which the number of magnetic domain walls is recorded for each MML has been described. Instead of the number of magnetic domain walls, for example, a cyclic redundancy code (CRC) of data to be written to each MML may be generated and recorded together with the data. In this case, the memory system 1 increases the likelihood of data read from an MML in which no error is detected by the CRC check and decreases the likelihood of data read from an MML in which an error is detected by the CRC check, and performs soft decision decoding.

<Reuse of Calculated Likelihood Information>

The above description is directed to an example of calculating likelihood information to be used in soft decision decoding each time the soft decision decoding is performed due to a failure in hard decision decoding. Here is a description of an example in which the likelihood information (likelihood data k1) calculated to perform soft decision decoding is written to an extra area of each MML for use in the next soft decision decoding, as shown in FIG. 45. FIG. 45 shows an example in which coefficients (0.2, 0.9, 0.8, . . . ) to be multiplied by a reference value (the absolute value is the maximum value) are recorded as the likelihood data k1.

Since the state of each MML may change, there is a possibility that the change will cause the memory system 1 to fail in soft decision decoding using the likelihood information calculated in the last soft decision decoding. If the memory system 1 fails in the soft-decision decoding, it calculates likelihood information again and performs soft-decision decoding again using the re-calculated likelihood information. When the memory system 1 succeeds in the soft decision decoding using the likelihood information calculated in the last soft decision decoding, it writes the likelihood information back to an extra area of the MML. If the memory system 1 succeeds in hard decision decoding and does not perform soft decision decoding, it also writes the likelihood information back to an extra area of the MML.

The likelihood information in this case may be calculated using test data or based on the number of magnetic domain walls. In the latter case, likelihood information is recorded in an extra area of each MML during the read process, and the number of magnetic domain walls is recorded during the write process. The recording of calculated likelihood information in an extra area of each MML can be applied to either the last in first out or the first-in first out magnetic domain wall shift memory 3.

Figure 47:
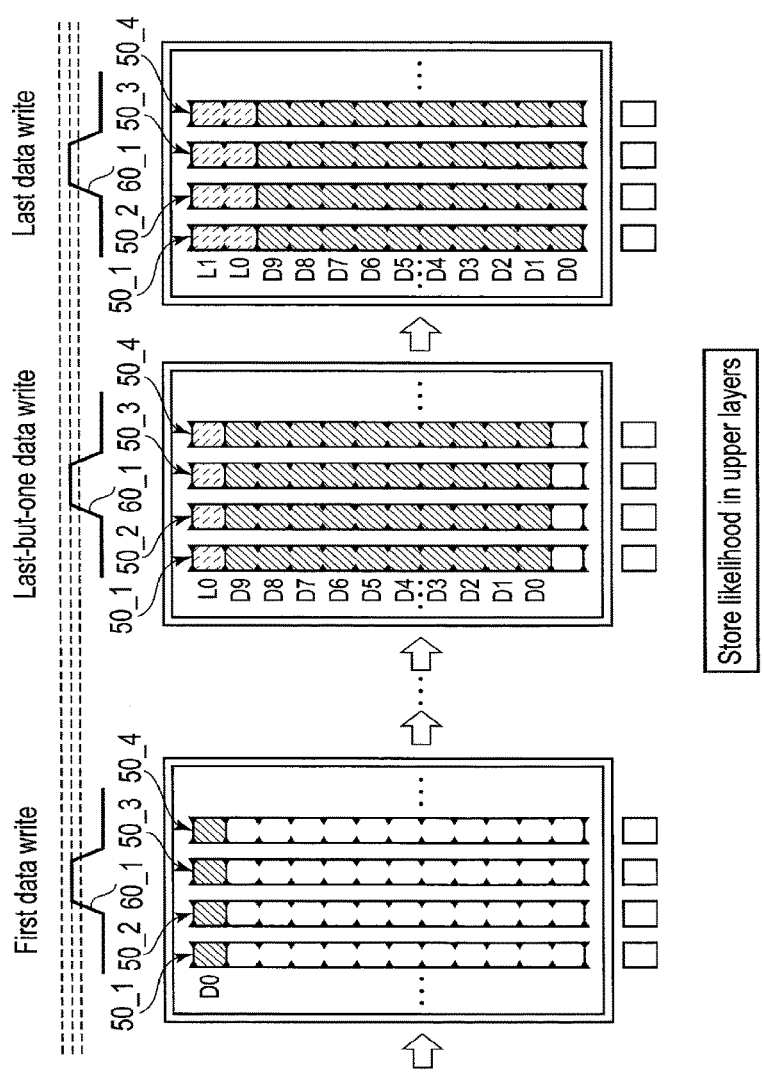
FIG. 47 is a diagram showing a second example of the write operation of the last-in first-out magnetic domain wall shift memory which is performed when the memory system according to the embodiment records likelihood information.

FIGS. 46 and 47 each show a write operation of the last-in first-out magnetic domain wall shift memory 3 which is performed when likelihood information is recorded. Symbols L0 and L1 are expressed so as to be able to recognize how information items indicating the likelihood data K1 are shifted in each of the MMLs 50_1 to 50_4.

The initial state shown in FIG. 46 is a state in which only the likelihood data k1 calculated by the last soft decision decoding or its previous soft decision decoding is stored. If soft decision decoding is not performed yet, the initial value of the likelihood data k1 may be stored, or a value indicating that the likelihood data k1 is invalid may be stored. In the former case, soft decision decoding is performed using the initial value, and in the latter case, likelihood information is immediately calculated.

The memory system 1 first reads likelihood data k1 from each MML. When first data read is performed, information L1 indicating the likelihood data k1 is read out of the uppermost layer, and information L0 stored in the next lower layer is shifted to the uppermost layer. Subsequently, when second data read is performed, information L1 is read out of the uppermost layer, and the likelihood data k1 indicated by information items L0 and L1 is completely read out. Like FIG. 40 showing the information items N0 and N1 indicating the magnetic domain wall number data j2, FIG. 46 shows how the likelihood data k1 is recorded in two layers, but it is intended to show that the likelihood data k1 is recorded in the upper layers of each of the MMLs 50_1 to 50_4. When the likelihood data k1 is completely read out, each of the MMLs 50_1 to 50_4 stores no data. In this state, the memory system 1 writes the real data j1 and the likelihood data k1 (read immediately before) as shown in FIG. 47. To store the likelihood data k1 in the lower layers of each MML, the likelihood data k1 need not be read before the real data j1 is written. In the first-in first-out magnetic domain wall shift memory 3, too, the likelihood data k1 need not be read before the real data i1 is written.

When first data write is performed, the initial information item D0 indicating the real data j1 is stored in the uppermost layer. After that, information items D1 to D9 and information items L0 and L1 indicating the likelihood data k1 are written in sequence. At this time, information stored in each layer is shifted to the next lower layer, and information to be written is stored in the uppermost layer. When last-but-one data write is performed, information item D0 stored in the uppermost layer by the first data write is shifted to the next upper layer of the lowermost layer, and information items D1 to D9 subsequent to information item D0 are stored in each layer continuously in the upward direction from the layer storing information item D0. Then, information items D0 to D9 indicating the real data j1 and information items L0 and L1 indicating the likelihood data k1 are stored in all layers of each of the MMLs 50_1 to 50_4 by the last data write. That is, the number of magnetic domain walls is recorded in the upper layers of each of the MMLs 50_1 to 50_4. Like the magnetic domain wall number data j2, the likelihood data k1 can be written before the real data j1.

FIGS. 48 and 49 each show a read operation of the last-in first-out magnetic domain wall shift memory 3 which is performed when likelihood information is recorded.

The initial state shown in FIG. 48 is the state of each of the MMLs 50_1 to 50_4 to which information items D0 to D9 indicating the real data j1 and information items L0 and L1 indicating the likelihood data k1 are written.

When first data read is performed, information item L1 indicating the likelihood data k1 is read out of the uppermost layer, and information item L0 and information items D9 to D0 indicating the real data j1, which are stored in the layers below the uppermost layer, are each shifted toward the uppermost layer. When last-but-one data read is performed, information item D0 stored in the lowermost layer in the initial state is shifted to the uppermost layer, and information item D0 shifted from the lowermost layer to the uppermost layer is read out by the last data read. That is, the likelihood data k1 indicated by information items L0 to L1 and the real data j1 indicated by information items D0 to D9 are completely read out.

When the real data j1 is completely read out, hard decision decoding is performed using an ECC. If the memory system 1 fails in the hard decision decoding, soft decision decoding is performed using the read likelihood information (and ECC). If the memory system 1 fails in the soft-decision decoding, it calculates likelihood information again and performs soft-decision decoding using the re-calculated likelihood information (and ECC). In either case, the likelihood data k1 is recorded in (written back to) an extra area of each of the MMLs, as shown in FIG. 49.

That is, information item L0 indicating the likelihood data k1 is stored in the uppermost layer by the first data write, and information item L1 is stored in the uppermost layer by the second data write and the information L0 is shifted to the next lower layer of the uppermost layer.

FIG. 50 is a diagram showing a reuse cycle of likelihood information for use in soft decision decoding in the memory system 1.

The likelihood information calculation table 80 shown in FIG. 50 includes the foregoing "data" field 81, "string" field 86 and "LLR" field 87, and a "registered likelihood" field 89. The "registered likelihood" field 89 retains likelihood information read from each MML or likelihood information calculated again by the present soft decision decoding. In this example, the "registered likelihood" field 89 retains numerical values each indicating the absolute value of likelihood. For example, 0 represents 20, 2 represents 50, and 3 represents 127.

Upon completing the read process, the memory system 1 writes the numerical value retained in the "registered likelihood" field 89 back to an extra area of each MML from which data is read, as likelihood data k1. The calculation of likelihood information can thus be omitted in many cases where the memory system 1 fails in hard decision decoding and performs soft decision decoding.

Figure 51:
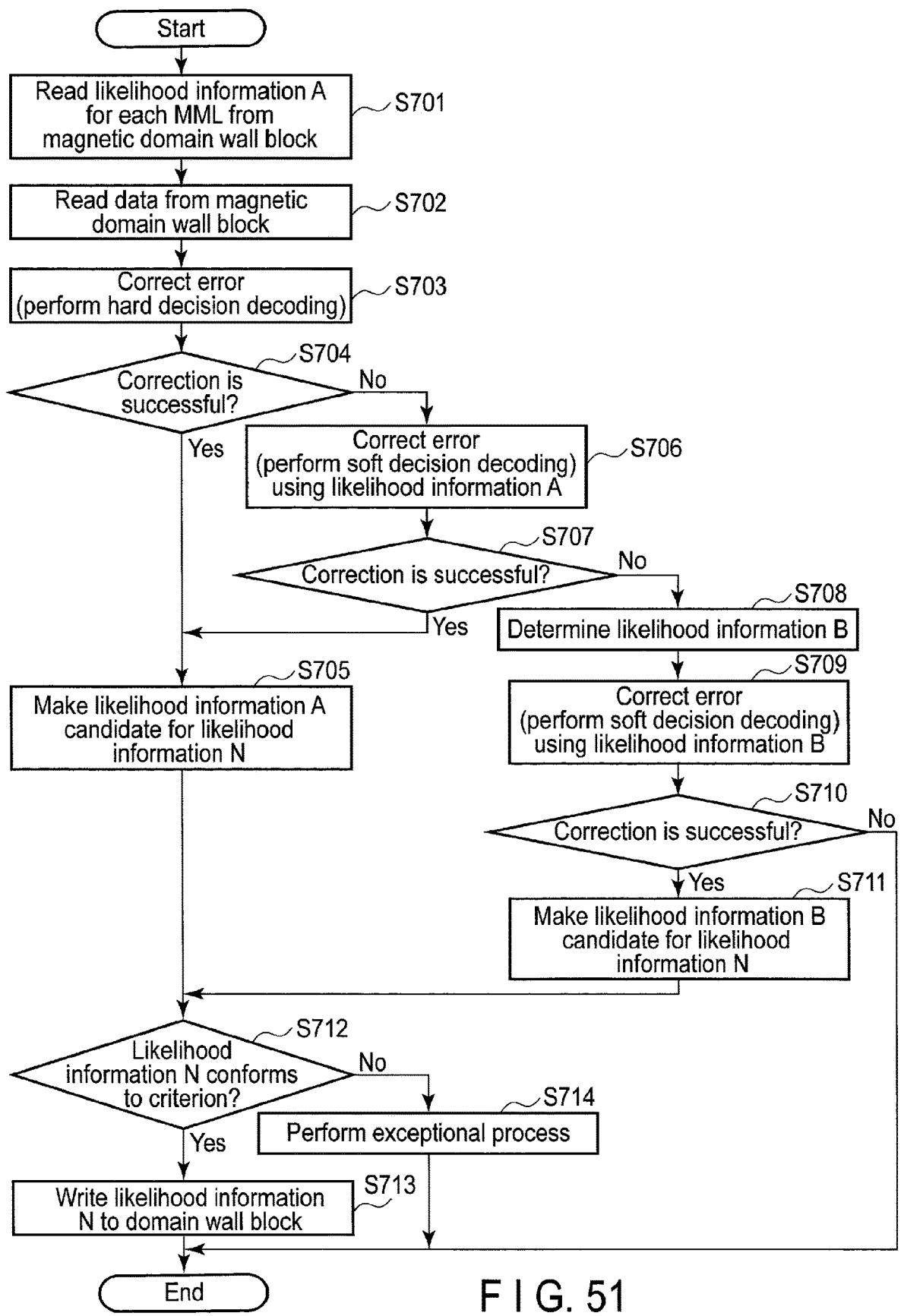
FIG. 51 is a flowchart showing an example of a procedure for a read process to be performed when the memory system according to the embodiment records likelihood information.

FIG. 51 is a flowchart showing an example of a procedure for a read process to be performed when the memory system 1 records likelihood information.

The memory system 1 reads likelihood information, which is recorded for each MML together with data requested to be read from, for example, the host 4, from a certain block in the magnetic domain wall shift memory 3 (S701). Then, the memory system 1 reads the data requested to be read from the host 4 (S702). When the likelihood information is stored in a lower layer of each MML, the order of S701 and S702 is reversed. In the first-in first-out method, too, the order of S701 and S702 is reversed if the likelihood information is written before the data.

The memory system 1 first performs hard decision decoding for the read data (S703). If the memory system 1 succeeds in the hard decision decoding (Yes in S704), it makes the likelihood information read in S701 a candidate for likelihood information to be written back to the MML (S705).

If the memory system 1 fails in the hard decision decoding (No in S704), it performs soft decision decoding for the read data using the likelihood information read in S701 (S706). When the memory system 1 succeeds in the soft-decision decoding (Yes in S707), it also makes the likelihood information read in S701 a candidate for likelihood information to be written back to the MML (S705), as in the case where it succeeds in hard decision decoding.

If the memory system 1 fails in soft decision decoding in S706, it determines likelihood information again (S708) to perform soft decision decoding for the read data (S709). If the memory system 1 succeeds in the soft decision decoding (Yes in S710), it makes the likelihood information determined in S708 a candidate for likelihood information to be written back to the MML (S711). If the memory system fails in the soft decision decoding in S709 (No in S710), it notifies, for example, the host 4 of a read error to end the read process.

The memory system 1 determines whether or not the likelihood information, which is a candidate to be written back to the MML, conforms to a predetermined criterion (S712). For example, it determines whether or not the number of MMLs whose likelihood is less than a threshold value exceeds a fixed number. If the likelihood information conforms to a criterion (Yes in S712), the memory system 1 writes the likelihood information back to a block in the magnetic domain wall shift memory 3 from which data has been read (S713), and ends the read process. If it does not conform to the criterion (No in S712), the memory system 1 performs an exception process such as prohibiting the use of the block (S714), and ends the read process.

FIG. 52 is a flowchart showing an example of a procedure for a write process to be performed when the memory system 1 records likelihood information.

To write data to a block in the magnetic domain wall shift memory 3, the memory system 1 first reads likelihood information from the block (S801). Then, the memory system 1 writes write data to the block (S802) and writes the likelihood information read in S801 back to the block (S803). In the first-in first-out magnetic domain wall shift memory 3, the memory system 1 need not read the likelihood information in S801 or write back the likelihood information in S803. In the last-in first-out magnetic domain wall shift memory 3, too, the memory system 1 need not read the likelihood information in S801 or write back the likelihood information in S803 if the likelihood information is stored in a lower layer.

As described above, the memory system 1 can reuse the likelihood information by performing soft decision decoding using the likelihood information calculated in the past, recording the calculated likelihood information for use in the next soft decision decoding, and the like.

<Diversion of Write Data to Test Data>

Next is a description of an example in which when the memory system 1 includes the first-in first-out magnetic domain wall shift memory 3, write data whose writing is requested from, for example, the host 4 is diverted to test data for calculating likelihood information to be used in soft decision decoding which is applied to read data whose reading is requested from, for example, the host 4.

In the first-in first-out magnetic domain wall shift memory 3, a parallel read/write operation of performing a read operation and a write operation in parallel can be performed, as described with reference to FIG. 7. Since data written by the parallel read/write is known data, it can be used as test data. When the memory system 1 fails in hard decision decoding for data (read data) read by the parallel read/write and thus performs soft decision decoding, it reads/writes the data (write data) as test data from/to the magnetic domain wall shift memory 3 a plurality of times by varying a shift pulse to calculate likelihood information to be used in the soft decision decoding. The step of generating test data can thus be omitted. When the write data is completely read/written to calculate likelihood information, the write data is written to the magnetic domain wall shift memory 3 with a shift pulse other than the original shift pulse. Thus, when the memory system 1 performs soft decision decoding, it writes the write data to the magnetic domain wall shift memory 3 again by the parallel read/write to read other read data.

Figure 53:
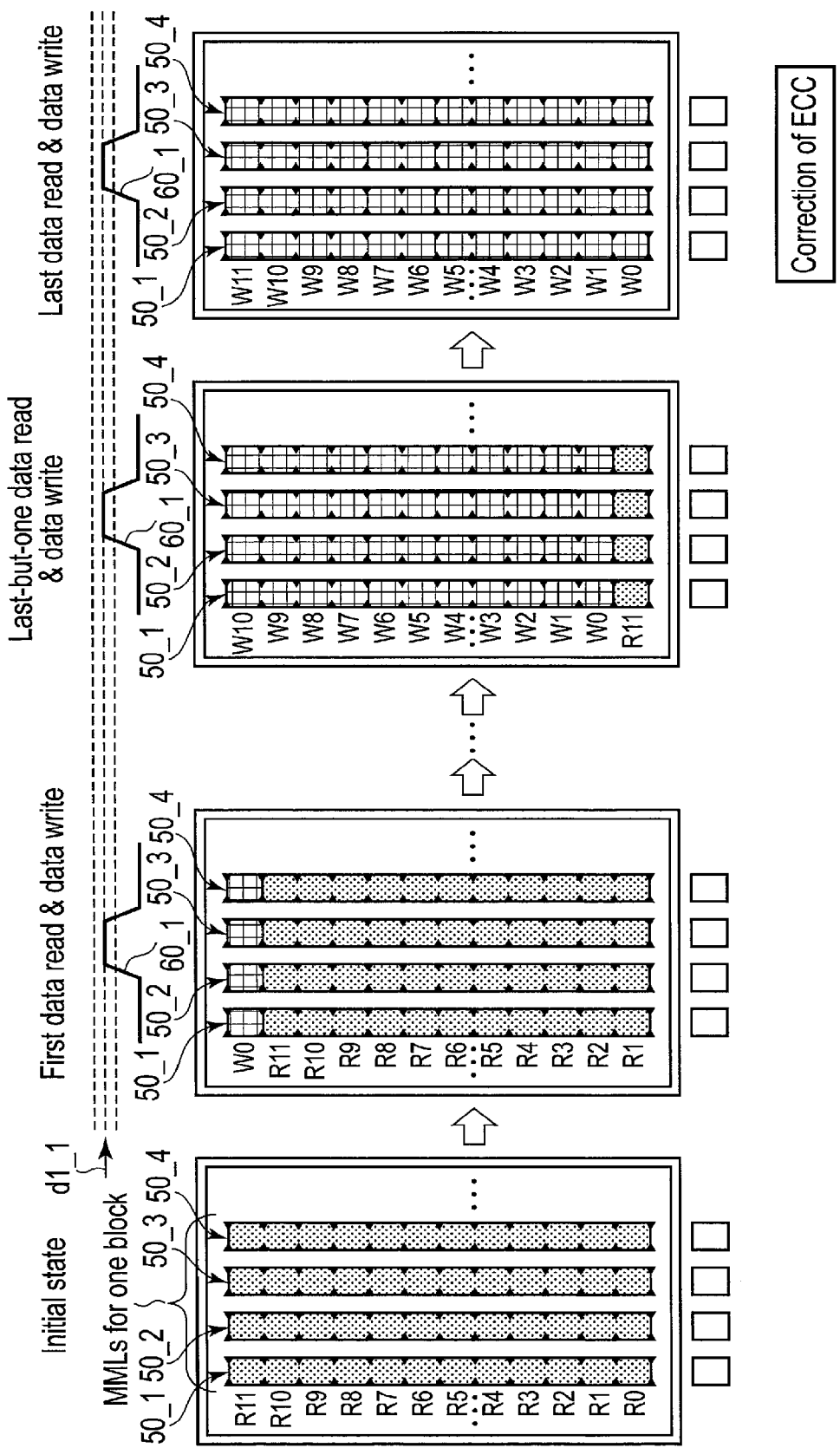
FIG. 53 is a diagram showing an operation of the first-in first-out magnetic domain wall shift memory to be performed during parallel read/write of the memory system according to the embodiment.

FIG. 53 shows an operation of the first-in first-out magnetic domain wall shift memory 3 to be performed when read data is read and write data is written (parallel read/write). In FIG. 53, symbols R0 to R11 are expressed so as to be able to recognize how each information item indicating read data shifts in each of the MMLs 50_1 to 50_4. Symbols W0 to W11 are expressed so as to be able to recognize how each information item indicating read data shifts in each of the MMLs 50_1 to 50_4. Parallel read/write is performed by the first shift pulse 60_1.

The initial state shown in FIG. 53 is the state in which information items R0 to R11 indicating read data are stored in each of the MMLs 50_1 to 50_4. When first parallel read/write is performed for each of the MMLs 50_1 to 50_4 in this state, the initial information item R0 indicating read data is read out of the lowermost layer, and information items R1 to R11 stored in each layer above the lowermost layer are shifted toward the lowermost layer. The initial information item W0 indicating write data is stored in the uppermost layer. After that, the information items R1 to R11 are read and the information items W1 to W11 are written in sequence by parallel read/write. When last-but-one parallel read/write is performed, the information item R11 stored in the uppermost layer in the initial state is shifted to the lowermost layer, the information item W0 stored in the uppermost layer is shifted to the next upper layer of the lowermost layer by the first data write, and the information items W1 to W10 subsequent to the information item W0 are stored continuously in each layer toward the upward direction from the layer storing the information item W0. Then, the information item R11 shifted from the uppermost layer to the lowermost layer is read out by the last parallel read/write, and the read data indicated by the information items R0 to R11 is completely read out. The information items W0 to W11 indicating write data are stored in all layers of each of the MMLs 50_1 to 50_4.

FIG. 54 shows an operation of the first-in first-out magnetic domain wall shift memory 3 to be performed during reading of write data diverted as test data and writing of the write data (parallel read/write). The parallel read/write is performed three times by the first shift pulse 60_1, second shift pulse 60_2 and third shift pulse 60_3.

The initial state shown in FIG. 54 is the state in which information items W0 to W11 indicating write data written in parallel with reading of read data by the parallel read/write are stored in each of the MMLs 50_1 to 50_4. When first parallel read/write is performed for each of the MMLs 50_1 to 50_4 in this state, the initial information item W0 indicating write data is read out of the lowermost layer, and information items W1 to W11 stored in each layer above the lowermost layer are shifted toward the lowermost layer. The initial information item W0 indicating write data is stored in the uppermost layer. After that, the information items W1 to W11 are read and written in sequence by parallel read/write. When last-but-one parallel read/write is performed, the information item W11 stored in the uppermost layer in the initial state is shifted to the lowermost layer, the information item W0 stored in the uppermost layer is shifted to the next upper layer of the lowermost layer by the first data write, and the information items W1 to W10 subsequent to the information item W0 are stored continuously in each layer toward the upward direction from the layer storing the information item W0. Then, the information item W11 shifted from the uppermost layer to the lowermost layer is read out by the last parallel read/write, and the write data indicated by the information items W0 to W11 and diverted as test data is completely read out. Instead of the read write data, the information items W0 to W11 indicating write data are stored in all layers of each of the MMLs 50_1 to 50_4.

Each time the memory system 1 completes reading write data, it compares the write data with an expected value (original write data) and calculates likelihood information of the data read from each of the MML 50_1 to 50_4 based on a result of the comparison. The memory system 1 uses the likelihood information to perform soft decision decoding for read data read by the original parallel read/write.

Figure 55:
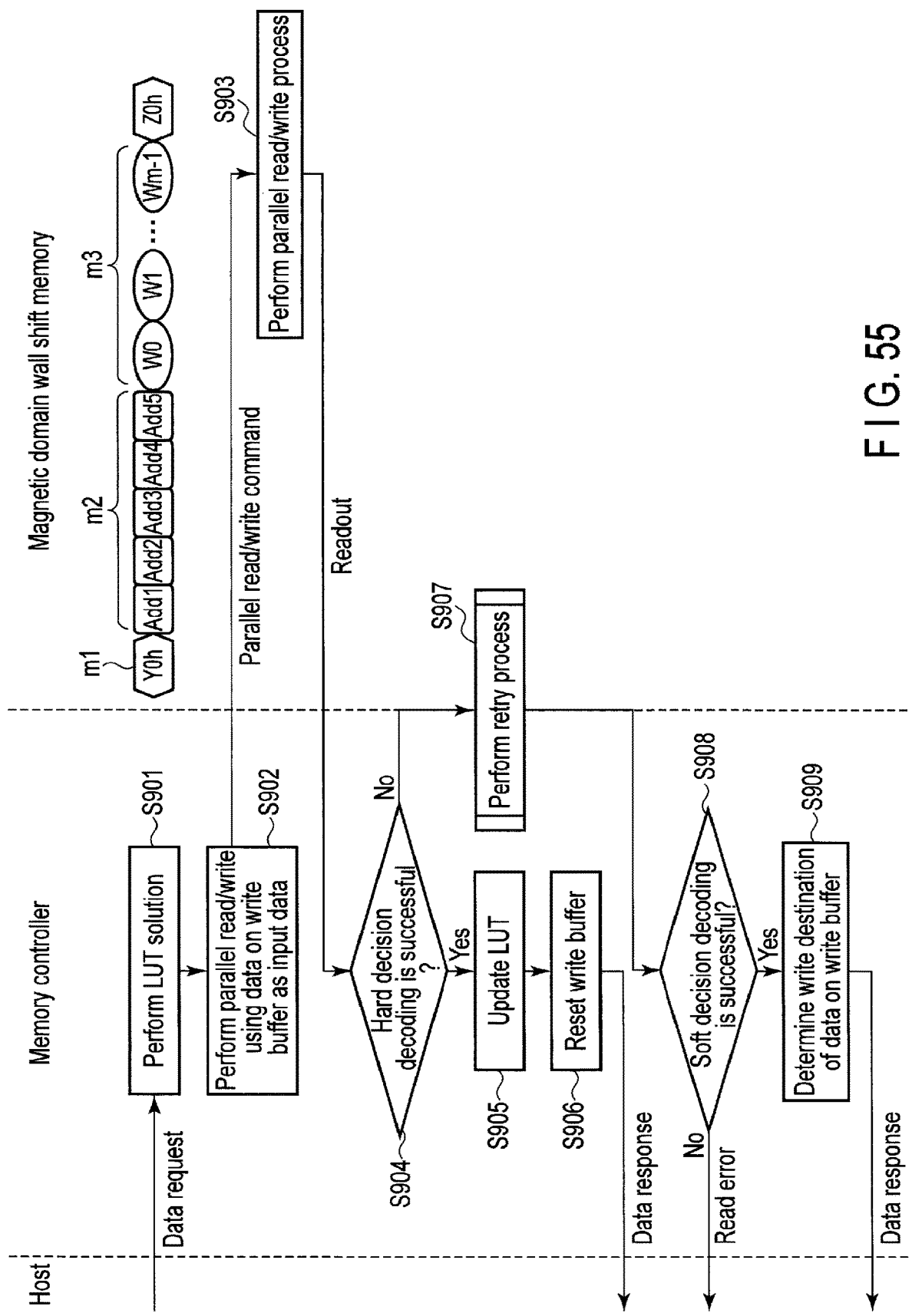
FIG. 55 is a flowchart showing an example of a procedure for a parallel read/write process to be performed by the memory system according to the embodiment.

FIG. 55 is a flowchart showing an example of a procedure for a parallel read/write process to be performed by the memory system 1.

Upon receiving a data request (read request) from, for example, the host 4, the memory controller 2 in the memory system 1 performs an LUT solution to convert a logical address specified by the host 4 into a physical address (S901). The memory controller 2 performs parallel read/write in which the write data stored in the write buffer 25W and requested to be written by, for example, the host 4, is used as input data to be written in place of the read data (S902). FIG. 55 shows an example of a format of a parallel read/write command issued to the magnetic domain wall shift memory 3 by the memory controller 2 (m1 to m4).

"Y0h" indicated by symbol m1 is a command corresponding to a declaration that an address for parallel read/write is input. Then, an address is input in a predetermined number of cycles (the number is 5 here) (m2). Then, write data is input in a data cycle (m3). "Z0h" indicated by symbol m4 is a parallel read/write execution command. When the magnetic domain wall shift memory 3 receives the command "Y0h" and the address in a predetermined number of cycles to determine a target to be read and a target to be written and then receives the write data in a data cycle and then the command "Z0h", it performs a parallel read/write process (S903). The magnetic domain wall shift memory 3 transmits the data read in the parallel read/write process to the memory controller 2.

Upon receiving data from the magnetic domain wall shift memory 3, the memory controller 2 performs hard decision decoding to detect and correct an error that may be included in the data (S904). If the memory controller 2 succeeds in the hard decision decoding (Yes in S904), it updates the LUT 230 in accordance with writing of the write data (S905), relieves an area on the write buffer 25W storing the write data (S906), and transmits the data received from the magnetic domain wall shift memory 3 or the corrected data to the host 4.

If the memory controller fails in the hard decision decoding (No in S904), it performs a retry process to obtain likelihood information necessary for soft decision decoding, the procedure for which is shown in FIG. 55, in cooperation with the magnetic domain wall shift memory 3 (S907). The memory controller 2 uses the likelihood information obtained in the retry process to perform soft decision decoding for the data that has failed in hard decision decoding (S908). When the memory controller 2 succeeds in the soft decision decoding (Yes in S908), it determines a write destination to write the write data on the write buffer 25W, which is written to the magnetic domain wall shift memory 3 in a diverted state as test data, to the magnetic domain wall shift memory 3 again by other parallel read/write (S909), and transmits the data corrected by the soft decision decoding to the host 4. When the memory controller 2 fails in the soft decision decoding (No in S908), it notifies the host 4 of a read error.

Figure 56:
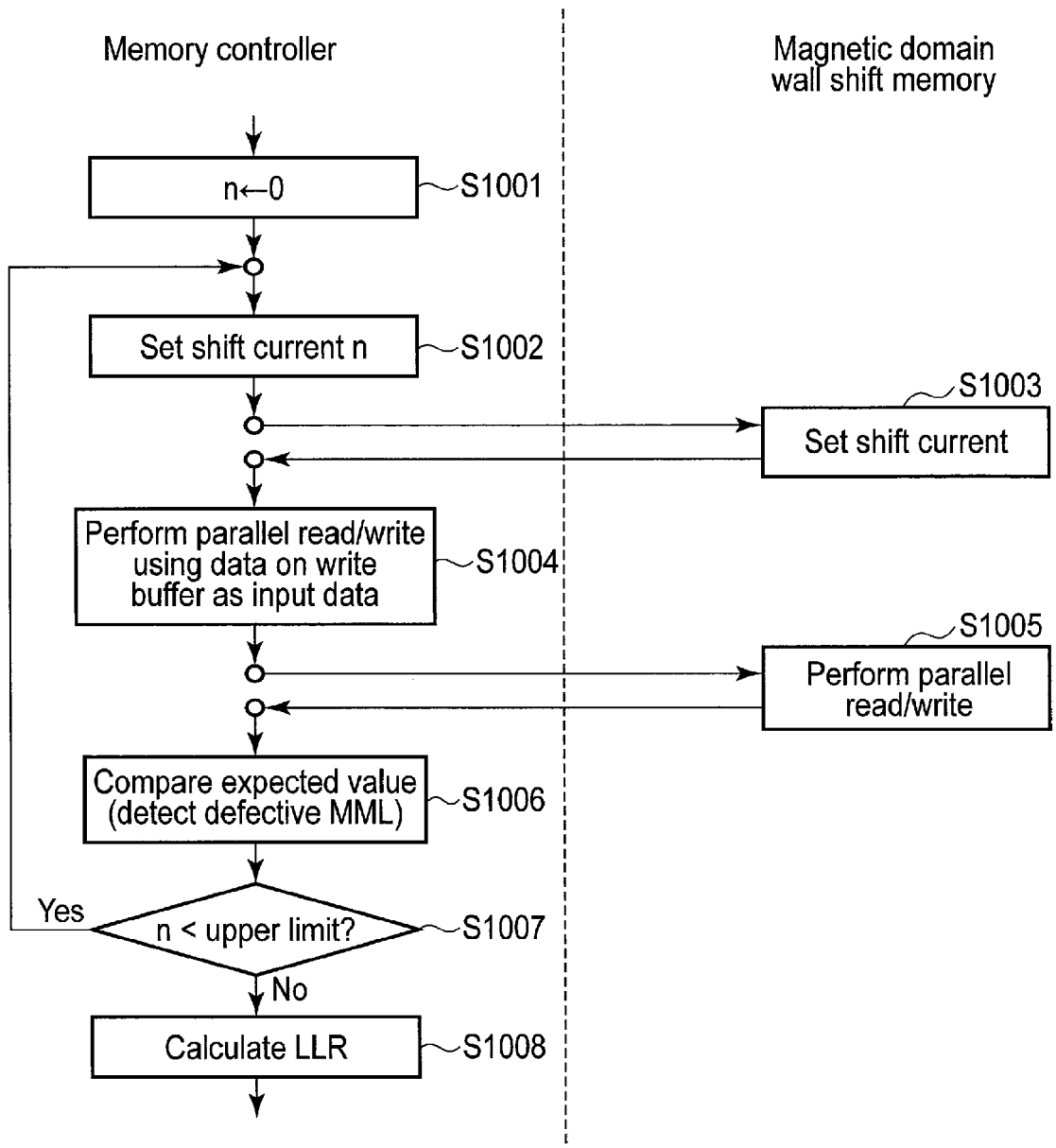
FIG. 56 is a flowchart showing an example of a procedure for a retry process to be performed by the memory system according to the embodiment.

FIG. 56 is a flowchart showing an example of a procedure for a retry process (S907 in FIG. 55) to be performed by the memory system 1.

Assume here that test data is written/read a predetermined number of times by varying the current value of a shift pulse. Also, assume that a predetermined number of current values are predetermined to set different current values (shift current 0, shift current 1, . . . ). When the memory controller 2 starts to write/read test data to be diverted as test data, it initializes the value of a counter for selecting the current values one by one from among the predetermined number of current values to "0" indicating a first current value (S1001).

The memory controller 2 sets the first current value (shift current 0) indicated by the counter as a current value of the shift pulse (S1002). Specifically, the memory controller 2 transmits a command to the magnetic domain wall shift memory 3 to make a request to set the current value of the shift pulse to shift current 0. When the memory controller 2 sets a shift pulse, it reads and writes write data as input data stored on the write buffer 25W and written to the magnetic domain wall shift memory 3 by the original parallel read/write (S1004). Specifically, the memory controller 2 transmits a command to the magnetic domain wall shift memory 3 to request the memory 3 to perform parallel read/write. Upon receiving the command, the magnetic domain wall shift memory 3 performs parallel read/write to read and write the write data (S1005) and transmits the read write data to the memory controller 2.

The memory controller 2 compares the write data received from the magnetic domain wall shift memory 3 with an expected value that is the write data stored in the write buffer 25W to detect a defective MML that has caused an error (S1006). The memory controller 2 determines whether or not the value of the counter is smaller than the upper limit (S1007). If the value is smaller than the upper limit (Yes in S1007), the memory controller 2 increments the value by one, and repeats the process from S1002. That is, the memory controller 2 changes the shift pulse to the next current value to write/read the write data. If the value of the counter is not smaller than the upper limit (No in S1007), the memory controller 2 calculates likelihood information (LLR) of data read from each MML based on the detection result of the defective MML obtained in S1007 (S1008).

As described above, in the first-in first-out magnetic domain wall shift memory 3, when it fails in hard decision decoding for read data read by the parallel read/write and performs soft decision decoding, it can divert write data written by the parallel read/write as test data and calculate likelihood information of data read from each MML.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a shift register memory including a plurality of blocks each including a plurality of data storing shift strings, and configured to write and read data to and from each of the blocks using a last-in first-out method by shifting data stored in each of a plurality of layers included in each of the data storing shift strings in a first direction from an uppermost layer to a lowermost layer or in a second direction opposite to the first direction; and
a controller configured to control the shift register memory, wherein:
the shift register memory is configured to set a current value or voltage application time of a shift pulse to be applied to a plurality of data storing shift strings in a first block in order to store data in an uppermost layer of each of the data storing shift strings in the first block or to shift data stored in a plurality of layers included in each of the data storing shift strings in the first block in the first direction or the second direction, based on a first parameter of a first command when receiving the first command from the controller; and
the controller is configured to:
change a shift pulse, which is to be applied to the data storing shift strings in the first block from which first data is read by applying a first shift pulse, to a second shift pulse, which differs from the first shift pulse in current value or voltage application time, by the first parameter to write second data to each of the data storing shift strings in the first block and to read the second data from each of the data storing shift strings in the first block;
create likelihood information of data read from each of the data storing shift strings in the first block in accordance with a read result of the second data which is written to each of the data storing shift strings in the first block and which is read from each of the data storing shift strings in the first block; and
perform soft decision decoding for the first data using the likelihood information.

2. The memory system of claim 1, wherein the controller is configured to:
write and read the second data two or more times using, as the second shift pulse, a shift pulse whose current value is lower than or whose voltage application time is shorter than that of the first shift pulse and using, as the second shift pulse, a shift pulse whose current value is higher than or whose voltage application time is longer than that of the first shift pulse; and
create likelihood information of data read from each of the data storing shift strings in the first block in accordance with two or more read results of the second data obtained in each of the data storing shift strings in the first block by writing and reading the second data two or more times.

3. The memory system of claim 2, wherein the controller is further configured to apply the first shift pulse to write the second data to each of the data storing shift strings in the first block and read the second data from each of the data storing shift strings in the first block, and create likelihood information of data read from each of the data storing shift strings in the first block in accordance with three or more read results of the second data including the two or more read results of the second data.

4. The memory system of claim 1, wherein the controller is configured to:
write the second data by two or more different shift pulses, including writing first part of the second data using, as the second shift pulse, a shift pulse whose current value is lower than or whose voltage application time is shorter than that of the first shift pulse and writing second part of the second data using, as the second shift pulse, a shift pulse whose current value is higher than or w % hose voltage application time is longer than that of the first shift pulse;
read the second data by two or more different shift pulses, including reading second part of the second data using, as the second shift pulse, a shift pulse whose current value is higher than or whose voltage application time is longer than that of the first shift pulse and reading first part of the second data using, as the second shift pulse, a shift pulse whose current value is lower than or whose voltage application time is shorter than that of the first shift pulse; and
create likelihood information of data read from each of the data storing shift strings in the first block in accordance with a plurality of read results of the second data including the first part and the second part of the second data, which are obtained by writing and reading the second data.

5. The memory system of claim 1, wherein the controller is configured to:
write the second data by two or more different shift pulses, including writing first part of the second data using, as the second shift pulse, a shift pulse whose current value is higher than or whose voltage application time is longer than that of the first shift pulse and writing second part of the second data using, as the second shift pulse, a shift pulse whose current value is lower than or whose voltage application time is shorter than that of the first shift pulse;
read the second data by two or more different shift pulses, including reading second part of the second data using, as the second shift pulse, a shift pulse whose current value is lower than or whose voltage application time is shorter than that of the first shift pulse and reading first part of the second data using, as the second shift pulse, a shift pulse whose current value is higher than or whose voltage application time is longer than that of the first shift pulse; and create likelihood information of data read from each of the data storing shift strings in the first block in accordance with a plurality of read results of the second data including the first part and the second part of the second data, which are obtained by writing and reading the second data.

6. The memory system of claim 1, wherein the controller is configured to create likelihood information of data read from each of the data storing shift strings in the first block, using hierarchical position information of each of the layers included in each of the data storing shift strings in the first block.

7. The memory system of claim 1, wherein the controller is configured to write the second data whose data length is shorter than data length of data that is allowed to be written to each of the data storing shift strings in the first block, to each of the data storing shift strings in the first block, and read the second data from each of the data storing shift strings in the first block.

8. A memory system comprising:

a shift register memory including a plurality of blocks each including a plurality of data storing shift strings, and configured to write and read data to and from each of the blocks using a first-in first-out method by shifting data stored in each of a plurality of layers included in each of the data storing shift strings in a first direction from an uppermost layer to a lowermost layer; and a controller configured to control the shift register memory, wherein:

the shift register memory is configured to set a current value or voltage application time of a shift pulse to be applied to a plurality of data storing shift strings in a first block in order to store data in an uppermost layer of each of the data storing shift strings in the first block or to shift data stored in a plurality of layers included in each of the data storing shift strings in the first block in the first direction, based on a first parameter of a first command when receiving the first command from the controller; and the controller is configured to:

change a shift pulse, which is to be applied to the data storing shift strings in the first block from which first data is read by applying a first shift pulse, to a second shift pulse, which differs from the first shift pulse in current value or voltage application time, by the first parameter to write second data to each of the data storing shift strings in the first block and to read the second data from each of the data storing shift strings in the first block;

create likelihood information of data read from each of the data storing shift strings in the first block in accordance with a read result of the second data which is written to each of the data storing shift strings in the first block and which is read from each of the data storing shift strings in the first block; and perform soft decision decoding for the first data using the likelihood information.

9. The memory system of claim 8, wherein the controller is configured to:

write the second data by two or more different shift pulses, including writing first part of the second data using, as the second shift pulse, a shift pulse whose current value is lower than or whose voltage application time is shorter than that of the first shift pulse and writing second part of the second data using, as the second shift pulse, a shift pulse whose current value is higher than or whose voltage application time is longer than that of the first shift pulse;

read the second data by two or more different shift pulses, including reading first part of the second data using, as the second shift pulse, a shift pulse whose current value is lower than or whose voltage application time is shorter than that of the first shift pulse and reading second part of the second data using, as the second shift pulse, a shift pulse whose current value is higher than or whose voltage application time is longer than that of the first shift pulse; and create likelihood information of data read from each of the data storing shift strings in the first block in accordance with a plurality of read results of the second data including the first part and the second part of the second data, which are obtained by writing and reading the second data.

10. The memory system of claim 8, wherein the controller is configured to:

write the second data by two or more different shift pulses, including writing first part of the second data using, as the second shift pulse, a shift pulse whose current value is higher than or whose voltage application time is longer than that of the first shift pulse and writing second part of the second data using, as the second shift pulse, a shift pulse whose current value is lower than or whose voltage application time is shorter than that of the first shift pulse;

read the second data by two or more different shift pulses, including reading first part of the second data using, as the second shift pulse, a shift pulse whose current value is higher than or whose voltage application time is longer than that of the first shift pulse and reading second part of the second data using, as the second shift pulse, a shift pulse whose current value is lower than or whose voltage application time is shorter than that of the first shift pulse; and create likelihood information of data read from each of the data storing shift strings in the first block in accordance with a plurality of read results of the second data including the first part and the second part of the second data, which are obtained by writing and reading the second data.

11. The memory system of claim 8, wherein the controller is configured to:

read the first data from a lowermost layer of each of the data storing shift strings in the first block and write third data requested to be written to the shift register memory from the lowermost layer of each of the data storing shift strings in the first block in parallel to each other; and write the second data from an uppermost layer of each of the data storing shift strings in the first block using the third data as the second data and read the second data from the lowermost layer of each of the data storing shift strings in the first block.

12. A method of controlling a shift register memory including a plurality of blocks each including a plurality of data storing shift strings, the shift register memory being configured to write and read data to and from each of the blocks using a first-in first-out method by shifting data stored in each of a plurality of layers included in each of the data storing shift strings in a first direction from an uppermost layer to a lowermost layer, the shift register memory being configured to set a current value or voltage application time of a shift pulse to be applied to a plurality of data storing shift strings in a first block in order to store data in an uppermost layer of each of the data storing shift strings in the first block or to shift data stored in a plurality of layers included in each of the data storing shift strings in the first block in the first direction or the second direction, based on a first parameter of a first command when receiving the first command, the method comprising:

changing a shift pulse, which is to be applied to the data storing shift strings in the first block from which first data is read by applying a first shift pulse, to a second shift pulse, which differs from the first shift pulse in current value or voltage application time, by the first parameter to write second data to each of the data storing shift strings in the first block and to read the second data from each of the data storing shift strings in the first block;

creating likelihood information of data read from each of the data storing shift strings in the first block in accordance with a read result of the second data which is written to each of the data storing shift strings in the first block and which is read from each of the data storing shift strings in the first block; and performing soft decision decoding for the first data using the likelihood information.

13. The method of claim 12, further comprising:

writing the second data by two or more different shift pulses, including writing first part of the second data using, as the second shift pulse, a shift pulse whose current value is lower than or whose voltage application time is shorter than that of the first shift pulse and writing second part of the second data using, as the second shift pulse, a shift pulse whose current value is higher than or whose voltage application time is longer than that of the first shift pulse;

reading the second data by two or more different shift pulses, including reading first part of the second data using, as the second shift pulse, a shift pulse whose current value is lower than or whose voltage application time is shorter than that of the first shift pulse and reading second part of the second data using, as the second shift pulse, a shift pulse whose current value is higher than or whose voltage application time is longer than that of the first shift pulse; and creating likelihood information of data read from each of the data storing shift strings in the first block in accordance with a plurality of read results of the second data including the first part and the second part of the second data, which are obtained by writing and reading the second data.

14. The method of claim 12, further comprising:

writing the second data by two or more different shift pulses, including writing first part of the second data using, as the second shift pulse, a shift pulse whose current value is higher than or whose voltage application time is longer than that of the first shift pulse and writing second part of the second data using, as the second shift pulse, a shift pulse whose current value is lower than or whose voltage application time is shorter than that of the first shift pulse;

reading the second data by two or more different shift pulses, including reading first part of the second data using, as the second shift pulse, a shift pulse whose current value is higher than or whose voltage application time is longer than that of the first shift pulse and reading second part of the second data using, as the second shift pulse, a shift pulse whose current value is lower than or whose voltage application time is shorter than that of the first shift pulse; and creating likelihood information of data read from each of the data storing shift strings in the first block in accordance with a plurality of read results of the second data including the first part and the second part of the second data, which are obtained by writing and reading the second data.

15. The method of claim 12, further comprising:

reading the first data from a lowermost layer of each of the data storing shift strings in the first block and write third data requested to be written to the shift register memory from the lowermost layer of each of the data storing shift strings in the first block in parallel to each other; and writing the second data from an uppermost layer of each of the data storing shift strings in the first block using the third data as the second data and read the second data from the lowermost layer of each of the data storing shift strings in the first block.

* * * * *